__US012026972B2__

(12) United States Patent
Noudo et al.

(10) Patent No.: US 12,026,972 B2
(45) Date of Patent: Jul. 2, 2024

(54) ELECTRONIC DEVICE

(71) Applicant: SONY SEMICONDUCTOR SOLUTIONS CORPORATION, Kanagawa (JP)

(72) Inventors: Shinichiro Noudo, Kumamoto (JP); Tomohiko Baba, Kanagawa (JP); Masashi Nakata, Kanagawa (JP); Atsushi Toda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/995,695

(22) PCT Filed: Mar. 29, 2021

(86) PCT No.: PCT/JP2021/013343
§ 371 (c)(1),
(2) Date: Oct. 6, 2022

(87) PCT Pub. No.: WO2021/215201
PCT Pub. Date: Oct. 28, 2021

(65) Prior Publication Data
US 2023/0134765 A1     May 4, 2023

(30) Foreign Application Priority Data
Apr. 22, 2020 (JP) ................. 2020-076201

(51) Int. Cl.
*G06V 40/12* (2022.01)
*G06V 10/147* (2022.01)
(Continued)

(52) U.S. Cl.
CPC ........ *G06V 40/1388* (2022.01); *G06V 10/147* (2022.01); *G06V 10/58* (2022.01);
(Continued)

(58) Field of Classification Search
CPC ........... G06V 40/1388; G06V 40/1341; G06V 10/147; G06V 40/1324; G06V 10/17; H01L 27/14623; H01L 27/14627
See application file for complete search history.

(56) References Cited

U.S. PATENT DOCUMENTS

2015/0319420 A1* 11/2015 Fettig ................ H01L 27/14621
   348/49
2019/0303639 A1* 10/2019 He ........................ G09G 3/3208
2021/0280623 A1*  9/2021 Boettiger .......... H01L 27/14627

FOREIGN PATENT DOCUMENTS

JP      2015015295 A  *  1/2015  ....... H01L 27/14603
JP      2017-084892 A     5/2017
(Continued)

OTHER PUBLICATIONS

English translation of JP 2015015295A (Year: 2015).*
(Continued)

*Primary Examiner* — Lixi C Simpson
(74) *Attorney, Agent, or Firm* — CHIP LAW GROUP

(57) ABSTRACT

Provided is an electronic device that includes a plurality of pixels, each of at least two pixels of the plurality of pixels includes a first lens that collects incident light, a first light shielding film portion having a first hole through which a part of the incident light that has been collected passes, and a photoelectric conversion unit that converts the incident light having passed through the first hole. A shape of the first hole with respect to the first light shielding film portion is different between a first pixel among the at least two pixels and a second pixel different from the first pixel among the at least two pixels.

28 Claims, 56 Drawing Sheets

(51) Int. Cl.
*G06V 10/58* (2022.01)
*G06V 40/13* (2022.01)
*H01L 27/146* (2006.01)
*G06V 10/10* (2022.01)

(52) U.S. Cl.
CPC ...... *G06V 40/1324* (2022.01); *G06V 40/1341* (2022.01); *H01L 27/14623* (2013.01); *H01L 27/14627* (2013.01); *G06V 10/17* (2022.01)

(56) References Cited

FOREIGN PATENT DOCUMENTS

| | | | | |
|---|---|---|---|---|
| JP | 2018-033505 A | 3/2018 | | |
| JP | 2018-506806 A | 3/2018 | | |
| JP | 2018-063378 A | 4/2018 | | |
| JP | 2019-114728 A | 7/2019 | | |
| JP | 2019-184719 A | 10/2019 | | |
| JP | 2019-192802 A | 10/2019 | | |
| JP | 2019-213851 A | 12/2019 | | |
| JP | 2020-013842 A | 1/2020 | | |
| WO | 2016/114154 A1 | 7/2016 | | |
| WO | WO-2016114154 A1 * | 7/2016 | ....... | H01L 27/14621 |
| WO | 2018/012492 A1 | 1/2018 | | |
| WO | WO-2018110569 A1 * | 6/2018 | ............... | G02B 5/20 |
| WO | 2019/065291 A1 | 4/2019 | | |
| WO | 2019/124113 A1 | 6/2019 | | |

OTHER PUBLICATIONS

English translation of WO 2016114154A1 (Year: 2016).*
English translation of KR 10081524B1 (Year: 2008).*
English translation of WO 2018110569A1 (Year: 2018).*
International Search Report and Written Opinion of PCT Application No. PCT/JP2021/013343, dated May 25, 2021, 11 pages of ISRWO.

* cited by examiner

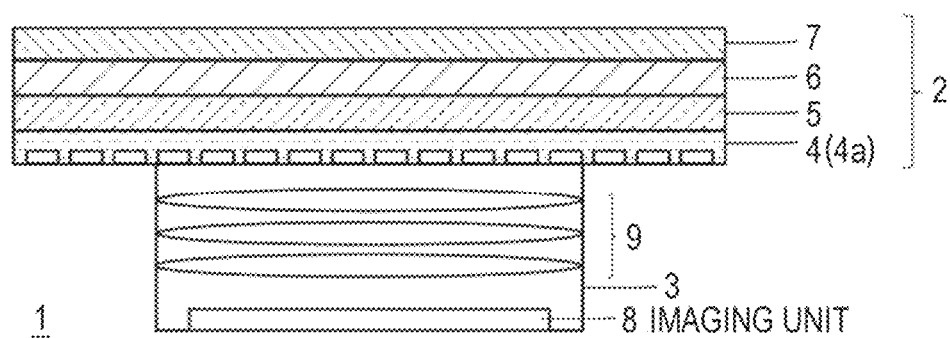
FIG. 1A    PROVIDED WITH OPTICAL LENS
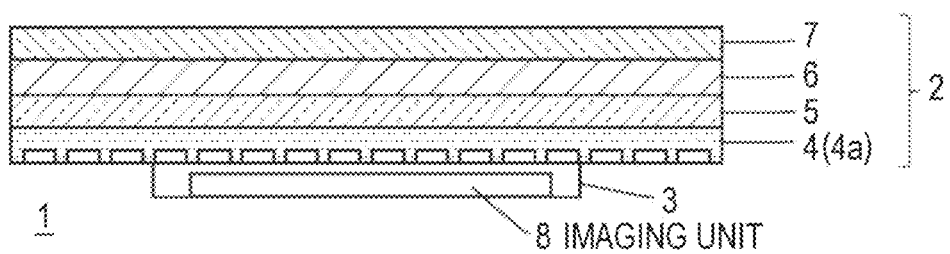
FIG. 1B    WITHOUT OPTICAL LENS FIG. 4A
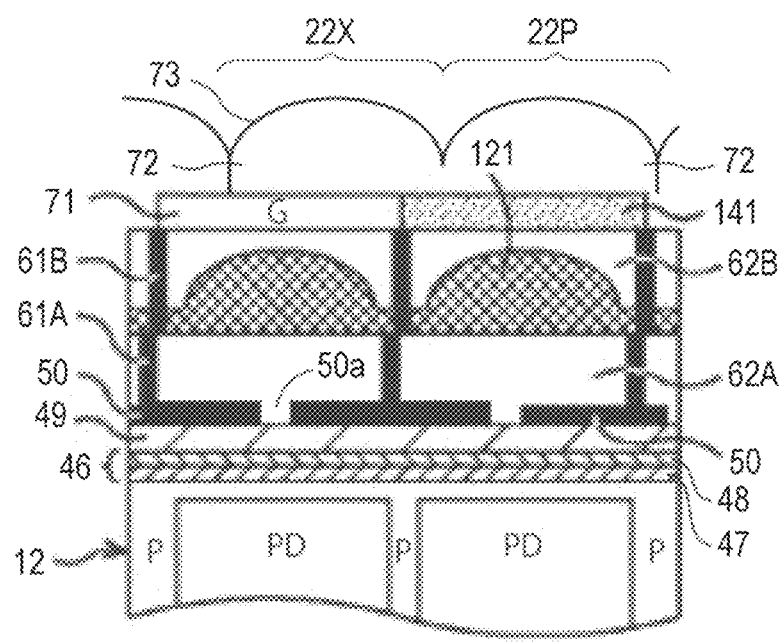
FIG. 4B
(a) SLIT-SHAPED OPENING
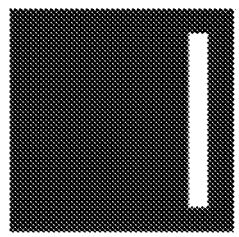
SCHEMATIC DIAGRAM OF 5um☐ PIXEL
AND 0.5×4um OPENING
(b) OPENING WITH LARGER AREA RATIO
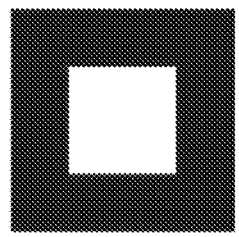
SCHEMATIC DIAGRAM OF 5um☐ PIXEL
AND 25% OPENING

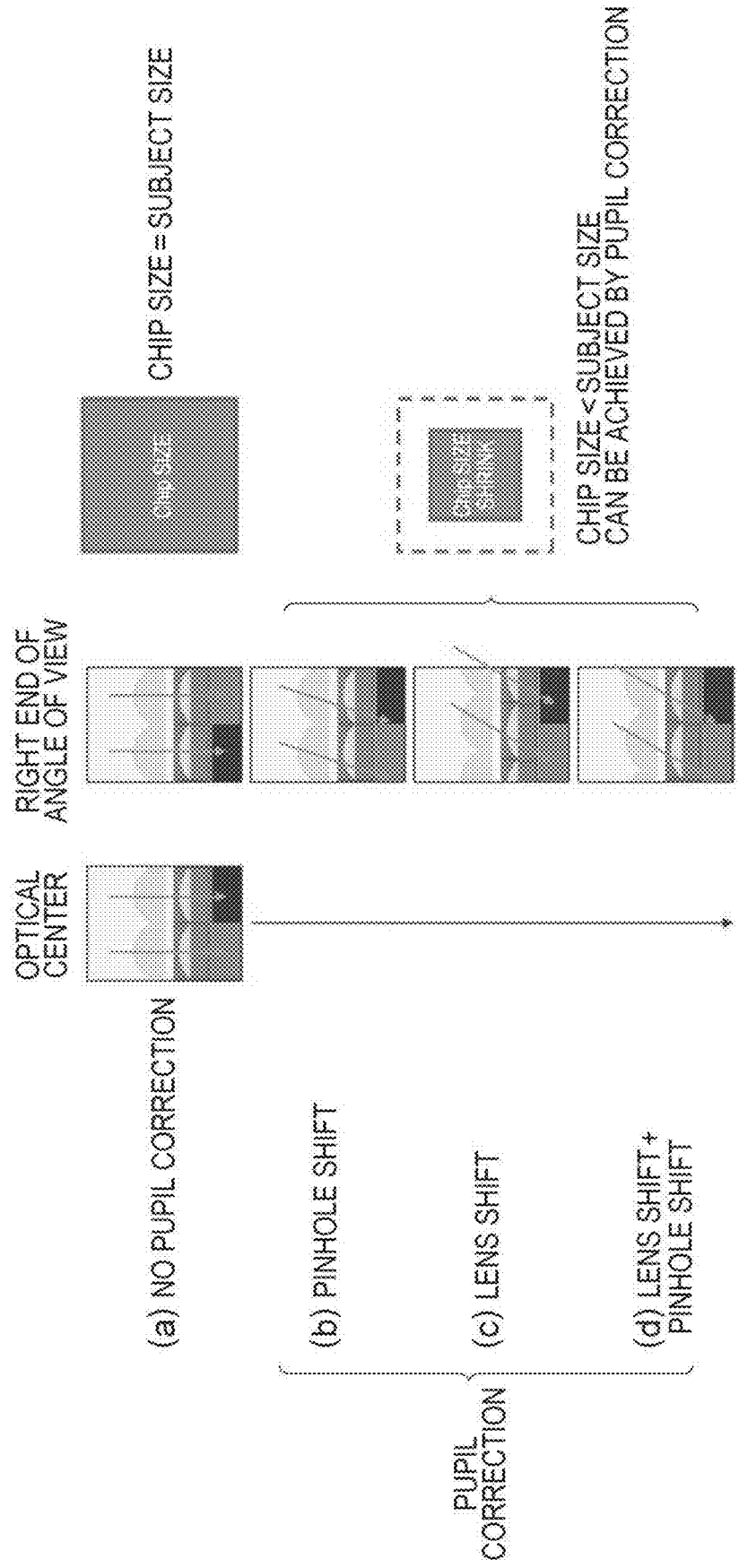

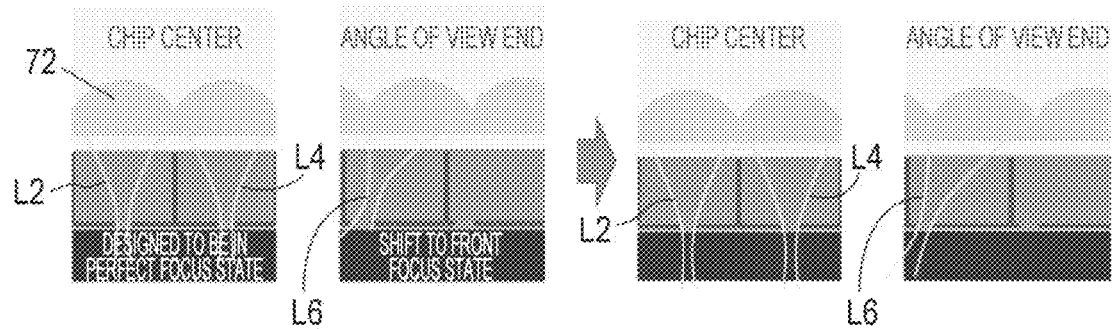
FIG. 15A　　FIG. 15B　　FIG. 15C　　FIG. 15D
FIG. 16A
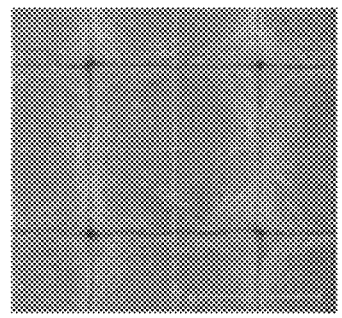
(a) LENS FORMED BY ETCH BACK PROCESS
(SEM PHOTOGRAPH OF UPPER SURFACE)
FIG. 16B
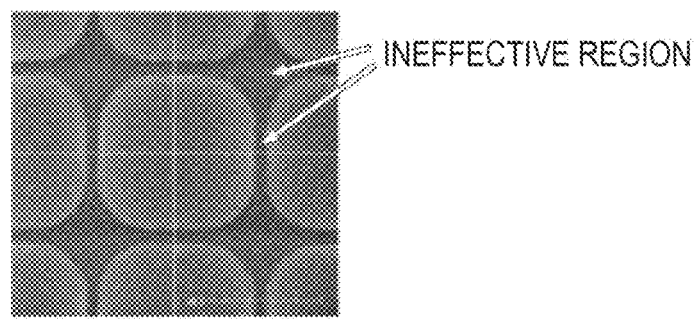
(b) REFLOW LENS
(SEM PHOTOGRAPH OF UPPER SURFACE)

(a) LENS FORMED BY ETCHING PROCESS     (b) REFLOW LENS

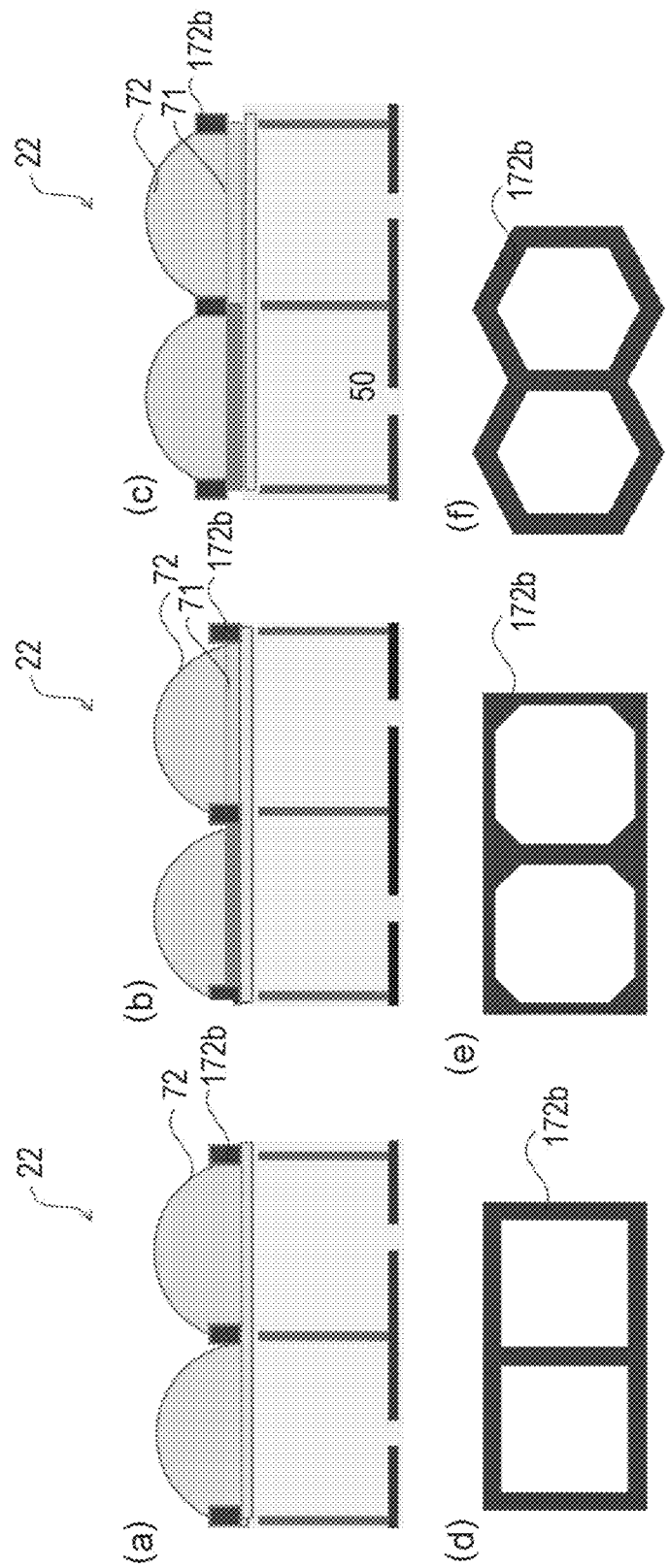

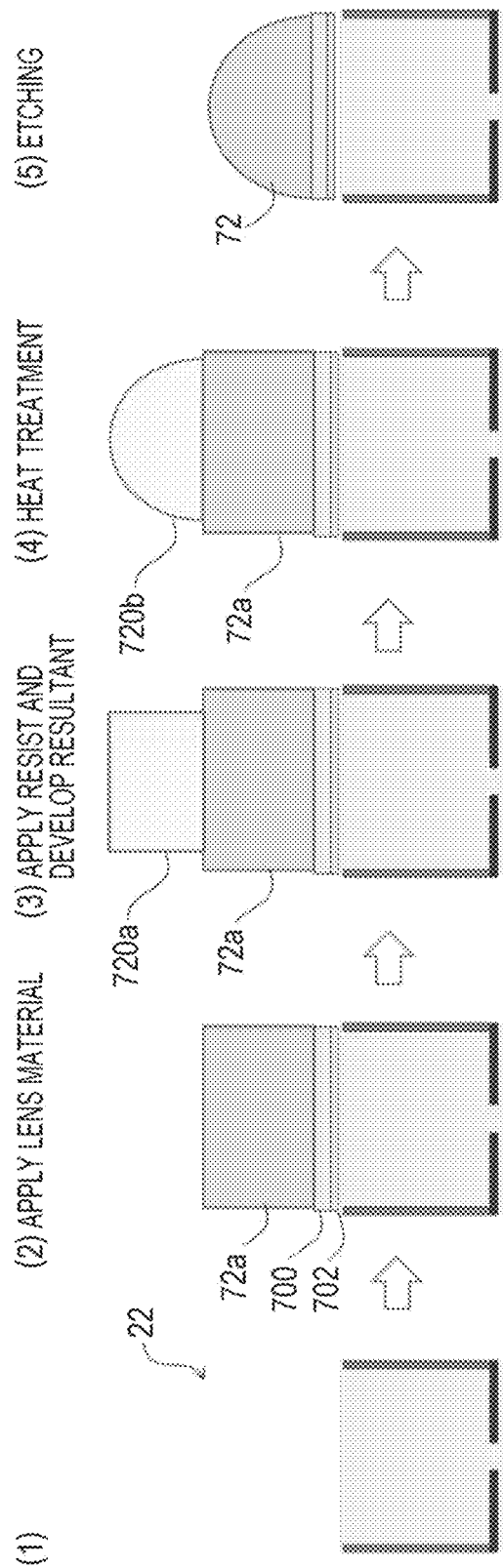

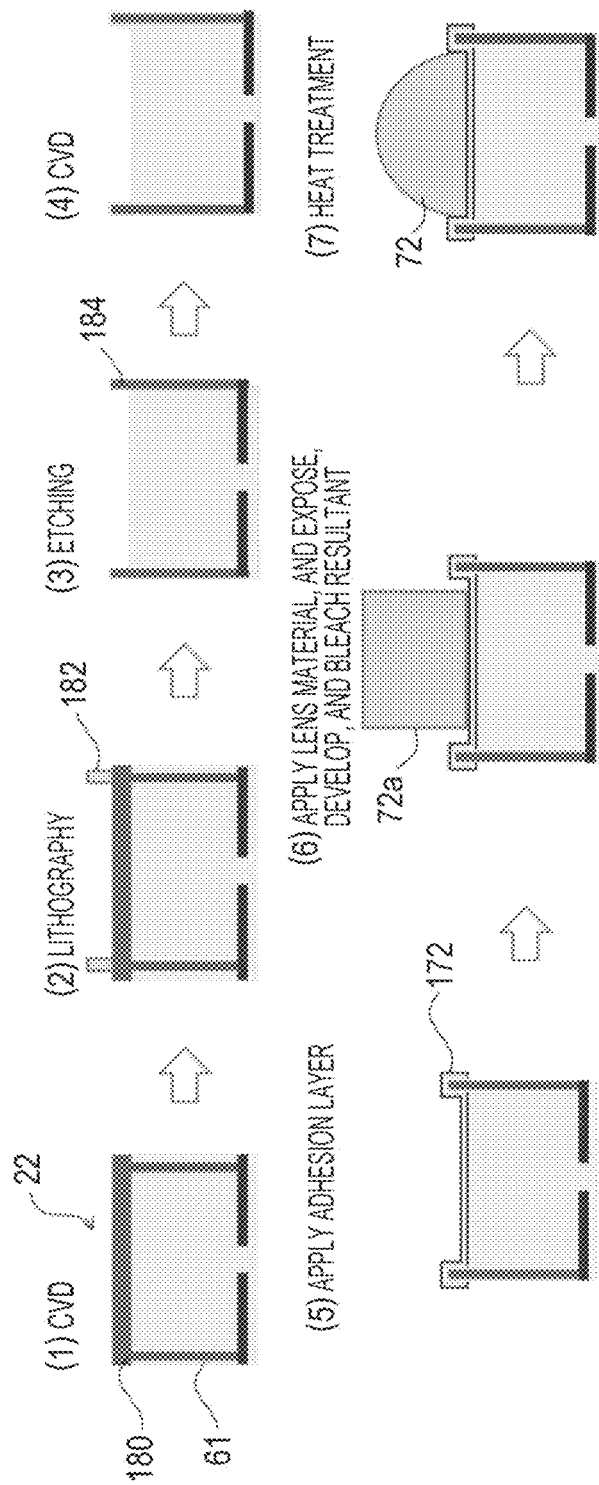

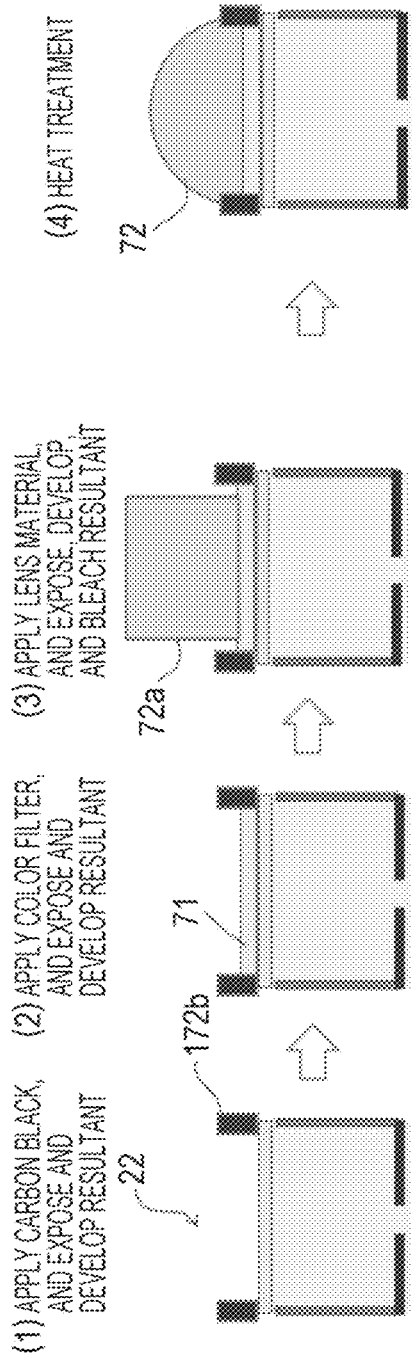

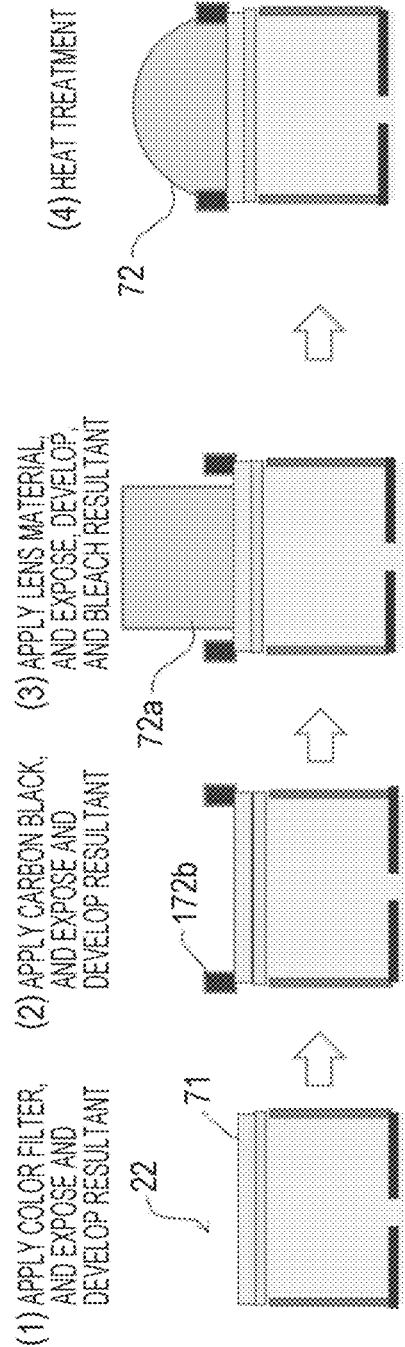

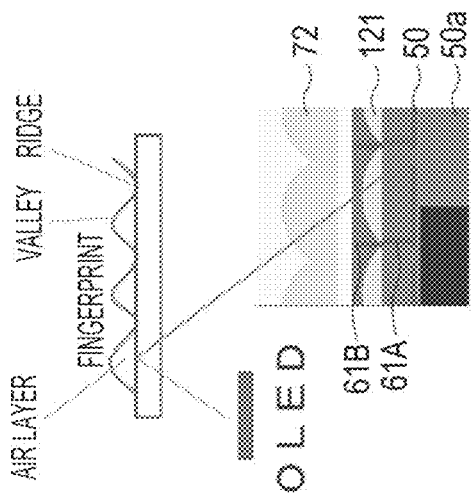
FIG. 56A
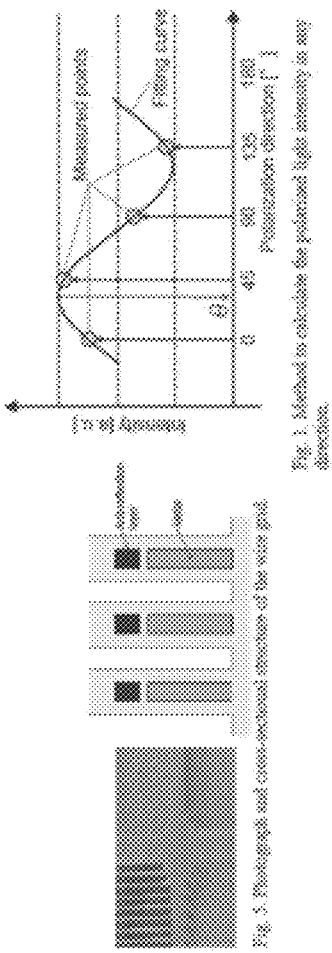
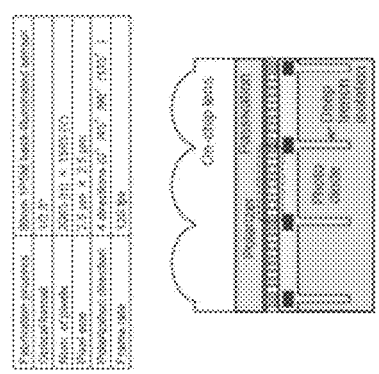
FIG. 56B

FIG. 60
FIG. 60A
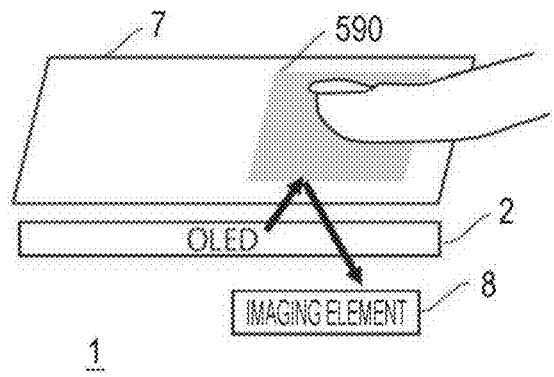
FIG. 60B
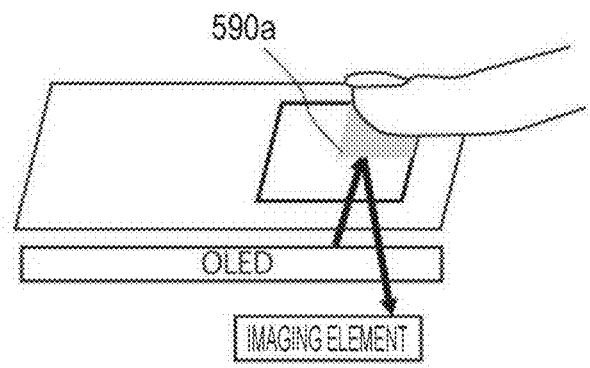
FIG. 60C
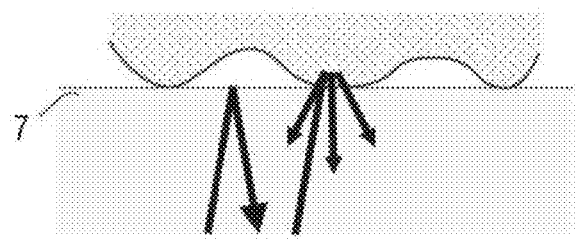

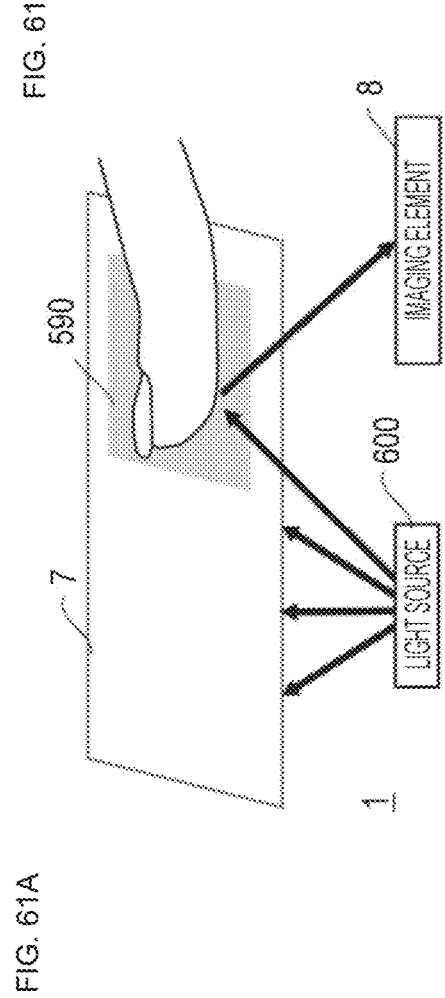
FIG. 61A
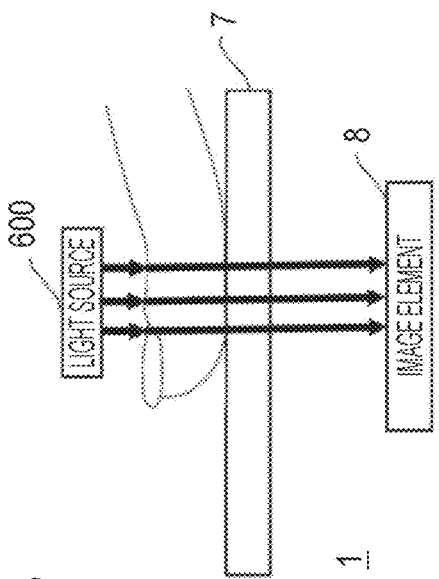
FIG. 61B
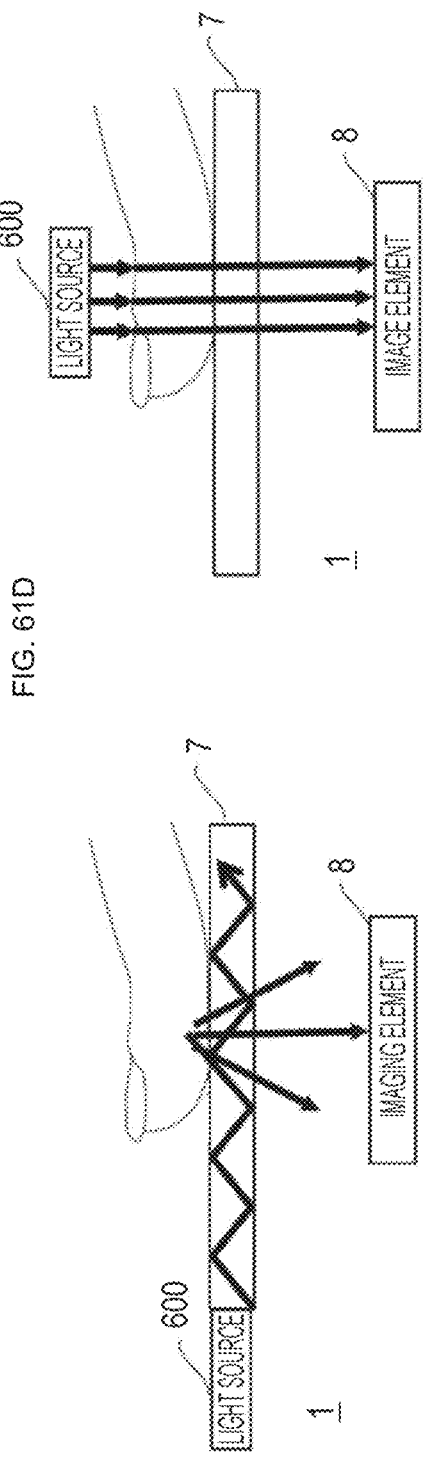
FIG. 61C
FIG. 61D

ELECTRONIC DEVICE

CROSS REFERENCE TO RELATED APPLICATIONS

This application is a U.S. National Phase of International Patent Application No. PCT/JP2021/013343 filed on Mar. 29, 2021, which claims priority benefit of Japanese Patent Application No. JP 2020-076201 filed in the Japan Patent Office on Apr. 22, 2020. Each of the above-referenced applications is hereby incorporated herein by reference in its entirety.

TECHNICAL FIELD

The present disclosure relates to an electronic device.

BACKGROUND ART

Electronic devices such as smartphones, mobile phones, or personal computers (PCs) are increasingly mounted with fingerprint sensors. Smartphones and mobile phones are often carried in pockets or bags, so that they need to be thin. In addition, development of a sensor that captures an image of a fingerprint through an optical system is also in progress. On the other hand, if the distance from the finger to be imaged to an imaging unit is decreased, the resolution of the image captured through the optical system may be reduced.

CITATION LIST

Patent Document

Patent Document 1: WO 2016/114154
Patent Document 2: Japanese Patent Application Laid-Open No. 2018-033505

SUMMARY OF THE INVENTION

Problems to be Solved by the Invention

One aspect of the present disclosure provides an electronic device capable of suppressing a decrease in resolution even if a distance between an object to be imaged and an imaging unit is further decreased.

Solutions to Problems

In order to address the above problem, the present disclosure provides an electronic device including a plurality of pixels,
  in which each of at least two pixels of the plurality of pixels includes:
  a first lens that collects incident light;
  a first light shielding film portion having a first hole through which a part of the incident light that has been collected passes; and
  a photoelectric conversion unit configured to photoelectrically convert the incident light having passed through the first hole, and
  a shape of the first hole with respect to the first light shielding film portion is different between a first pixel among the at least two pixels and a second pixel different from the first pixel among the at least two pixels.

The first pixel may further include a second lens that collects the incident light having been collected by the first lens into the first hole.

The first lens may be a reflow lens.

A reflow stopper may be provided at a boundary between the two first lenses corresponding to two adjacent pixels.

The reflow stopper may include a light shielding material.

The electronic device may further include a first optical system that collects incident light on the plurality of pixels,
  in which the first lens may collect the incident light having been collected through the first optical system, and
  the first lens may be disposed at a position corresponding to a direction of the incident light incident from a predetermined position through the first optical system.

At least one element in a second optical system including the first lens that collects the incident light into the first hole may be a diffraction lens.

The shapes of the first holes included in the first pixel and the second pixel may be different corresponding to a shape of a light distribution of a second optical system including the first lens that collects the incident light into the first hole from a predetermined position.

The first pixel and the second pixel may be different from each other in a position of the first hole with respect to the first light shielding film portion.

The first pixel and the second pixel may be different in an opening area of the first hole.

The first hole may include a plasmon filter that has a plurality of holes smaller than the opening.

The electronic device may further include a light shielding wall in a plurality of stages arranged between two adjacent pixels among the plurality of pixels.

An uppermost portion of the light shielding wall may be provided as the reflow stopper of the reflow lens.

In the first pixel and the second pixel, the light shielding wall in a plurality of stages may be arranged at different positions with respect to the photoelectric conversion unit according to a direction of the incident light collected from a predetermined position through a second optical system including the first lens.

The first pixel may further include
  a second light shielding film portion including, on a light entrance side with respect to the first light shielding film portion, a second hole through which a part of the incident light having been collected passes, the second hole being larger than the first hole. The second light shielding portion may be continuously provided with the same material as a metal film of the light shielding wall.

The first pixel may further include
  an antireflection portion having an uneven structure on a surface of the first light shielding film portion on a side of the photoelectric conversion element.

The first pixel may further include
  a photoelectric conversion element separation portion that does not propagate information regarding an intensity of acquired light to the photoelectric conversion unit adjacent to the first pixel.

The first pixel may further include
  a reflection film portion on a bottom part on a side opposite to a light entrance side of the photoelectric conversion element.

At least two of the plurality of pixels may be phase detection pixels which are paired.

The electronic device may further include an image processing unit that performs processing for restoring resolution of an image by image processing using a point spread function corresponding to the first hole.

At least one of the plurality of pixels may be a polarization pixel having a polarizing element, and
the electronic device may correct an image signal photoelectrically converted by at least one of the plurality of pixels on the basis of polarization information obtained by polarization by a plurality of the polarizing elements and photoelectric conversion by the photoelectric conversion unit.

Each of the plurality of pixels may further include a charge holding unit that is shielded from light, and
the electronic device may enable transfer of a charge from the photoelectric conversion element to the charge holding unit, and set exposure timings of the plurality of pixels to be the same.

At least two pixels of the plurality of pixels may output image signals on the basis of incident light incident via optical members having wavelengths with different transmission characteristics, and
the electronic device may further include an authentication unit determining that an object to be imaged is an artificial object in a case where there is no peak around 760 nanometers on the basis of the image signals output from the at least two pixels.

At least two pixels of the plurality of pixels may output image signals on the basis of incident light incident via optical members having wavelengths with different transmission characteristics, and
the electronic device may determine that an object to be imaged is an artificial object in a case where there is no rise in a wavelength region from 500 to 600 nanometers on the basis of the image signals output from the at least two pixels.

At least two pixels of the plurality of pixels may output image signals on the basis of incident light incident via optical members having wavelengths with different transmission characteristics, and
the electronic device may calculate an absorption coefficient spectrum of oxygenated hemoglobin and an absorption coefficient spectrum of reduced hemoglobin on the basis of the image signals output from the at least two pixels, and
determine that an object to be imaged is an artificial object in a case where a ratio of a difference value between the absorption coefficient spectrum of the oxygenated hemoglobin and the absorption coefficient spectrum of the reduced hemoglobin at predetermined two wavelengths is outside a predetermined range.

The first pixel and the second pixel may be different in a size of the first hole with respect to the first light shielding film portion, and a region of the photoelectric conversion element of the first pixel or the second pixel having the first hole with a larger size may be set to be greater than a region of the photoelectric conversion element of the first pixel or the second pixel having the first hole with a smaller size.

Outputs of the plurality of pixels may be addable, and
the first hole corresponding to a pixel on a peripheral part of a region where the plurality of pixels is arrayed may be smaller in size than the first hole corresponding to a pixel at a central part of the region.

The electronic device may further include a display unit, in which the incident light may be incident on the photoelectric conversion unit via the display unit.

BRIEF DESCRIPTION OF DRAWINGS

FIGS. 1A and 1B are schematic cross-sectional views of an electronic device according to a first embodiment.

FIG. 4A is a diagram illustrating a cross-sectional structure along the line AA in a case where a multistage lens is used.

FIG. 4B is a diagram illustrating a specific case excluded from the definition of a pinhole.

FIG. 11 is a diagram illustrating optical characteristics with respect to an elevation angle θ at the position of a pinhole 50a.

FIG. 14B is a diagram illustrating a concept of pupil correction and some derivative examples.

FIGS. 15A, 15B, 15C, and 15D are diagrams schematically illustrating an inner lens and the first light shielding film portion.

FIG. 16A is a top view of a lens.

FIG. 16B is a top view of a lens using a reflow lens.

FIG. 17D illustrates vertical cross-sectional views of reflow lenses having bank portions including a light shielding material.

FIG. 18A is a diagram illustrating an example of a method for manufacturing a lens by an etch back process.

FIG. 18C is a diagram illustrating an example of a manufacturing method for forming a reflow lens and a reflow stopper of a bank portion including a metal film.

FIG. 18F is a diagram illustrating an example of a method for forming a reflow lens and a bank portion including a carbon black resist.

FIG. 18G is a diagram illustrating another example of a method for forming a reflow lens and a bank portion including a carbon black resist.

FIGS. 56A and 56B are diagrams illustrating a polarization pixel, a light-shielding pixel, and a phase pixels provided in the pixel array.

FIGS. 60A, 60B, and 60C are diagrams for describing an example of processing performed by an analysis unit.

FIGS. 61A, 61B, 61C, and 61D are diagrams illustrating an arrangement example of a light source.

MODE FOR CARRYING OUT THE INVENTION

Embodiments of the electronic device will be described below with reference to the drawings. Although main components of the electronic device will be mainly described below, the electronic device may have components and functions that are not illustrated or described. The following description does not exclude components and functions that are not illustrated or described.

First Embodiment

FIGS. 1A and 1B are schematic cross-sectional views of an electronic device 1 according to a first embodiment. An electronic device 1 in FIGS. 1A and 1B are any electronic device having both a display function and an imaging function, such as a smartphone, a mobile phone, a tablet, or a PC. FIG. 1A is an example of the electronic device 1 having an optical system, and FIG. 1B is an example of the electronic device 1 having no optical system. The electronic device 1 in FIGS. 1A and 1B include a camera module (imaging unit) disposed on a side opposite to a display surface of a display unit 2. As described above, in the electronic device 1 in FIGS. 1A and 1B, the camera module 3 is provided on the back side of the display surface of the display unit 2. Therefore, the camera module 3 performs image capture through the display unit 2.

Figures 2A, 2B:
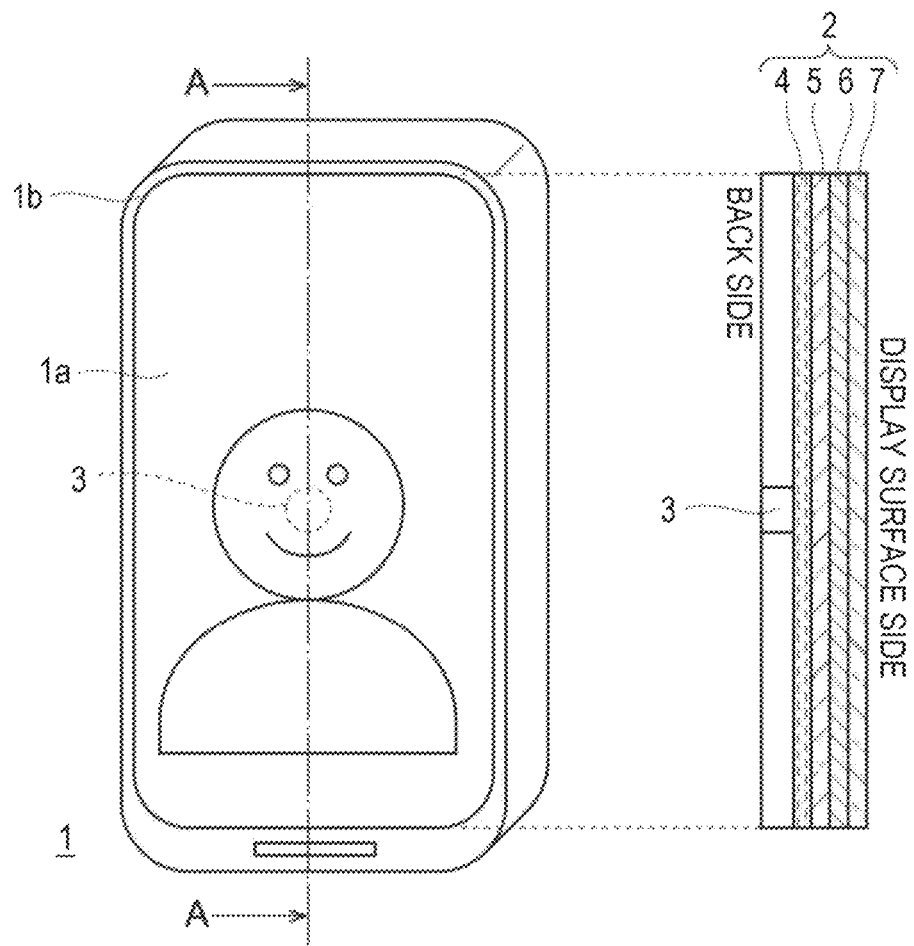
FIG. 2A is a schematic external view of the electronic device in FIGS. 1A and 1B.
FIG. 2B is a cross-sectional view taken along a line A-A in FIG. 2A.

FIG. 2A is a schematic external view of the electronic device 1 in FIGS. 1A and 1B, and FIG. 2B is a cross-sectional view taken along a line A-A in FIG. 2A. In the example of FIG. 2A, a display screen 1a extends to an area close to the outer size of the electronic device 1, and the width of a bezel 1b around the display screen 1a is set to several mm or less. Normally, a front camera is often mounted on the bezel 1b, but in FIG. 2A, the camera module 3 functioning as a front camera is disposed on the back side of the substantially central portion of the display screen 1a as indicated by a broken line. Providing the front camera on the back side of the display screen 1a in this manner eliminates the need to dispose the front camera in the bezel 1b, thereby being capable of reducing the width of the bezel 1b.

Note that, although the camera module 3 is disposed on the back side of the substantially central portion of the display screen 1a in FIG. 2A, it is sufficient in the present embodiment that the camera module 3 is disposed on the back side of the display screen 1a. For example, the camera module 3 may be disposed on the back side of the display screen 1a near the peripheral edge. In this manner, the camera module 3 in the present embodiment is disposed at any position on the back side overlapping the display screen 1a.

As illustrated in FIGS. 1A and 1B, the display unit 2 is a structure in which a display panel 4, a touch panel 5, a circularly polarizing plate 6, and a cover glass 7 are layered in this order. The display panel 4 may be, for example, an organic light emitting device (OLED) unit, a liquid crystal display unit, a microLED, or the display unit 2 based on other display principles. The display panel 4 such as the OLED unit includes a plurality of layers. The display panel 4 is often provided with a member having low transmittance such as a color filter layer. The member having low transmittance in the display panel 4 may be formed with a through hole according to an installation place of the camera module 3. If it is designed in such a manner that subject light passing through the through hole is incident on the camera module 3, the image quality of an image captured by the camera module 3 can be improved.

The circularly polarizing plate 6 is provided to reduce glare and enhance visibility of the display screen 1a even in a bright environment. The touch panel 5 has incorporated therein a touch sensor. There are various types of touch sensors such as a capacitive type and a resistive type, and any type may be used for the touch sensor. In addition, the touch panel 5 and the display panel 4 may be integrated. The cover glass 7 is provided to protect the display panel 4 and the like.

The camera module 3 illustrated in FIG. 1A includes an imaging unit 8 and an optical system 9. The optical system 9 is disposed on the light entrance surface side of the imaging unit 8, that is, on the side close to the display unit 2, and collects light passing through the display unit 2 on the imaging unit 8. The optical system 9 may be constituted by a plurality of lenses, and this may prevent the reduction in thickness of a housing. As a solution, using a Fresnel lens is conceivable, but there is a processing limit. The present invention provides a solid-state imaging element capable of imaging a fingerprint without impairing resolution even without an optical lens. However, the combination with the optical lens is not excluded.

Figure 3A:
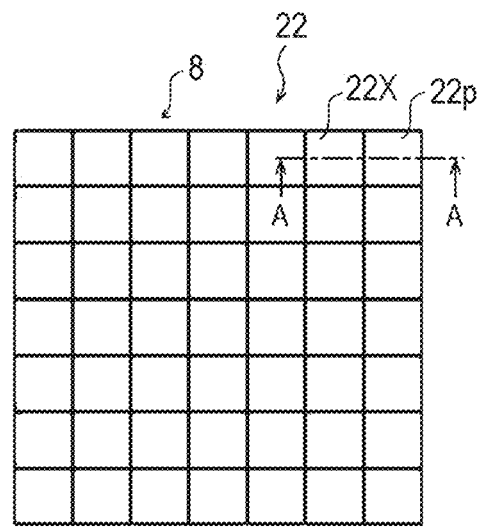
FIG. 3A is a plan view illustrating an example of an array of a plurality of pixels.

First, a case where a pixel 22 of the imaging unit 8 includes a multistage lens will be described. FIG. 3A is a plan view of an array structure in which a plurality of pixels 22 of the imaging unit 8 is viewed from the light entrance side. As illustrated in FIG. 3A, the imaging unit 8 includes a plurality of pixels 22. The plurality of pixels 22 is provided in an array along a first direction and a second direction intersecting the first direction. Note that the arrangement of the pixels is illustrated as an example, and the pixels are not necessarily provided in a rectangular shape or along the first direction and the second direction.

Figure 3B:
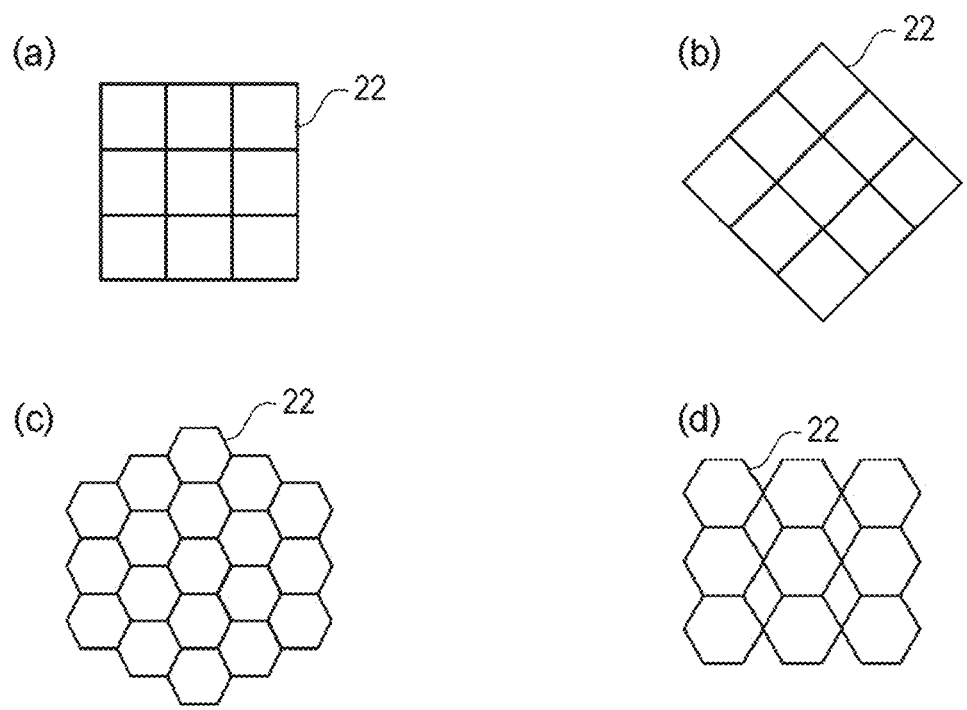
FIG. 3B is a schematic diagram illustrating an arrangement example of pixels.

FIG. 3B is a schematic diagram illustrating an arrangement example of the pixels 22. (a) illustrates an example in which the plurality of pixels 22 is provided in an array along the first direction and the second direction intersecting the first direction as in FIG. 3A.

(b) is a diagram illustrating an array in which the pixels 22 are rotated by 45 degrees with respect to the array in (a). Since the pitch of the pixels can be reduced to $1/\sqrt{2}$, it is possible to achieve high resolution while maintaining imaging characteristics.

(c) is a diagram illustrating an example in which the pixels 22 are arrayed into a regular hexagon. The regular hexagon has the shortest circumference among figures that can be filled in a plane, and the resolution can be efficiently increased. Then, the risk of initial failure can be reduced by providing the hexagonal pixel having a high stress dispersion effect against each of stress concentration that occurs when trench element isolation for suppressing crosstalk is formed on a substrate, stress concentration that occurs during trench processing of a light shielding wall 61 and the like to be described later, and stress concentration that occurs due to embedding of metal or an insulating film in a trench.

Furthermore, in a case where the substrate is provided with trench element isolation for suppressing crosstalk or the light shielding wall 61 includes a cross portion, processing variation occurs in the depth direction due to a micro loading effect at the time of etching. In this case, four lines are needed to be aligned in the rectangular shape, whereas three lines are needed to be aligned in the hexagonal shape, whereby a processing variation of micro loading can be suppressed.

(d) illustrates an example in which the pixels 22 are arrayed into a parallel octagonal shape. Note that the pixels 22 in the parallel octagonal shape may be formed into a honeycomb structure.

Pixels 22x and 22p indicate examples of pixels arranged side by side.

FIG. 4A is a diagram illustrating a cross-sectional structure of the pixels 22x and 22p along a line AA in the present embodiment in FIGS. 3A and 3B in a case where the pixels 22x and 22p have multistage lenses. As illustrated in FIG. 4A, in the imaging unit 8, an n-type semiconductor region is formed in, for example, a p-type semiconductor region of a semiconductor substrate 12 for each of the pixels 22x and 22p, whereby a photoelectric conversion element PD is formed for each pixel. On the front surface side (lower side in the drawing) of the semiconductor substrate 12, a multilayer wiring layer including a transistor for performing reading of charges accumulated in the photoelectric conversion element PD, and the like and an interlayer insulating film are formed.

An insulating layer 46 having a negative fixed charge is formed at an interface on the back surface side (upper side in the drawing) of the semiconductor substrate 12. The insulating layer 46 includes a plurality of layers having different refractive indexes, for example, two layers of a hafnium oxide (HfO2) film 48 and a tantalum oxide (Ta2O5) film 47, and the insulating layer 46 electrically suppresses dark current by pinning enhancement and optically functions as an antireflection film.

A silicon oxide film 49 is formed on the upper surface of the insulating layer 46, and a first light shielding film portion 50 formed with a pinhole 50*a* is formed on the silicon oxide film 49. The first light shielding film portion 50 only needs to include a material that shields light, and preferably includes a film of metal, for example, aluminum (Al), tungsten (W), or copper (Cu) as a material having a high light shielding property and capable of being accurately processed by microfabrication, for example, etching. The first light shielding film portion 50 is formed with the pinhole 50*a* and suppresses color mixture between pixels and light of a flare component incident at an unexpected angle.

Note that the pinhole in the present embodiment will be described. FIG. 4B is a diagram illustrating a specific case excluded from the definition of the pinhole. For example, (a) is a diagram illustrating an example of an opening shape often seen in a light-shielding metal of an image plane phase detection pixel. Such a shape is not a pinhole but is referred to as a slit shape in the present embodiment. On the other hand, (b) is a diagram illustrating an opening shape that is often seen when a stray light suppressing effect is intended. Such an opening having a large area ratio is referred to as inter-pixel light shielding for suppressing crosstalk to an adjacent pixel or an aperture diaphragm in the present embodiment.

On the other hand, a mode in which the shape of the opening with respect to the light shielding film satisfies the following conditions (1) to (3) is defined as a pinhole according to the present embodiment.
(1) The long side of the opening is ⅓ or less of the pixel size
(2) Opening area/pixel area≤10%
(3) The opening is provided in the vicinity of an image forming surface of the lens Regarding the vicinity of the image forming surface in (3), a region at least within ±2 μm, preferably within ±1 μm from the image forming surface is defined as the vicinity of the image forming surface in the present embodiment, considering that the depth of focus of the field changes depending on the optical path design.

Returning to FIG. 4A again, the light shielding wall 61 and a flattened film 62 having high light transmittance are formed in a plurality of stages on the first light shielding film portion 50 and the insulating layer 46. More specifically, a first light shielding wall 61A is formed in a part of a region on the first light shielding film portion 50 between pixels, and a first flattened film 62A is formed between the first light shielding walls 61A. Furthermore, a second light shielding wall 61B and a second flattened film 62B are formed on the first light shielding wall 61A and the first flattened film 62A. Note that the light shielding wall herein may include metal, for example, a material such as tungsten (W), titanium (Ti), aluminum (Al), or copper (Cu), an alloy thereof, or a multilayer film of these metals. Alternatively, the light shielding wall may include an organic light shielding material such as carbon black. Alternatively, the light shielding wall may include a transparent inorganic film as long as it has a structure for suppressing crosstalk by a total reflection phenomenon due to a difference in refractive index. For example, a shape in which the uppermost portion is closed may be applied as an air gap structure.

For example, a color filter 71 is formed for each pixel on the upper surfaces of the second light shielding wall 61B and the second flattened film 62B. The color filters 71 are provided in such a manner that R (red), G (green), and B (blue) are arranged in, for example, the Bayer arrangement, but another arrangement method may be used. Alternatively, the imaging unit 8 may not include the color filter 71.

An on-chip lens 72 is formed on the color filter 71 for each pixel. The on-chip lens 72 may include, for example, an organic material such as a styrene resin, an acrylic resin, a styrene-acrylic copolymer resin, or a siloxane resin. The styrene resin has a refractive index of about 1.6, and the acrylic resin has a refractive index of about 1.5. The styrene-acrylic copolymer resin has a refractive index of about 1.5 to 1.6, and the siloxane resin has a refractive index of about 1.45.

An inner lens 121 includes an inorganic material such as SiN or SiON. The inner lens 121 is formed on the formed first light shielding wall layer (the first light shielding wall 61A and the first flattened film 62A).

Figure 4C:
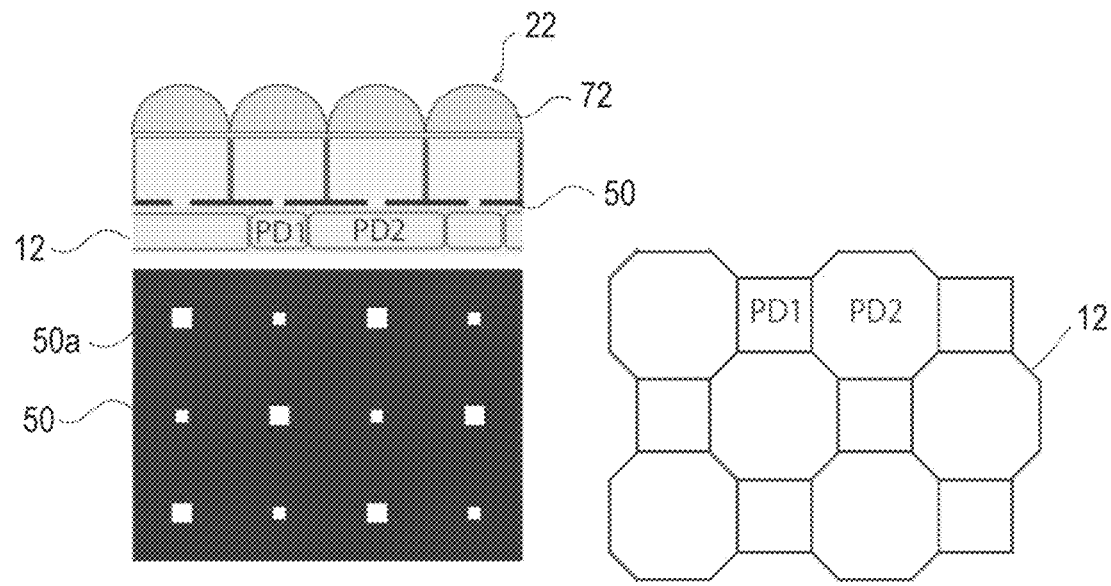
FIG. 4C is a diagram illustrating another example in which an opening area of the pinhole shape is varied for each element.

FIG. 4C is a diagram illustrating another example in which the opening area of the pinhole is varied for each pixel. The upper diagram on the left side illustrates a vertical cross section of the pixel 22, the lower diagram on the left side illustrates a plan view of the first light shielding film portion 50, and the right diagram illustrates a plan view of the semiconductor substrate 12. As the size of the pinhole 50*a* increases, the region of the photoelectric conversion element increases. That is, the size of the pinhole 50*a* corresponding to a photoelectric conversion element PD2 is larger than the size of the pinhole 50*a* corresponding to a photoelectric conversion element PD1. In a case where the pinholes 50*a* have different sizes, electrons previously accumulated in the photoelectric conversion element corresponding to the pinhole 50*a* having a large opening size are likely to reach a saturation state, and a risk of the electrons leaking to the adjacent pixel due to blooming increases. In the pixels 22 according to the present embodiment, the areas of the photoelectric conversion elements PD1 and PD2 vary so as to correspond to the areas of the pinholes 50*a*. As a result, the possibility of occurrence of blooming can be leveled between large openings and small openings. In addition, due to the configuration in which the photoelectric conversion elements PD1 and PD2 having regions with different sizes are provided, it is possible to simultaneously acquire a high-sensitivity image and a high-resolution image. Furthermore, it is also possible to obtain a wide dynamic range by synthesizing a high-sensitivity image and a high-resolution image.

First, an elevation angle θ in a case where a fingerprint is imaged by the imaging unit 8 will be described with reference to FIG. 5. In the case of capturing an image of a fingerprint, light scattered in a finger resulting from imaging light incident on the finger is captured by the imaging unit 8, for example.

Figure 5:
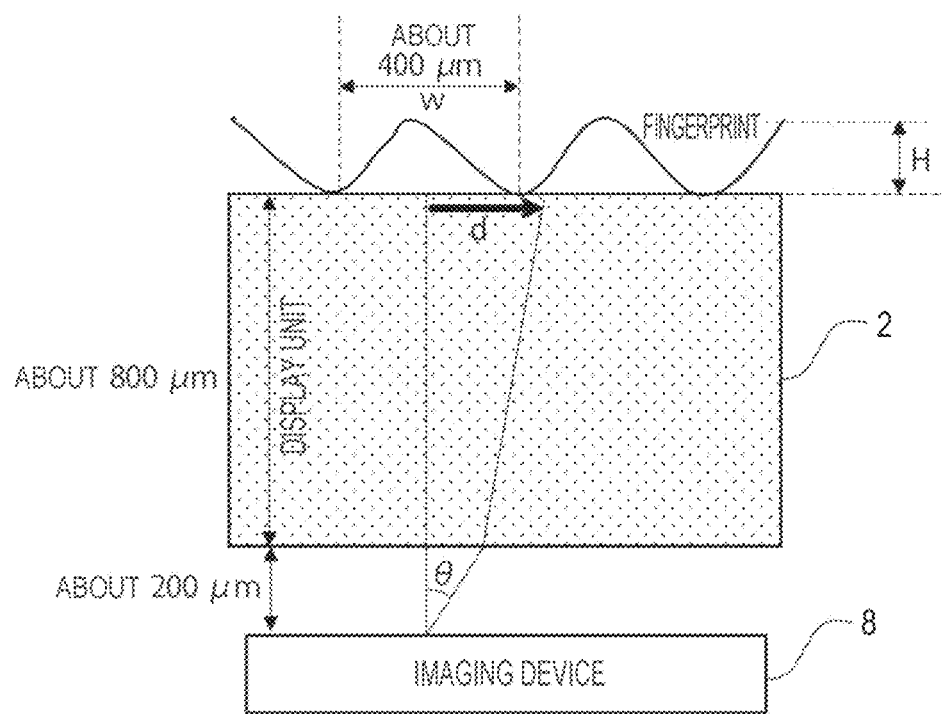
FIG. 5 is a diagram for describing a relationship between an elevation angle and a shift amount.

FIG. 5 is a diagram for describing the relationship between the elevation angle θ and a shift amount d in a case where the fingerprint of the finger is imaged by the imaging unit 8. As illustrated in FIG. 5, the fingerprint is an impression formed by friction ridges that are formed by pores of the sweat gland on the skin of the fingertip raising along an arc. A point at which light having an elevation angle θ from a first point of the imaging surface of the imaging device 8 is incident from the lower surface of the display unit (display unit) 2 and emitted from the upper surface of the display unit 2 is defined as a second point. In this case, the shift amount d [μm] is a distance between the second point and an intersection between a vertical upward line extending perpendicularly from the first point and the upper surface of the display unit (display unit) 2. In addition, the width of the friction ridge is indicated by W, and the height thereof is indicated by H. Note that, in the present embodiment, the width W of the friction ridge is referred to as a fingerprint pitch.

The thickness of the common display unit 2 is, for example, about 800 μm. In addition, the display unit 2 includes the display panel 4, the touch panel 5, the circularly polarizing plate 6, and the cover glass 7 (FIGS. 1A and 1B) as described above. These components are constituted by various members such as glass, polyimide resin, polarizing plate, and wave plate. When calculation is performed by mean field approximation in consideration of the thicknesses and refractive indexes of these components, the average refractive index of the display unit 2 that can be obtained as a representative value is, for example, 1.5. On the other hand, the distance between the lower surface of the display unit 2 and the surface of the on-chip lens of the imaging device 8 is designed to be, for example, 200 μm.

Figure 6:
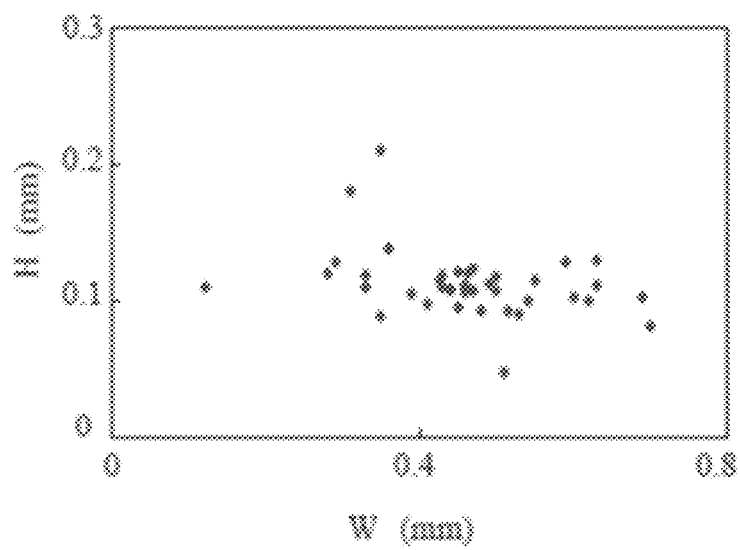
FIG. 6 is a diagram illustrating a distribution of a width W and a height H of the fingerprint.

Next, the distribution of the width W and the height H of the friction ridges will be described with reference to FIG. 6. FIG. 6 is a diagram illustrating the distribution of the width W and the height H of the fingerprint. The horizontal axis represents the width W of the friction ridges, and the vertical axis represents the height H of the friction ridges. As illustrated in FIG. 6, the average friction ridge of the fingerprint has a width W of approximately 400 micrometers and a height H of approximately 100 micrometers.

Figure 7:
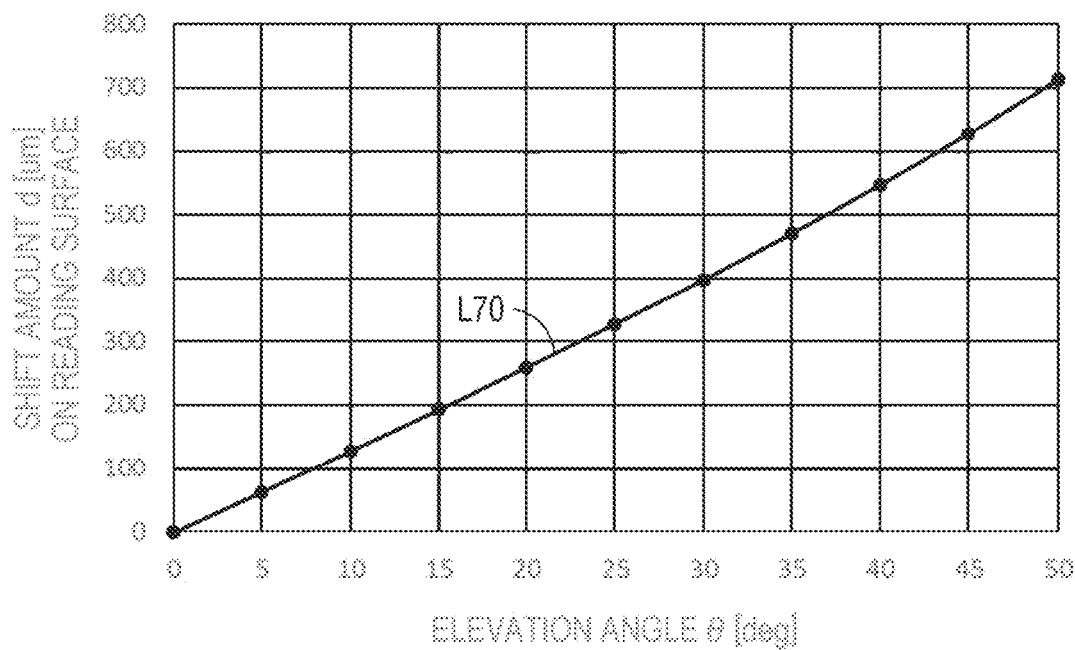
FIG. 7 is a diagram illustrating a correspondence relationship between an elevation angle and a shift amount.

Next, a correspondence relationship between the elevation angle θ and the shift amount d will be described with reference to FIG. 7. FIG. 7 is a diagram illustrating a correspondence relationship between the elevation angle θ and the shift amount d.

A line L70 indicates a correlation derived by the Snell's law in the case of the arrangement example of FIG. 5. For example, a half pitch of the fingerprint pitch of 400 μm corresponds to the elevation angle of 15 degrees from the correlation indicated by the line L70.

Here, optical characteristics of the pinhole 50a (FIGS. 4A, 4B, and 4C) provided in the first light shielding film portion 50 (FIGS. 4A, 4B, and 4C) that suppresses a decrease in imaging resolution will be described with reference to FIGS. 8A, 8B, 9, 10, and 11, while referring to FIG. 7.

Figure 8A:
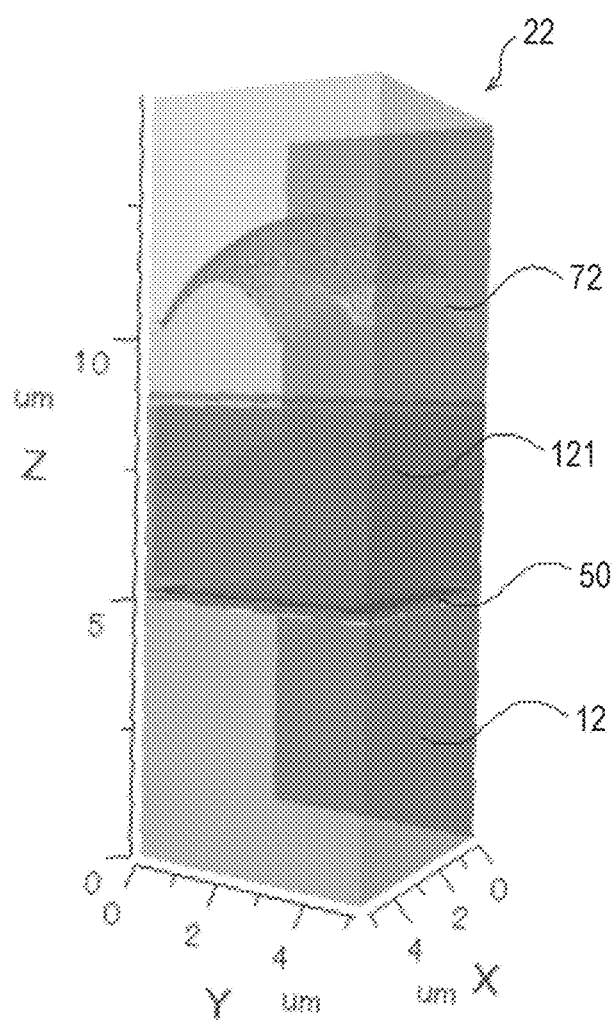
FIG. 8A is a diagram schematically illustrating a three-dimensional structure of a pixel.

FIG. 8A is a diagram schematically illustrating a three-dimensional structure of the pixel 22 constituting the imaging unit 8. As illustrated in FIG. 8A, the pixel having a multistage lens in the present embodiment has, for example, a rectangular shape with a base of 6×6 μm, and is designed to have a focus on the first light shielding film portion 50. In this case, the distance from the first light shielding film portion 50 to the vertex of the on-chip lens is, for example, 8 um.

Figure 8B:
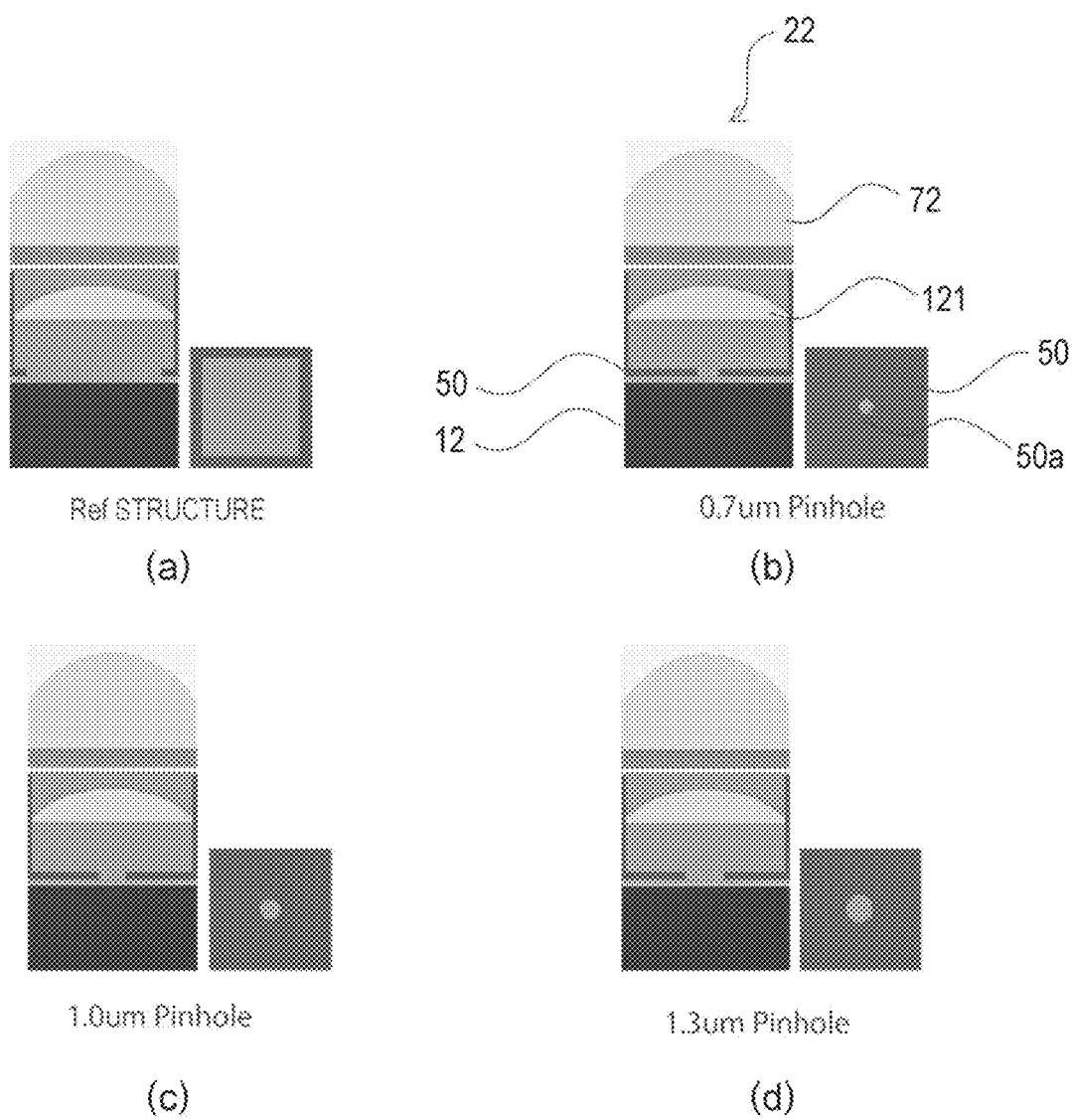
FIG. 8B illustrates diagrams including left diagrams schematically illustrating the vertical cross section of a pixel 22 and right diagrams which are plan views of a first light shielding film portion.

In FIG. 8B, left diagrams schematically illustrate the vertical cross section of the pixel 22 illustrated in FIG. 8A, and right diagrams illustrate plan views of the first light shielding film portion 50. Here, (a) shows a reference structure without a pinhole. (b) to (d) illustrate examples in which the diameter of the circular pinhole 50a of the first light shielding film portion 50 is 0.7, 1.0, and 1.3 μm, respectively. The opening area ratios of the first light shielding film portions 50 illustrated in (a) to (d) are 64%, 1%, 2%, and 4%, respectively. As described above, the shape of the first light shielding film portion 50 can be changed according to the purpose of image capture of the pixel 22.

Oblique incidence characteristics with respect to the four modes illustrated in (a) to (d) of FIG. 8B will be described with reference to FIG. 9.

Figure 9:
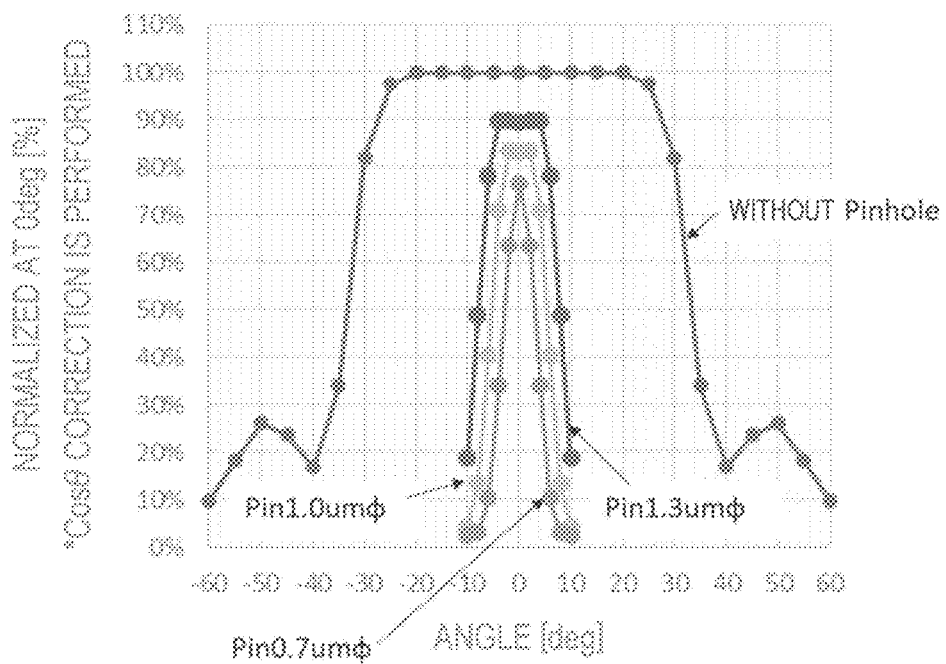
FIG. 9 is a diagram illustrating optical characteristics with respect to the elevation angle.

FIG. 9 is a diagram illustrating optical characteristics with respect to the elevation angle θ of the pixel 22 illustrated in FIG. 7. The horizontal axis represents the elevation angle θ, and the vertical axis represents the normalized output when the output of a large opening pixel without a pinhole is 1. In the case of the circular pinhole 50a having a diameter of 1.3 μm, light having substantially the same intensity enters the photoelectric conversion element PD when the elevation angle θ is from 0 degrees to 4 degrees, as illustrated in FIG. 9. On the other hand, when the elevation angle θ exceeds 4 degrees, an amount of incident light starts to decrease, and becomes about 20% of the normalized output at 10 degrees. As described above, in the case of the circular pinhole 50a having a diameter of 1.3 μm in the arrangement example of the optical system illustrated in FIG. 8B, the amount of incident light starts to decrease when the elevation angle θ exceeds 4 degrees. In other words, the amount of incident light at the elevation angle θ of 4 degrees or more is suppressed.

Next, in the case of the circular pinhole 50a having a diameter of 1.0 μm, light having substantially the same intensity enters the photoelectric conversion element PD when the elevation angle θ is from 0 degrees to 2 degrees. On the other hand, when the elevation angle θ exceeds 2 degrees, an amount of incident light starts to decrease, and becomes about 5% of the normalized output at 10 degrees. As described above, in the case of the circular pinhole 50a having a diameter of 1.0 μm in the arrangement example of the optical system illustrated in FIG. 8B, the amount of incident light starts to decrease when the elevation angle θ exceeds 2 degrees. In other words, the amount of incident light at the elevation angle θ of 2 degrees or more is suppressed.

Next, in the case of the circular pinhole 50a having a diameter of 0.7 μm, the amount of incident light starts to decrease from the point at which the elevation angle θ is 0 degrees, and becomes about 2% of the normalized output at 10 degrees. As described above, in the case of the circular pinhole 50a having a diameter of 0.7 μm, vignetting is already produced in normally incident light. The vignetting according to the present embodiment refers to a state in which only a part of the light distribution passes through the pinhole 50a. As described above, although the sensitivity decreases due to the reduction in size of the pinhole, the resolution is further increased.

As illustrated in FIG. 9, the amount of light incident on the photoelectric conversion element PD with respect to the elevation angle θ can be adjusted by the size of the pinhole 50a provided in the first light shielding film portion 50. As a result, by adjusting the size of the pinhole 50a provided in the first light shielding film portion 50, the pixel 22 can be configured to have a resolution corresponding to the imaging purpose. As described above, the resolution and the normalized output of the pixel 22 can be adjusted by the size of the pinhole 50a.

Figure 10:
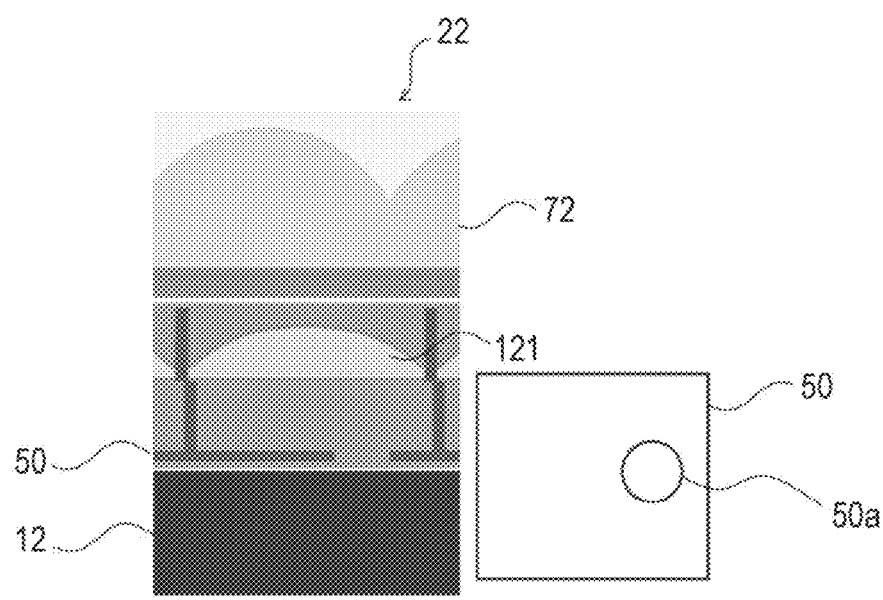
FIG. 10 is a diagram illustrating a structure example in which pupil correction is performed.

FIG. 10 is a diagram illustrating an example of a structure in which pupil correction is performed to efficiently receive obliquely incident light with respect to the structure of FIG. 8B. FIG. 10 schematically illustrates only the drawing corresponding to the example in which the diameter of the pinhole 50a is 1.0 μm in FIG. 8B.

Figure 11:
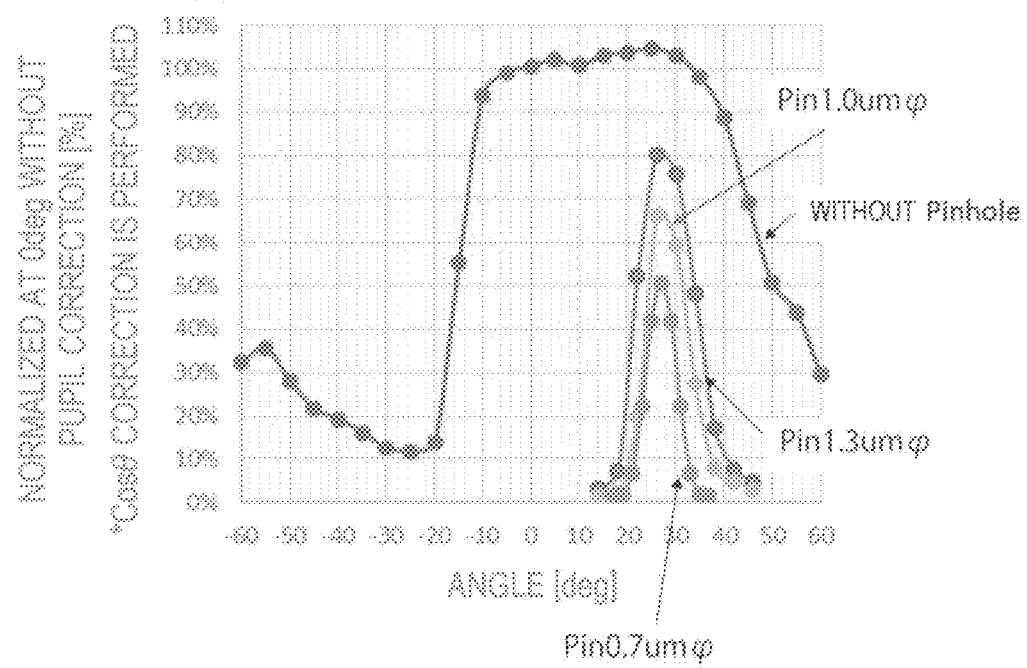

FIG. 11 is a diagram illustrating optical characteristics with respect to the elevation angle θ at the position of the pinhole 50a illustrated in FIG. 10. The horizontal axis represents the elevation angle θ, and the vertical axis represents the normalized output when the output of a large opening pixel without a pinhole at 0 degrees is 1. In the following, the above definition of the "normalized output" is used unless otherwise specified. Four modes in total are illustrated which are the reference structure having no pinhole in the first light shielding film portion 50 and the structures having circular pinholes 50a in the first light shielding film portions 50 with diameters of 0.7, 1.0, and 1.3 μm. These structures are configuration examples corresponding to an oblique incidence angle of 27 degrees. As can be seen from these structures, the peak of a light receiving angle is shifted from 0 degrees. In addition, the sensitivity decreases as compared with FIG. 10 illustrating the structures without pupil correction. This is because the light intensity distribution is widened by oblique incidence.

More specifically, in the case of the circular pinhole 50a having a diameter of 1.3 μm, an amount of incident light reaches a peak at the elevation angle θ of 27 degrees, and decreases as the elevation angle θ is shifted from 27 degrees, as illustrated in FIG. 11. Vignetting is produced in obliquely incident light. When the elevation angle θ is 37 degrees, the amount of incident light is about 20% of the normalized output. As described above, in the case of the circular pinhole 50a having a diameter of 1.3 μm in the arrangement example of the optical system illustrated in FIG. 10, the amount of incident light starts to decrease when the elevation angle θ exceeds 27 degrees.

Next, in the case of the circular pinhole 50a having a diameter of 1.0 μm, an amount of incident light reaches a peak at the elevation angle θ of 27 degrees, and decreases as the elevation angle θ is shifted from 27 degrees. When the elevation angle θ is 35 degrees, the amount of incident light is about 20% of the normalized output.

Next, in the case of the circular pinhole 50a having a diameter of 0.7 μm, an amount of incident light reaches a peak at the elevation angle θ of 27 degrees, and decreases as the elevation angle θ is shifted from 27 degrees. When the elevation angle θ is 32 degrees, the amount of incident light is about 20% of the normalized output. As described above, as the diameter of the pinhole 50a decreases, the difference between the elevation angle at which the amount of incident light is about 20% of the normalized output and the elevation angle at which the amount of incident light has a peak value further decreases. That is, even in oblique incidence, the resolution increases as the diameter of the pinhole 50a decreases.

Further, the sensitivity decreases due to the reduction in size of the pinhole 50a. As described above, the reduction in size of the pinhole 50a further accelerates an increase in resolution, although causing a decrease in sensitivity. The commercial value can be increased by applying such pupil correction. For example, in the lensless electronic device 1 in FIG. 5, an angle of view is increased by approximately 0.8 mm by linearly applying pupil correction for obtaining the optical characteristics illustrated in FIG. 11 at the angle of view end such that the lens shifts outward from the chip center toward the angle of view end.

Here, the optical characteristics of the pixel 22 according to the layer thickness between the bottom part of the inner lens 121 (FIGS. 4A, 4B, and 4C) and the first light shielding film portion 50 (FIGS. 4A, 4B, and 4C) provided with the pinhole 50a will be described with reference to FIGS. 12, 13, 14A, 14B, 15A, 15B, 15C, and 15D.

Figure 12:
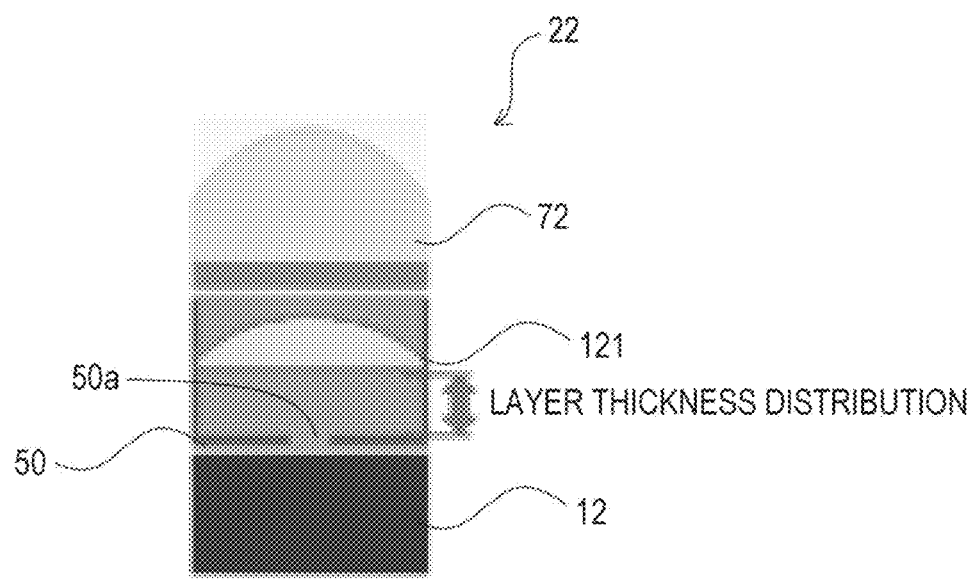
FIG. 12 is a diagram schematically illustrating a vertical cross section of the pixel illustrated in FIGS. 8A and 8B.

FIG. 12 is a diagram schematically illustrating a vertical cross section of the pixel 22 illustrated in FIGS. 8A and 8B. In the following, optical characteristics according to the layer thickness distribution between the bottom part of the inner lens 121 (FIGS. 4A, 4B, and 4C) and the first light shielding film portion 50 (FIGS. 4A, 4B, and 4C) will be described.

Figure 13:
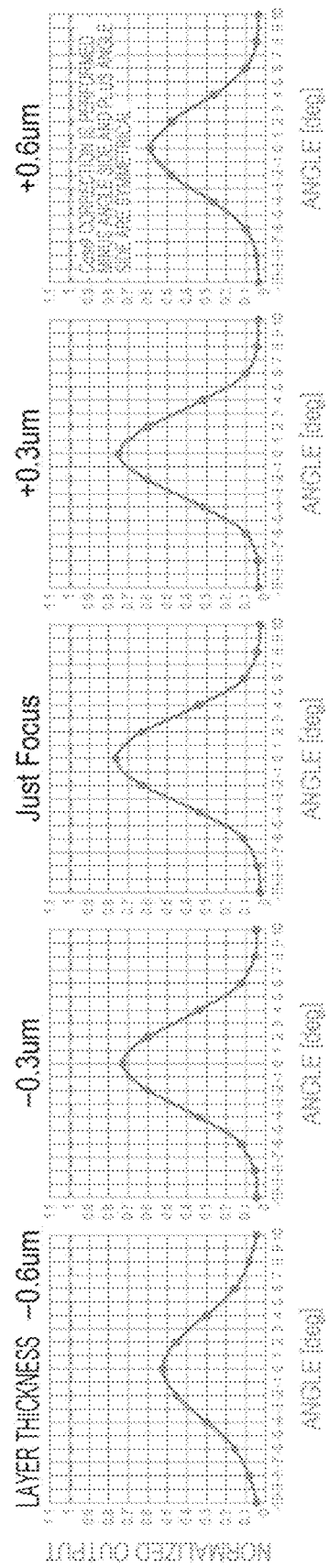
FIG. 13 is a diagram illustrating a relationship between an elevation angle and a normalized output.

FIG. 13 is a diagram illustrating a relationship between the elevation angle θ according to the layer thickness between the bottom part of the inner lens 121 and the first light shielding film portion 50 and the normalized output. A graph indicating the case where the layer thickness between the inner lens 121 and the first light shielding film portion 50 is a layer thickness in an in-focus state (just focus) is illustrated in the center, and graphs indicating the cases where the layer thickness is −0.3 micrometers and −0.6 micrometers from the thickness in the in-focus state are sequentially illustrated on the left side. Similarly, graphs indicating the cases where the layer thickness is +0.3 micrometers and +0.6 micrometers from the thickness in the in-focus state are sequentially illustrated on the right side. The horizontal axis of the angular graph represents the elevation angle θ, and the vertical axis represents the normalized output of the pixel 22. The horizontal axis of the angular graph ranges from −10 degrees to 10 degrees, and the midpoint is 0 degrees.

Figure 14A:
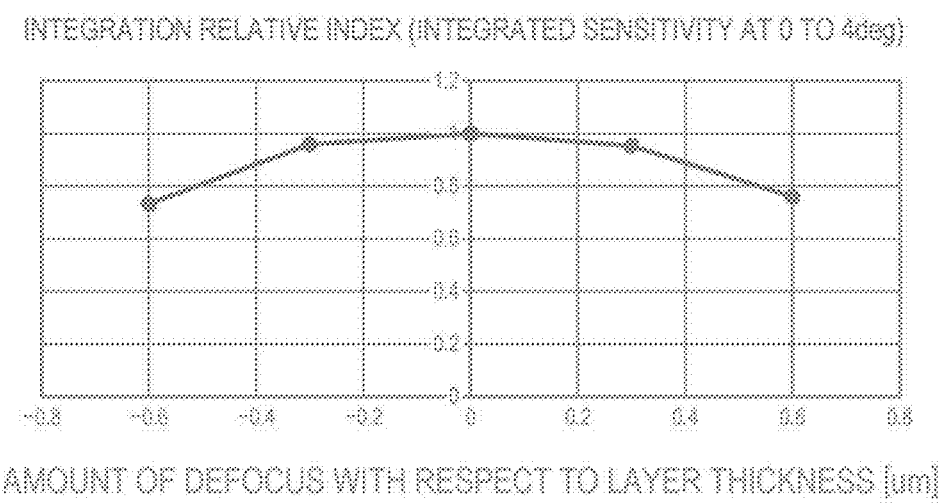
FIG. 14A is a diagram illustrating integrated sensitivity obtained by integrating normalized outputs.

FIG. 14A is a diagram illustrating integrated sensitivity obtained by integrating normalized outputs in the graphs illustrated in FIG. 13 at the elevation angle of −4 degrees to 4 degrees. The horizontal axis represents a defocus amount with respect to the layer thickness in an in-focus state (just focus). The vertical axis represents a relative value of the integrated sensitivity of each graph (FIG. 13) in a case where the integrated sensitivity in the in-focus state (just focus) is 1. As illustrated in FIGS. 14A and 14B, the integrated sensitivity is maintained at 0.95 or more within a range where the absolute value of the defocus amount is up to 0.3 micrometers.

FIG. 14B is a diagram illustrating a concept of pupil correction and some derivative examples according to the present embodiment. In a case where pupil correction is not performed, each pixel captures only light perpendicularly incident from a subject facing the pixel, and the chip size and the subject size become equal. However, it is desirable that the chip size can be made as small as possible in view of suppression of the manufacturing cost by increasing the number of chips that can be obtained in a wafer and a potential demand for reducing the occupied area in a housing on the set side. Pupil correction is considered as a means for achieving the above demands. The above demands can be achieved by angle control at the position of the pinhole as in (a), angle control by shifting the lens system with respect to the light shielding wall as in (b), or a combination thereof as in (c).

FIGS. 15A, 15B, 15C, and 15D are diagrams schematically illustrating the on-chip lens 72 and the first light shielding film portion 50. Lines L2 to L6 indicate ranges of light fluxes collected through the on-chip lens 72. FIG. 15A illustrates an example in which the pinhole of the first light shielding film portion 50 is provided in the central portion, and FIG. 15B illustrates an example in which the pinhole is shifted to the left side. The pixel 22 indicated in FIG. 15A is disposed, for example, at the center of the imaging unit 8, and the pixel 22 indicated in FIG. 15B is disposed, for example, at the right end of the imaging unit 8.

FIG. 15A which is on the left side illustrates a case where the layer thickness between the on-chip lens 72 and the first light shielding film portion 50 is in an in-focus state (just focus) at the chip center. In this case, at the angle of view end indicated in FIG. 15B, the optical path length becomes longer than the optical path length of the pixel indicated in FIG. 15A, so that shift to a front focus state may occur. Therefore, it is desirable to optimize the light collection point in consideration of the pixel 22 at the angle of view end illustrated in FIG. 15B, as in the example on the right side. In this case, a back focus state is generated for the pixel 22 illustrated in FIG. 15A. However, generating the back focus state enables reduction in thickness of the on-chip lens 72 and the reduction in layer thickness between the bottom part of the on-chip lens 72 and the first light shielding film portion 50. Furthermore, overall optimization may be performed on each of the pixels 22 illustrated in FIGS. 15A and 15B by performing intermediate focusing. In this case, a back focus state is also generated for the pixel 22 illustrated in FIG. 15A, and thus, it is possible to reduce the thickness of the on-chip lens 72 and to reduce the layer thickness between the bottom part of the on-chip lens 72 and the first light shielding film portion 50. Note that, even when the back focus state is generated, the decrease in the integrated sensitivity is gentle as illustrated in FIG. 14A, so that the integrated sensitivity can be maintained.

As described above, the present embodiment indicates that the pixel 22 of the imaging unit 8 includes the on-chip lens 72 and the first light shielding film portion 50. However, the present embodiment can be applied to a configuration illustrated in FIGS. 8A and 8B having a multistage lens obtained by adding the inner lens 121. Since the pinhole 50a is provided in the first light shielding film portion 50 of the pixel 22, the optical characteristics including the high resolution and the normalized output of the pixel 22 can be adjusted by adjusting the size of the pinhole 50a. Furthermore, due to the configuration in which the pixel 22 has a multistage lens including the on-chip lens 72 and the inner lens 121, the light-collecting power of the optical system of the pixel 22 can be increased. Furthermore, by adjusting the layer thickness between the inner lens 121 and the first light shielding film portion 50, the focusing state such as the back focus state can be adjusted with respect to the pinhole 50a. When the layer thickness decreases due to the generation of the back focus state, a PAD opening process is facilitated, and the thickness of the imaging unit can be reduced.

Next, a case where a reflow lens is used for the on-chip lens 72 will be described. For example, a material obtained by dissolving an acrylic resin in a PGMEA solvent and adding a photosensitizer thereto is used for the reflow lens. The material is applied to a substrate by spin coating, and exposed and developed. Thereafter, a lens shape is formed by reflow by heat treatment, and bleaching treatment is performed with ultraviolet rays. Unlike an etch back process, the reflow lens has a problem that a gapless structure is difficult, but the number of steps is small, and a PAD region can be removed by exposure. Therefore, it is advantageous for forming a thick lens of a large pixel.

FIG. 16A is a top view of an example of the lens 72. As illustrated in FIG. 16A, the method for transfer to the lens material by the etch back process makes it possible to narrow the gap between the lenses by deposited materials during etching. That is, the sensitivity can be enhanced by narrowing an ineffective region of the lens. On the other hand, according to the Fraunhofer diffraction theory, when the refractive index of a medium is n, the focal length is f, and the lens size is D, the spot radius ω₀ when the light having a wavelength λ is collected can be approximately expressed by Expression (1).

[Expression 1]

$$\omega_0 = \frac{1.22\, f\lambda}{nD} \tag{1}$$

That is, the spot radius ω₀ can be decreased as the thickness of the lens is increased and the focal length f is shortened, or as the lens size D is increased.

However, when it is intended to increase the thickness of the lens while increasing the size of the lens, there arises a problem that an amount of deposited materials in a chamber increases due to an increase in a processing amount of etching for the lens material, which leads to an increase in maintenance frequency. It is considered that the limit of the lens thickness is about 3 to 4 μm from the viewpoint of operating the device. On the other hand, it is conceivable to increase the size of the pixel with a thin lens, but in this case, the horizontal and diagonal curvature radii are geometrically different from each other. The flat lens cannot sufficiently narrow light due to so-called astigmatism in which light is not focused on one point. Furthermore, when focusing is performed using a thin lens by increasing a height, the focal length increases, by which light cannot be narrowed.

A reflow lens illustrated in FIG. 16B is provided as one of the solutions.

FIG. 16B is a top view of an example of the lens 72 constituted by the reflow lens. The reflow lens is characterized in that the lens material is formed into a lens shape by directly applying heat to the lens material. Regarding the reflow lens, a resin such as an acrylic resin is dissolved in a solvent, for example. In this case, for example, a material to which an ortho-naphthoquinone diazido compound is added can be used as the photosensitizer. The reflow lens is difficult to narrow the gap with respect to the method using etch back, and in particular, the gap at the diagonal portion becomes wide. On the other hand, the reflow lens has advantages that a thick lens is easily formed, the number of steps is small without requiring etch back, and the lens material of the PAD portion can be removed by exposure and development.

Figure 17A:
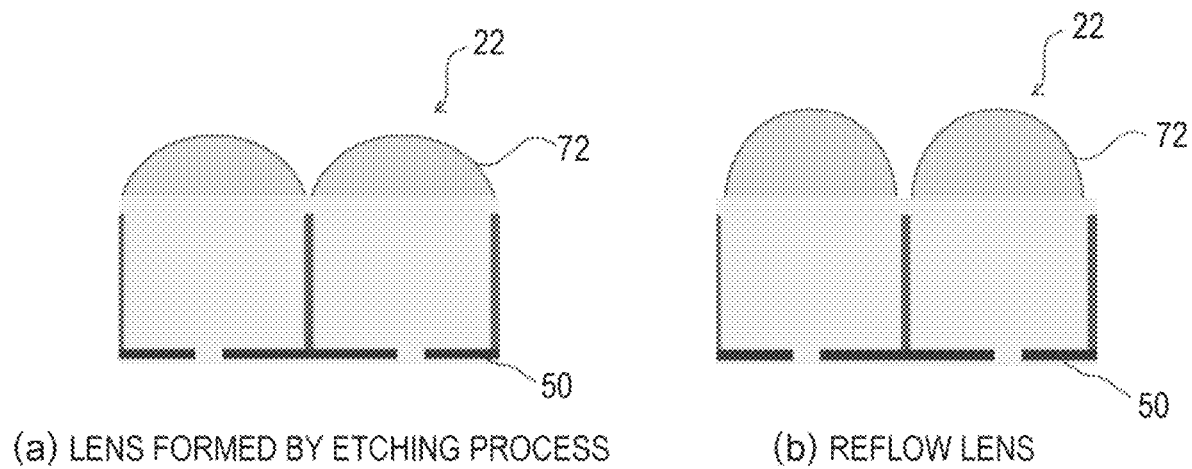
FIG. 17A shows vertical cross-sectional views of a lens formed by an etching process and a reflow lens.
Figure 17B:
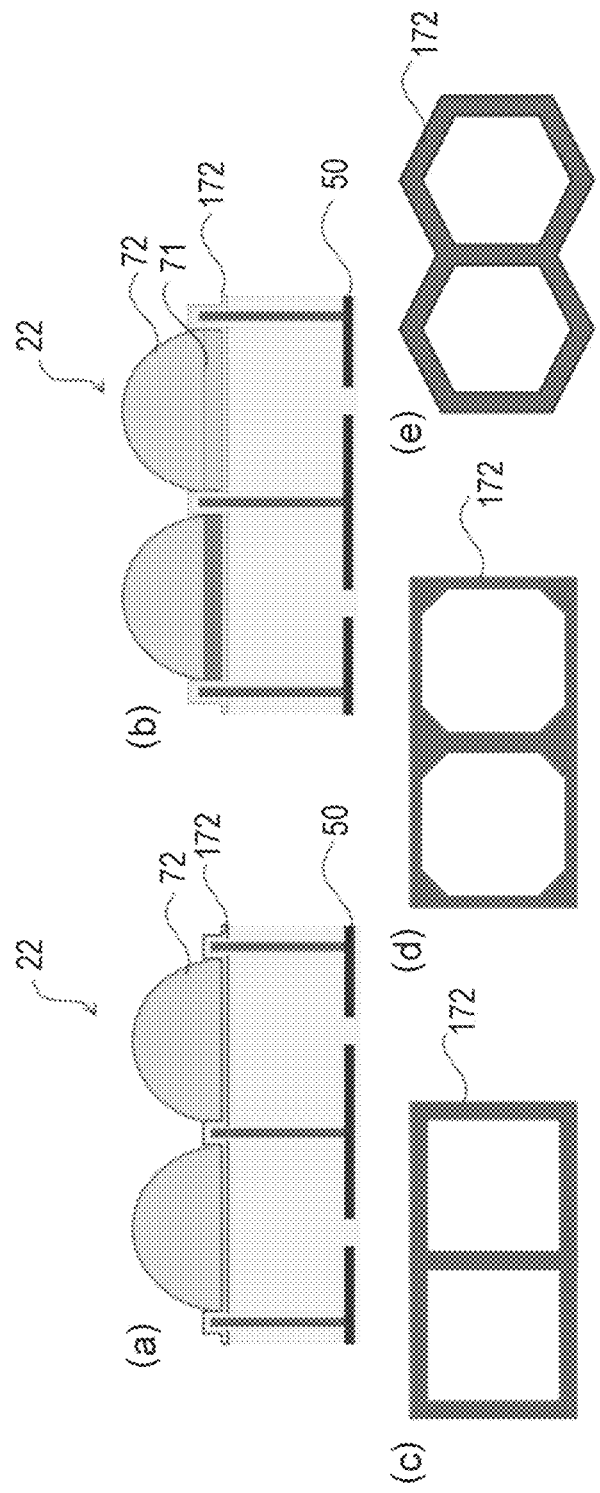
FIG. 17B shows vertical cross-sectional views of reflow lenses having bank portions.

In the following, FIGS. 17A, 17B, 17C, 17D, 18A, 18B, 18C, 18D, 18E, 18F, and 18G illustrate examples of embodiments of various lenses. Note that the structure illustrated in FIG. 17A and the structure that includes a bank portion having light shielding properties illustrated in FIG. 17B are not limited to be applied to the reflow lens, and may be applied to a lens formed by an etch back process to enhance light shielding performance. The bank portion is formed as a reflow stopper. Furthermore, these lenses may be provided with an antireflection film in consideration of a so-called λ/4n rule by forming a film of a material having a different refractive index, such as silicon oxide, on the surface of the lenses. As a specific example, silicon oxide having a refractive index of 1.47 is used as an antireflection film in a visible light region with respect to a lens material of a styrene-acrylic copolymer resin having a refractive index of 1.58. In this case, the thickness of silicon oxide is preferably 70 to 140 nm, and more preferably 90 to 120 nm. This configuration can improve sensor sensitivity and suppress a stray light component reflected on the sensor surface.

FIG. 17A shows vertical cross-sectional views of a lens formed by an etching process and a reflow lens. (a) illustrates the lens formed by the etching process, and (b) illustrates the reflow lens. The reflow lens has a greater thickness. As a result, the focal length can be made shorter than that of the lens formed by the etching process.

FIG. 17B shows vertical cross-sectional views of reflow lenses having bank portions. (a) is a vertical cross-sectional view of a reflow lens having a bank portion, (b) is a vertical cross-sectional view of a reflow lens having a filter and a bank portion, (c) is a top view of a rectangular bank portion, (d) is a top view of a rectangular bank portion in which corners at diagonal ends are removed, and (e) is a top view of a hexagonal bank portion. As illustrated in FIG. 17B, a bank portion 172 includes a metal film. The structures are different from the embodiment illustrated in FIG. 16B in that the lens material is dammed by the bank portion 172 during a reflow process.

In (c), the bank is formed with a rectangular opening. As a result, a damming effect is provided in the vicinity of the center of the side of the bank portion 172. On the other hand, the lens material may not reach the bank at the diagonal portion. In a case where the lens material does not reach the bank, the gap causes stray light, and the lens shape also varies. In (d), the bank is formed at the boundary between pixels so as to trace the shape of an ineffective region of the reflow lens 72 viewed from the top. The material of the reflow lens 72 is dammed over the entire area of the bank portion 172, and the shape of the reflow lens 72 is stabilized. This configuration has an advantage that stray light from the gap portion can be effectively suppressed by the metal film included in the bank portion 172. An example in which the cross-sectional result acquired by an AFM is approximated by an octagon has been described as an example, but the configuration is not limited thereto. For example, the cross-sectional result may be approximated by a rectangle having rounded corners. In (e), the pixels have a shape close to a circle, for example, a hexagonal shape, and the bank portion 172 is formed in a shape close to a circle. In this case, all the boundaries have an obtuse angle, and the density of the reflow lens having poor pattern fidelity can be increased.

Figure 17C:
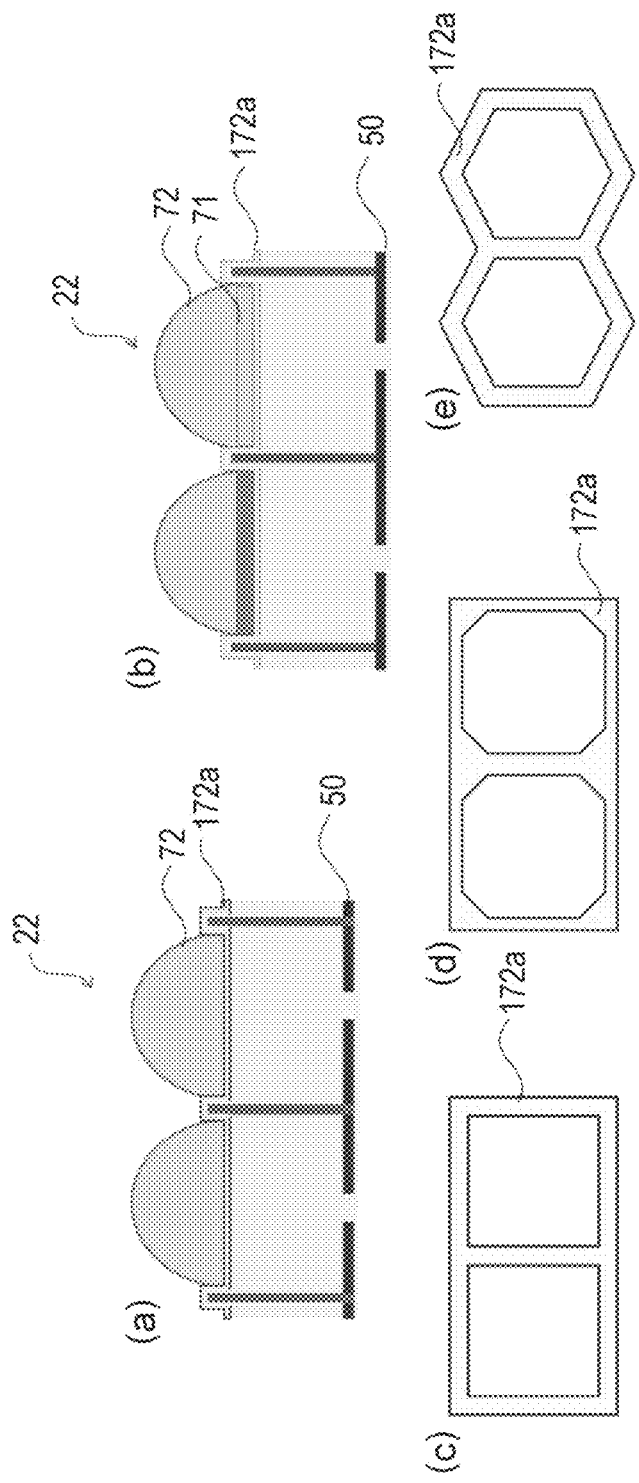
FIG. 17C illustrates vertical cross-sectional views of reflow lenses having bank portions including a transparent material.

FIG. 17C illustrates vertical cross-sectional view example of schematic views of reflow lenses having bank portions that include a transparent material. (a) is a vertical cross-sectional view of a reflow lens having a bank portion, (b) is a vertical cross-sectional view of a reflow lens having a filter and a bank portion, (c) is a top view of a rectangular bank portion, (d) is a top view of a rectangular bank portion in which corners at diagonal ends are removed, and (e) is a top view of a hexagonal bank portion. As illustrated in FIG. 17C, a bank portion 172a includes a transparent material. The bank portion 172a is inferior to the bank portion 172 illustrated in FIG. 17B in light shielding property, but has an effect of suppressing sensitivity loss. In addition, stray light can be suppressed by a waveguide effect by providing a difference in refractive index between the bank portion including a transparent material and the lens material.

FIG. 17D illustrates vertical cross-sectional view examples of schematic views of reflow lenses having bank portions including a light-shielding resin, for example, a carbon black resist. (a) is a vertical cross-sectional view of a reflow lens having a bank portion, (b) is a vertical cross-sectional view of a reflow lens having, in the same layer, a bank portion including a light-shielding resin and a filter thinner than the bank portion, (c) is a vertical cross-sectional view of a reflow lens having a bank portion that includes a light-shielding resin on a filter, (d) is a top view of a rectangular bank portion, (e) is a top view of a rectangular bank portion in which corners at diagonal ends are removed, and (f) is a top view of a hexagonal bank portion. As illustrated in FIG. 17D, a bank portion 172b includes a light-shielding resin. The bank portion 172b is inferior to the bank portion 172 illustrated in FIG. 17B in light shielding property, but can be formed with a smaller number of steps. The bank portion 172b is inferior to the bank portion 172a illustrated in FIG. 17C in sensitivity, but is superior in light shielding property.

FIG. 18A is a diagram illustrating an example of a method for manufacturing a lens by an etch back process. As illustrated in FIG. 18A, a lens material 72a may be, for example, an organic material such as a styrene resin, an acrylic resin, a styrene-acrylic copolymer resin, or a siloxane resin. For example, these materials are spin coated. Alternatively, an inorganic material such as silicon nitride or silicon oxynitride may be deposited by CVD or the like. After a photosensitive resist 720a is applied onto the lens material 72a, the resultant is exposed and developed, and then, heated to a temperature equal to or higher than the softening point of the resist 720a to form a lens shape 720b. Thereafter, anisotropic etching is performed using a resist of the lens shape 720b as a mask to transfer the shape of the resist to the lens material 72a. Thus, the lens 72 is formed. According to the etch back process described above, a gap at the lens boundary can be narrowed by adhesion of deposited materials during etching. In addition, the sensitivity can be improved by narrowing the gap. In addition, since the lens material 72a and silicon oxide have poor adhesion, an adhesion layer 700 may be provided under the lens material 2a in order to address such a problem. The adhesion layer 700 may change due to contact with metal. In view of this, a transparent inorganic film 702, for example, silicon oxide may be provided under the adhesion layer 700.

Figure 18B:
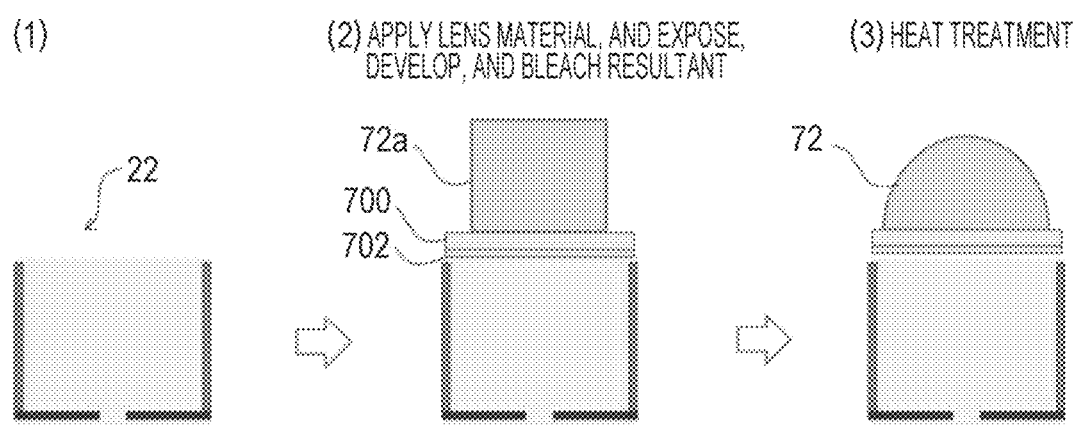
FIG. 18B is a diagram illustrating an example of a method for forming a reflow lens.

FIG. 18B is a diagram illustrating an example of a method for forming the reflow lens. As illustrated in FIG. 18B, a reflow lens material is spin-coated with a predetermined coating thickness, and then, the resultant is exposed, developed, and bleached. Then, a patterning material 72a having a predetermined cutout width is formed. Next, heat treatment is performed at a temperature equal to or higher than the thermal softening point of the reflow lens material, and the patterning material 72a is subjected to broaching by ultraviolet irradiation. As a result, the upper surface of the patterning material 72a is processed into a rounded shape of the on-chip lens 72. As illustrated in FIG. 16B, a wide gap may be formed, and shape reproducibility may deteriorate due to variations in heat treatment. In addition, since the reflow lens material and silicon oxide have poor adhesion, an adhesion layer 700 may be provided under the reflow lens material in order to address such a problem. The adhesion layer 700 may change due to contact with metal. In view of this, a transparent inorganic film 702, for example, silicon oxide may be formed under the adhesion layer 700.

FIG. 18C is a diagram illustrating an example of a manufacturing method for forming a reflow lens and a reflow stopper of a bank portion including a metal film. As illustrated in FIG. 18C, first, a metal film 180 is deposited by CVD. Next, a resist mask 182 is formed on the metal film 180 formed on the surface by lithography. Subsequently, etching is performed using the resist mask 182 to leave the metal film 180 only at the boundary of pixels, and a metal film 184 of the reflow stopper is formed. Thus, a bank-shaped step is formed. The reflow lens may be formed by using the step due to the metal film 184 between the pixels as a stopper.

Thereafter, processing similar to that in FIG. 18B is performed to form the on-chip lens 72 using the reflow lens. In addition, in a case where there is a concern about reliability such as a change of properties at the interface between the metal film and the reflow lens material, a transparent insulating film, for example, silicon oxide may be conformally formed by CVD, ALD, or the like. Furthermore, in a case where the adhesion is poor, a transparent material having a low viscosity and high adhesion properties such as an acrylic or epoxy resin may be spin-coated so as to leave a step, and then, the reflow lens may be formed. With the processing described above, the light shielding wall 61 and the metal film 184 of the reflow stopper can be simultaneously formed, whereby the number of steps can be reduced. It is obvious that the metal film 184 for generating the bank portion 172 is not particularly limited, and may be different from the metal film of the light shielding wall 61.

Figure 18D:
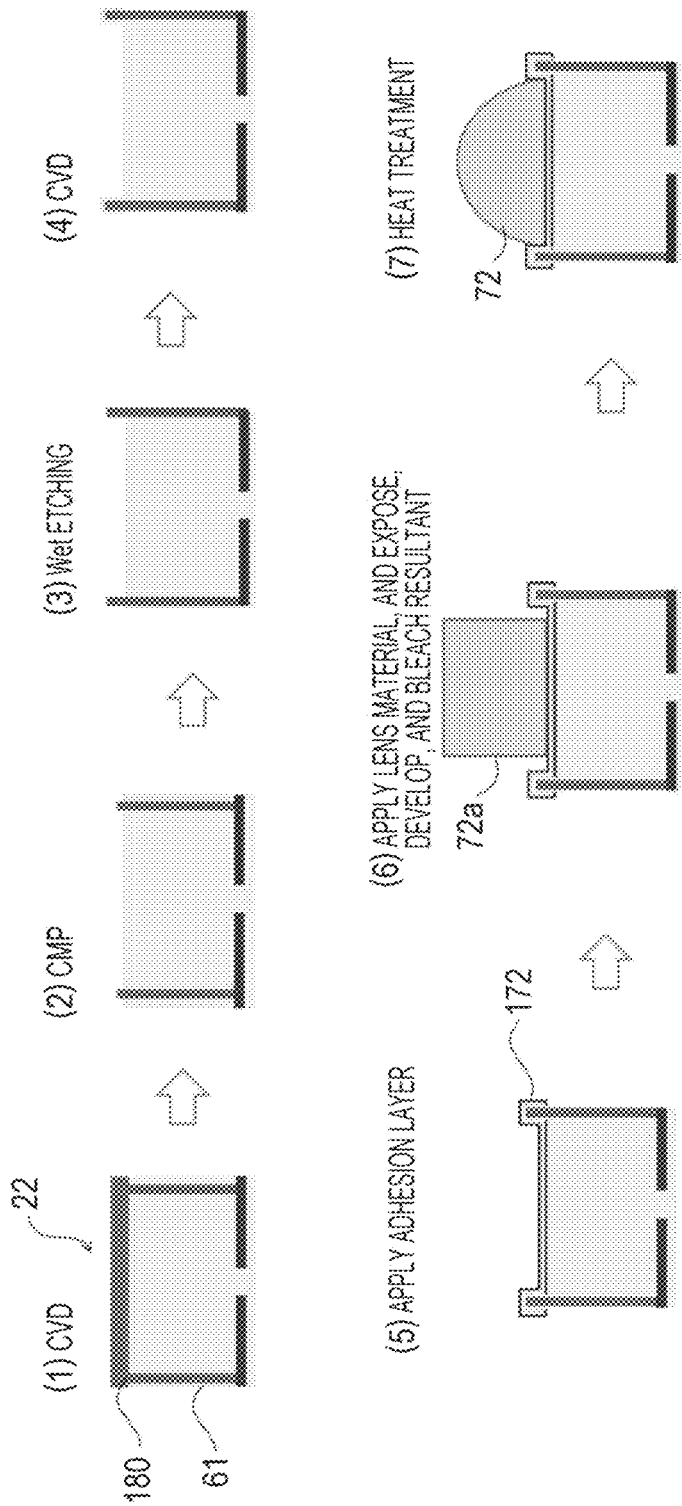
FIG. 18D is a diagram illustrating another example of a manufacturing method for forming a reflow lens and a reflow stopper of a bank portion including a metal film.

FIG. 18D is a diagram illustrating another example of a manufacturing method for forming a reflow lens and a reflow stopper of a bank portion including a metal film. As illustrated in FIG. 18D, the processing in FIG. 18D is different from the processing in FIG. 18C in (2) and (3). That is, the metal film 180 formed on a flat surface parallel to the light receiving surface is polished and removed by CMP. Subsequently, an interlayer film including, for example, silicon oxide is made lower than the metal of the light shielding wall by wet etching using hydrofluoric acid. Thereafter, processing similar to that in FIG. 18C is performed. As a result, the reflow lens can be formed on the light shielding wall in a self-alignment manner.

Figure 18E:
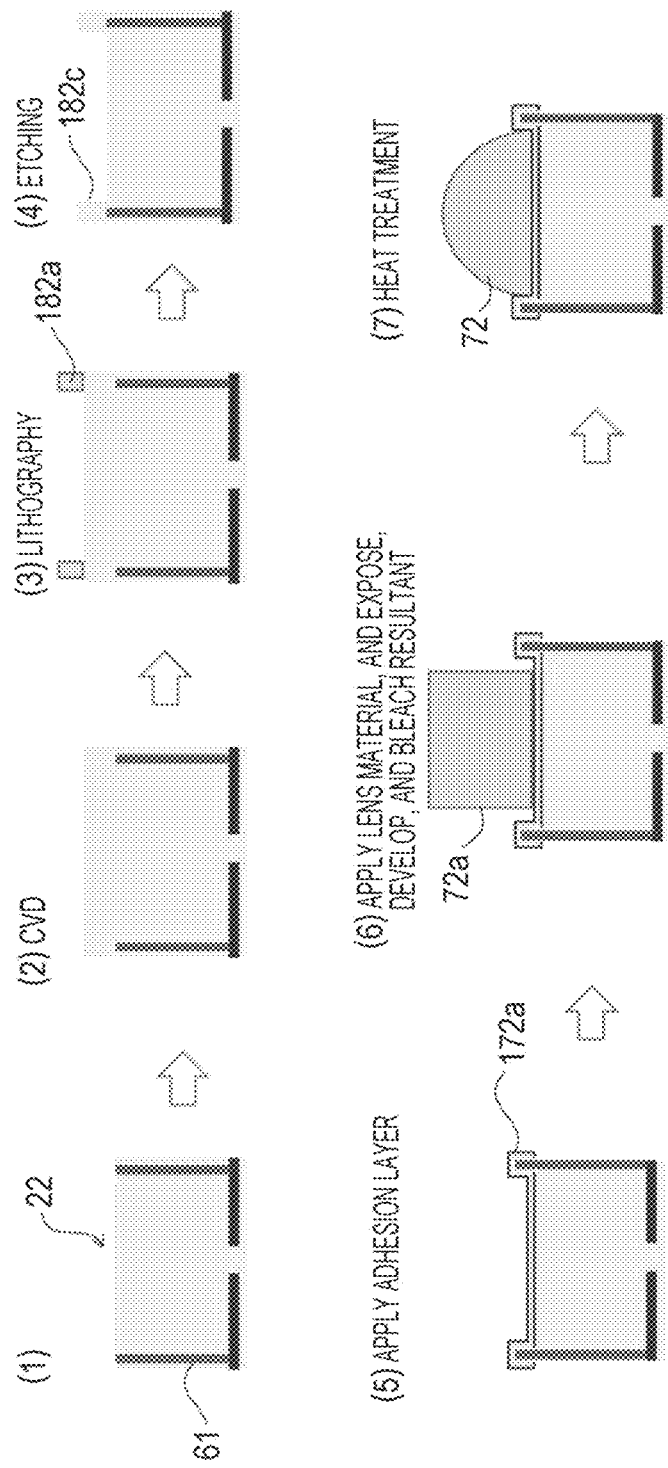
FIG. 18E is a diagram illustrating an example of a manufacturing method for forming a reflow lens and a reflow stopper of a bank portion including only a transparent material.

FIG. 18E is a diagram illustrating an example of a manufacturing method for forming a reflow lens and a reflow stopper of a bank portion including only a transparent material. As illustrated in FIG. 18E, after the flat metal film is removed during the formation of the light shielding wall 61, a transparent film, for example, silicon oxide is formed by CVD. Next, a resist mask 182a is formed by lithography. Subsequently, etching is performed using the resist mask 182a to leave the transparent film as a reflow stopper 182c only at the boundary of pixels. Thus, a bank-shaped step is formed. Thereafter, processing similar to that in FIG. 18C is performed. As a result, the bank portion 172a including only a transparent material can be formed as a reflow stopper. In a case where the adhesion between the reflow lens material and silicon oxide is poor, a transparent material having a low viscosity and high adhesion properties such as an acrylic or epoxy resin may be lightly spin-coated so as to leave a step, and then, the reflow lens may be formed.

FIG. 18F is a diagram illustrating an example of a method for forming a reflow lens and a bank portion including a carbon black resist. As illustrated in FIG. 18F, a bank portion 172b including a carbon black resist as a light shielding material is constituted by, for example, a photoresist composition including a carbon black dispersion, an acrylic monomer, an acrylic oligomer, a resin, a photopolymerization initiator, and the like. First, the bank portion 172b is formed at the boundary between pixels by photolithography. Next, a color filter 71 is formed between the bank portions 172b. Then, the lens material 72 is formed, and heat treatment is performed to form the on-chip lens 72 that is the reflow lens, as in FIG. 18C. Since the distance between the light shielding wall 61 and the bank portion 172b can be further decreased, crosstalk between pixels can be further suppressed. Note that the color filter 71 may not be formed.

In a case where the adhesion between carbon black and the silicon oxide film or between the reflow lens material and silicon oxide is poor, a transparent material having a low viscosity and high adhesion properties such as an acrylic or epoxy resin may be lightly spin-coated so as to leave a step, and then, the reflow lens may be formed.

FIG. 18G is a diagram illustrating another example of a method for forming a reflow lens and a bank portion including a carbon black resist. As illustrated in FIG. 18G, the method in FIG. 18G is different from the method in FIG. 18F in that the bank portion 172b including a carbon black resist is formed after the color filter 71 is formed. After the bank portion 172b is formed, processing similar to that in FIG. 18F is performed. Since the wall of the bank portion 172b can be made higher than that in the formation example in FIG. 18F, the reflow lens can be configured to have a good thickness.

Figure 19:
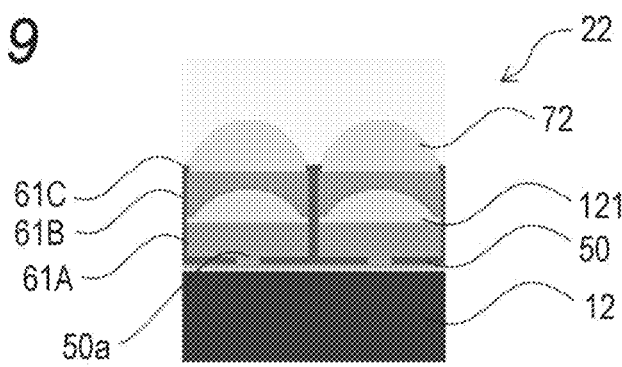
FIG. 19 is a cross-sectional view of a pixel using a reflow lens.

FIG. 19 is a schematic diagram illustrating a cross section of a pixel using the inner lens 121 and a reflow lens formed as the on-chip lens 72. FIG. 19 illustrates an example in which the pixel size is increased to 10 micrometers or more, for example. As illustrated in FIG. 19, the on-chip lens 72, the third light shielding wall 61C as a reflow stopper, and the first light shielding film portion 50 provided with a pinhole can be integrated with the method described in FIGS. 17A, 17B, 17C, 17D, 18A, 18B, 18C, 18D, 18E, 18F, and 18G. The configuration described above in which the on-chip lens 72 is formed as a reflow lens provides the following advantages that: the flatness of the lens is brought close to 1; the size and thickness of the lens are increased; the spot radius is reduced according to the Fraunhofer diffraction theory; the spot radius is further narrowed even by the double lens effect due to the presence of the inner lens; and the angular resolution capability of the first light shielding film portion 50 with respect to the pinhole can be improved. In addition, crosstalk between pixels is suppressed by the light shielding walls 61A and B. Thus, the resolution can be improved, and color mixture can be suppressed.

Figure 20:
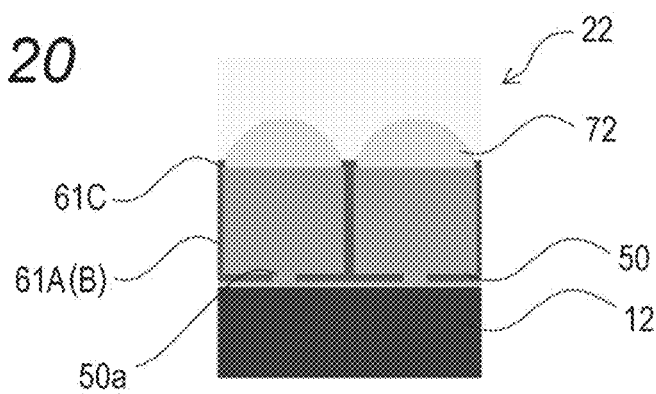
FIG. 20 is a cross-sectional view of a pixel using a reflow lens formed as an on-chip lens.

FIG. 20 is a schematic diagram illustrating a cross section of a pixel using a reflow lens formed as the on-chip lens 72 without using the inner lens 121. FIG. 20 illustrates an example in which the pixel size is increased to 10 micrometers or more, for example. The configuration described above in which the on-chip lens 72 is formed as a reflow lens provides the following advantages that: the flatness of the lens is brought close to 1; the size and thickness of the lens are increased; the spot radius is reduced according to the Fraunhofer diffraction theory; and the angular resolution capability of the first light shielding film portion 50 with respect to the pinhole can be improved. The configuration without having the inner lens 121 can reduce the number of steps, that is, cost, although the light-collecting power of the lens relatively decreases. In addition, crosstalk between pixels is suppressed by the light shielding wall 61A(B). Thus, the resolution can be improved, and color mixture can be suppressed.

Figure 21:
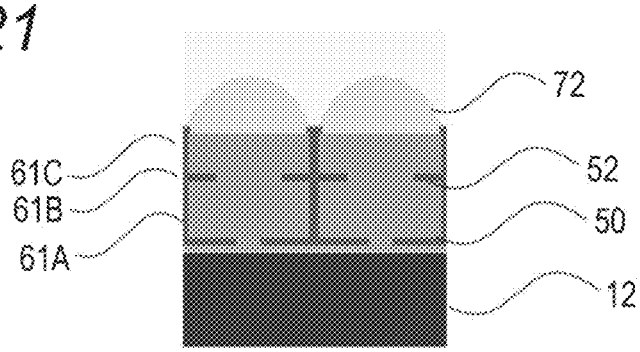
FIG. 21 is a cross-sectional view of a pixel using a second light shielding film and a reflow lens.

FIG. 21 is a schematic diagram illustrating a cross section of a pixel using a second light shielding film portion 52 and a reflow lens formed as the on-chip lens 72. FIG. 21 illustrates an example in which the pixel size is increased to 10 micrometers or more, for example. The configuration described above in which the on-chip lens 72 is formed as a reflow lens provides the following advantages that: the flatness of the lens is brought close to 1; the size of the lens can be increased; the spot radius is reduced according to the Fraunhofer diffraction theory; and the angular resolution capability of the first light shielding film portion 50 with respect to the pinhole can be improved.

In addition, since stray light is likely to be received due to an increase in size of the pixel, it may be necessary to enhance shielding of stray light incident on the pixel. In view of this, in FIG. 21, the second light shielding film portion 52 provided with an opening 52a is formed between the first light shielding wall 61A and the second light shielding wall 61B. The photoelectric conversion unit PD is irradiated with incident light through the opening 52a. The second light shielding film portion 52 can be constituted by a material having a light shielding property, for example, aluminum (Al), tungsten (W), Cu, or an alloy thereof. In addition, titanium (Ti) or titanium nitride (TiN) can also be used as underlaying metal.

The second light shielding film portion 52 can improve power to shield stray light by reducing the area of the opening 52a and the like. On the other hand, in a case where the area of the opening 52a and the like is reduced, an amount of shielded normal light increases, so that the sensitivity of the pixel decreases. It is desirable to design the opening 52a and the like in consideration of such conditions.

In addition, crosstalk between pixels is suppressed by the light shielding walls 61A and B. Thus, the resolution can be improved, and color mixture can be suppressed.

Figure 22:
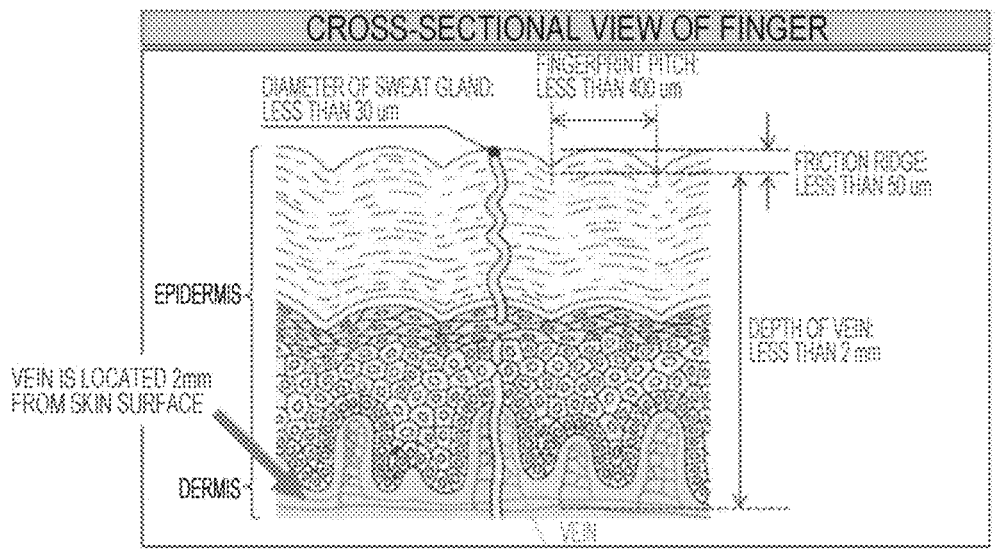
FIG. 22 is a cross-sectional view of a finger surface.
Figure 23:
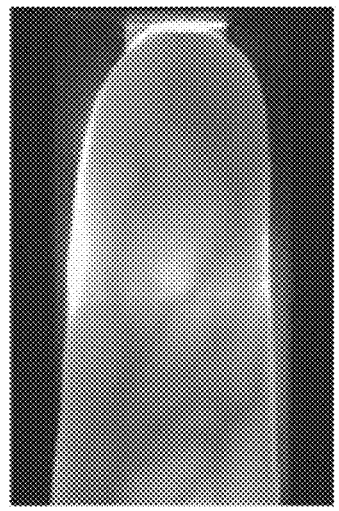
FIG. 23 is an image of the vein of the finger captured by an imaging unit.

FIG. 22 is a cross-sectional view of a finger surface. The upper side of the drawing indicates the surface of the finger. FIG. 23 is an image of the vein of the finger captured by the imaging unit 8. As illustrated in FIG. 22, the imaging unit 8 acquires fingerprint information by reading a region where the ridge of the fingerprint is present and a region where the ridge of the fingerprint is absent by each pixel.

The vein is located 2 millimeters from the skin surface. For example, when visible light in a red region to an infrared region is incident as imaging light, the light is absorbed in a region where the vein is present, and thus the light does not enter the corresponding pixel so much. As illustrated in FIG. 23, the imaging unit 8 can acquire information regarding veins by, for example, acquiring the intensity of light entering the pixel.

Next, a case where the pixel is configured using a diffraction lens will be described with reference to FIGS. 24, 25A, 25B, 26A, 26B, 27, 28A, 28B, and 28C. Using the diffraction lens as described above makes it possible to improve the measurement accuracy even in a case where the elevation angle and measurement light for a measurement target are different as in the case of imaging of a fingerprint and a vein. This will be described in more detail below.

Figure 24:
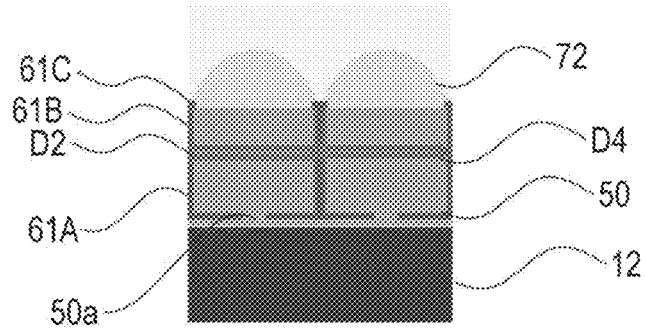
FIG. 24 is a cross-sectional view of a pixel using a diffraction lens.
Figures 25A, 25B:
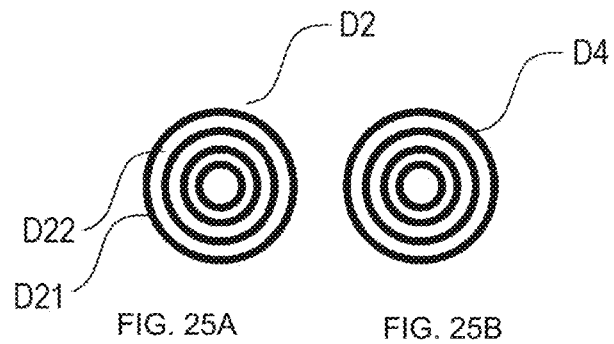
FIGS. 25A and 25B are plan views of a diffraction lens at a peripheral part.
Figures 26A, 26B:
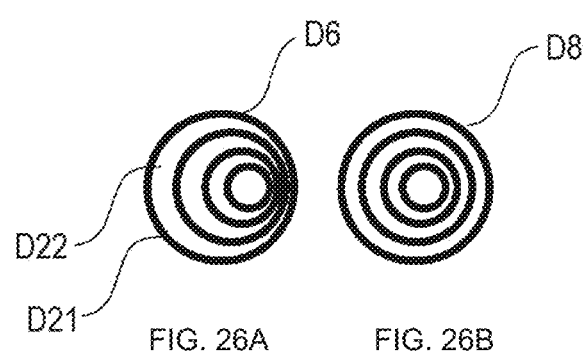
FIGS. 26A and 26B are plan views of a diffraction lens.

FIG. 24 is a schematic diagram illustrating a cross section of a pixel using diffraction lenses D2 and D4 for the inner lens (second lens). FIGS. 25A and 25B are plan views of the diffraction lenses D2 and D4. FIGS. 26A and 26B are plan views of diffraction lenses D6 and D8. For example, the diffraction lenses D2 and D6 are for imaging fingerprints, and the diffraction lenses D4 and D8 are for imaging veins.

As illustrated in FIG. 24, in the present embodiment, the diffraction lenses D2 (D6) and D4 (D8) are disposed as inner lenses. The diffraction lenses D2 and D4 can be formed to be thinner than optical lenses, whereby the reduction in thickness of the pixel can be achieved. In addition, the diffraction lenses D2 to D8 make it possible to perform different pupil corrections in accordance with the imaging target and the measurement light.

More specifically, as illustrated in FIGS. 25A, 25B, 26A, and 26B, each of the diffraction lenses D2 to D8 includes a high refractive index layer D21 having a higher refractive index and a low refractive index layer D22 having a lower refractive index, the high refractive index layer D21 and the low refractive index layer D22 being alternately arranged in the lateral direction with respect to an optical axis. The width of each of the high refractive index layer D21 and the low refractive index layer D22 is equal to or smaller than the order of the wavelength of incident light. The degree of curvature of the equiphase surface can be adjusted by adjusting the arrangement relationship regarding densities of the high refractive index layers between the center and the ends of the diffraction wren D2 to D8. As a result, a convex lens function (light-collecting properties) can be obtained, and a concave lens function (diffuseness) can be obtained. In addition, a function (oblique light correcting function) for converting obliquely incident light into normally incident light can also be obtained.

The convex lens function can be obtained by arranging the high refractive index layers so as to be bilaterally symmetrical in such a manner that they are densely arranged at the mechanical center of the diffraction lenses D2 and D4 and they are sparsely arranged with distance from the center as illustrated in FIGS. 25A and 25B. The oblique light correcting function is obtained by arranging at least one of the high refractive index layers D21 or the low refractive index layers D22 in such a manner that the widths thereof are asymmetric in the lateral direction as illustrated in FIGS. 26A and 26B. That is, pupil correction can be performed. In addition, for example, the diffraction lens D8 for veins is configured to have a wider interval between the high refractive index layer D21 and the low refractive index layer D22 than the diffraction lens D6 for fingerprints. With this configuration, the oblique light correcting function of the diffraction lens D6 is higher than that of the diffraction lens D8. As described above, by adjusting the interval between the high refractive index layer D21 and the low refractive index layer D22, it is possible to respond to the elevation angle and the measurement wavelength.

In a case where the size of the pixel for fingerprints is reduced by pupil correction, the angle of view increases and the resolution deteriorates because of the vein being located at a deep position of about 2 mm. However, due to the configuration in which different pupil corrections are performed by the diffraction lenses D2 to D8 to lower the pupil correction for the pixel for veins as described above, optimum angles of view can be achieved for the respective pixels.

In addition, the fingerprint is imaged with visible light, and the vein is imaged with light in a red region to an infrared region. Therefore, by adjusting the interval between the high refractive index layer D21 and the low refractive index layer D22, pupil correction can be adjusted in consideration of chromatic aberration. For example, at the left end of the imaging unit 8, the diffraction lens D6 illustrated in FIG. 26A is disposed for fingerprints, and the diffraction lens D8 illustrated in FIG. 26B is disposed in the adjacent pixel. In addition, the interval between the high refractive index layer D21 and the low refractive index layer D22 is varied corresponding to the wavelength of each of R, G, and B.

Here, an example in which the diffraction lenses D4 and D8 are arranged in a two-dimensional array of pixels in the imaging unit 8 will be described with reference to FIG. 27.

Figure 27:
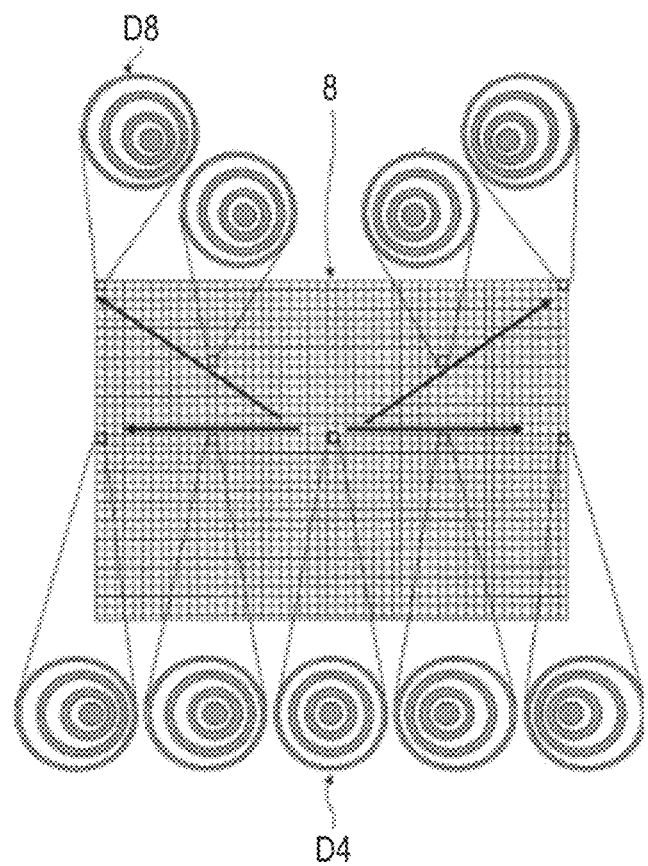
FIG. 27 is a diagram illustrating an example in which diffraction lenses are arranged in a two-dimensional array.

FIG. 27 is a diagram illustrating an arrangement example of the diffraction lenses D4 and D8 used for imaging veins. In a case where the diffraction lenses D4 and D8 are applied to the pixel array of the imaging unit 8, oblique incidence is not a problem at the center of the pixel array portion, so that the oblique light correction effect is unnecessary. On the other hand, obliquely incident light incidence becomes more problematic with nearness to the end of the pixel array portion. Therefore, a degree of change in the ratio of the low refractive index layer 20 and the high refractive index layer 21 is increased toward the end of the pixel array portion so that an incident angle conversion function increases toward the end of the pixel array portion. That is, it is preferable to have a structure in which there is no asymmetry at the center of the pixel array portion and the asymmetry increases toward the end of the pixel array portion.

In addition, the diffraction lenses D2 and D6 for fingerprints are arranged so as to be adjacent to the diffraction lenses D4 and D8 used for imaging veins, for example. Note that the number of pixels for imaging fingerprints and the number of pixels for imaging veins may be different from each other. For example, the number of pixels for imaging fingerprints and the number of pixels for imaging veins may have a ratio of 4:1 or 8:1. Note that, in the present embodiment, the diffraction lenses D2 to D8 are used for the second lens, but the configuration is not limited thereto. For example, the diffraction lenses D2 to D8 may be used for the on-chip lens 72. In this case, the second lens may be an optical lens or may not be provided.

As described above, the present embodiment includes the pixel 22 provided with the on-chip lens 72 and the first light shielding film portion 50 formed with the pinhole 50a. With this configuration, a beam is narrowed by the on-chip lens 72, and both the angular separation and the sensitivity can be achieved by the pinhole 50a.

Second Embodiment

An electronic device 1 according to the second embodiment is different from the electronic device 1 according to the first embodiment in that the shape of the pinhole of the first light shielding film portion 50 can be varied for each pixel. The differences from the electronic device 1 according to the first embodiment will be described below.

Figure 28A:
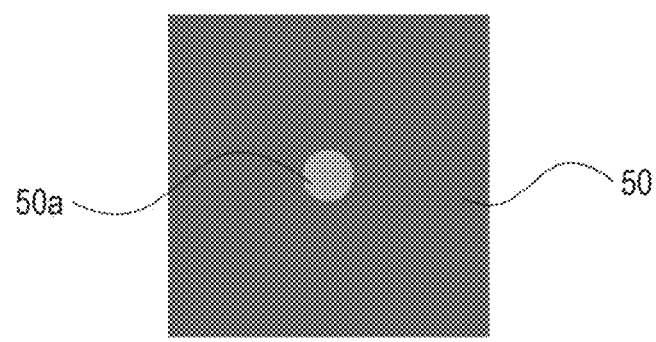
FIG. 28A is a diagram illustrating a first light shielding film portion having a circular pinhole.
Figure 28B:
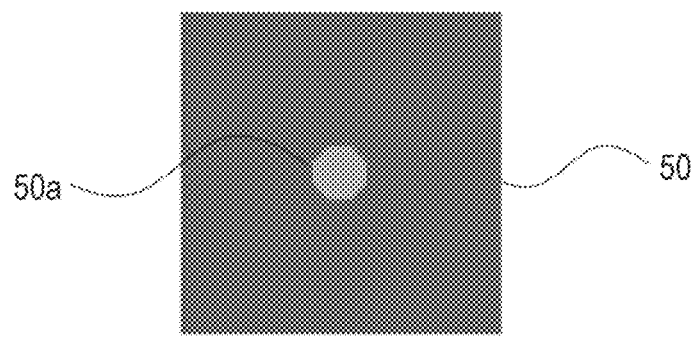
FIG. 28B is a diagram illustrating a first light shielding film portion having an octagonal pinhole.
Figure 28C:
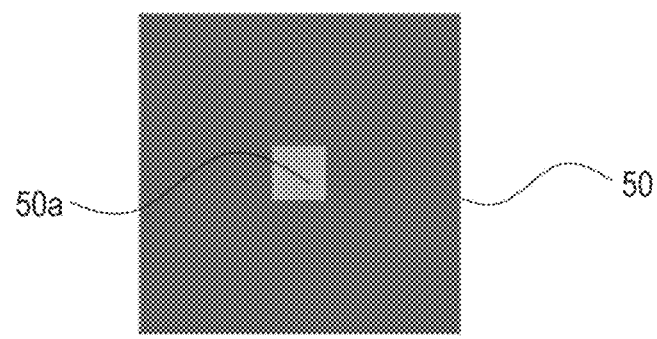
FIG. 28C is a diagram illustrating a first light shielding film portion having a rectangular pinhole.

FIGS. 28A, 28B, and 28C are plan views illustrating the shape of the pinhole 50a of the first light shielding film portion 50. FIG. 28A is a diagram illustrating a first light shielding film portion 50 having a circular pinhole 50a. FIG. 28B is a diagram illustrating the first light shielding film portion 50 having an octagonal pinhole 50a. FIG. 28C is a diagram illustrating the first light shielding film portion 50 having a rectangular pinhole 50a.

As described above, the shape of the pinhole 50a can be selected according to the characteristics of the optical system such as the on-chip lens 72 and the inner lens 121. For example, when the light intensity distribution of incident light by the optical system including the on-chip lens 72, the inner lens 121, and the like is close to a perfect circle, the circular pinhole 50a is selected. When the light intensity distribution is close to an octagonal shape, the octagonal pinhole 50a is selected. When the light intensity distribution is close to a rectangular shape, the rectangular pinhole 50a is selected. As a result, it is possible to improve the angular resolution capability and the sensitivity in accordance with the light intensity distribution.

Figure 29:
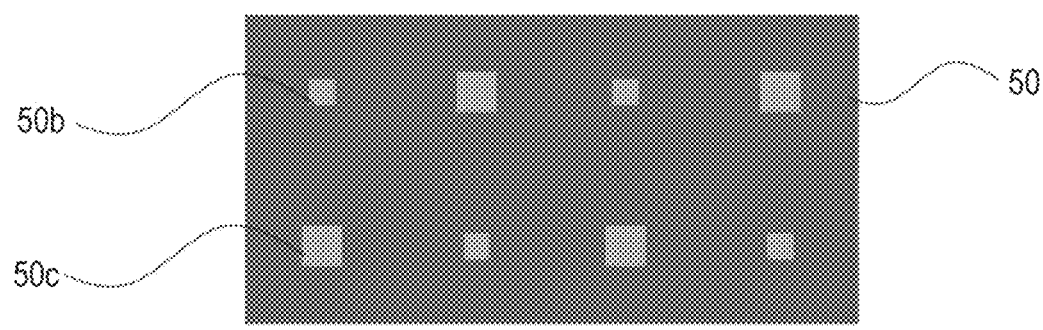
FIG. 29 is a diagram illustrating an example in which pinhole shapes vary for each pixel.

FIG. 29 is a diagram illustrating an example in which an opening area of the pinhole shape is varied for each pixel. The opening area of a pinhole 50b is smaller than the opening area of a pinhole 50c. Therefore, the angular differentiation ability of the pixel corresponding to the pinhole 50b is higher than the angular differentiation ability of the pixel corresponding to the pinhole 50c. On the other hand, the sensitivity of the pixel corresponding to the pinhole 50c is higher than the sensitivity of the pixel corresponding to the pinhole 50b. As described above, the angular resolution capability, that is, the resolution, and the sensitivity can be complementarily improved by mounting pinholes having different shapes and using information of the neighboring pixels.

Figure 30:
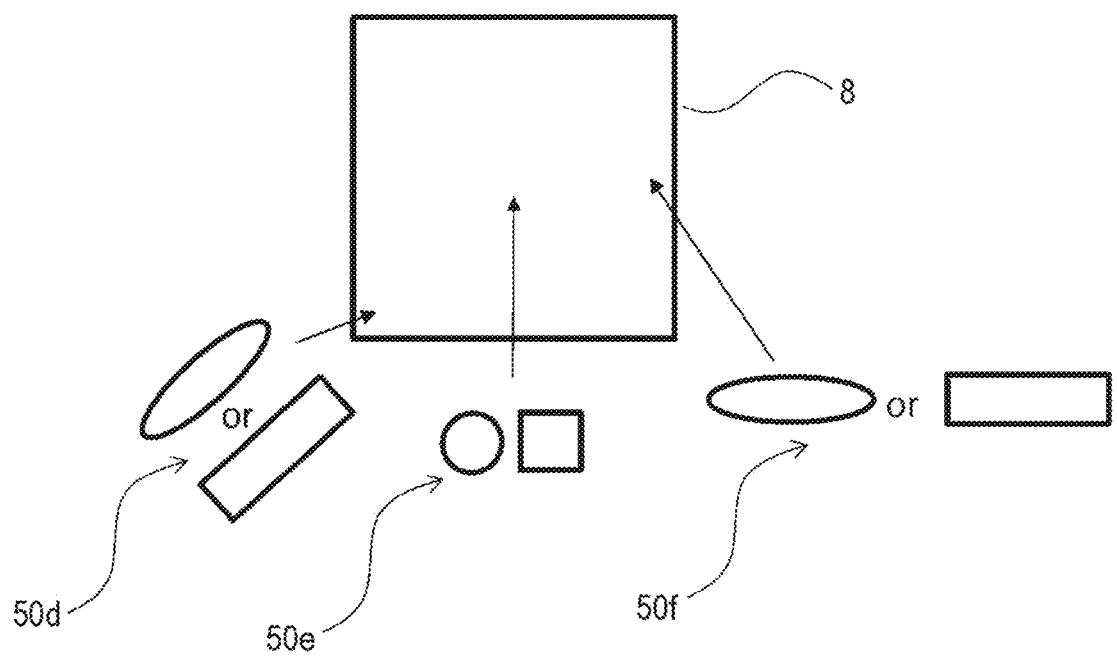
FIG. 30 is a diagram illustrating examples of the shape of pinholes arranged in a two-dimensional array of pixels in the imaging unit.

FIG. 30 is a diagram illustrating examples of the shape of pinholes arranged in a two-dimensional array of pixels in the imaging unit 8. As illustrated in FIG. 30, a pinhole having a shape of a perfect circle or a square shape is disposed at the central part of the two-dimensional array of pixels, and a pinhole having an elliptic shape or a rectangular shape is disposed at the peripheral part. Furthermore, the orientation of the elliptical or rectangular pinhole is adjusted according to the angle from the central part of the two-dimensional array of pixels. In this manner, it is possible to change the pinhole shape within the angle of view in accordance with the light intensity distribution on the two-dimensional array. Thus, the angular resolution capability, that is, the resolution, and the sensitivity of each pixel on the two-dimensional array can be improved.

Figure 31:
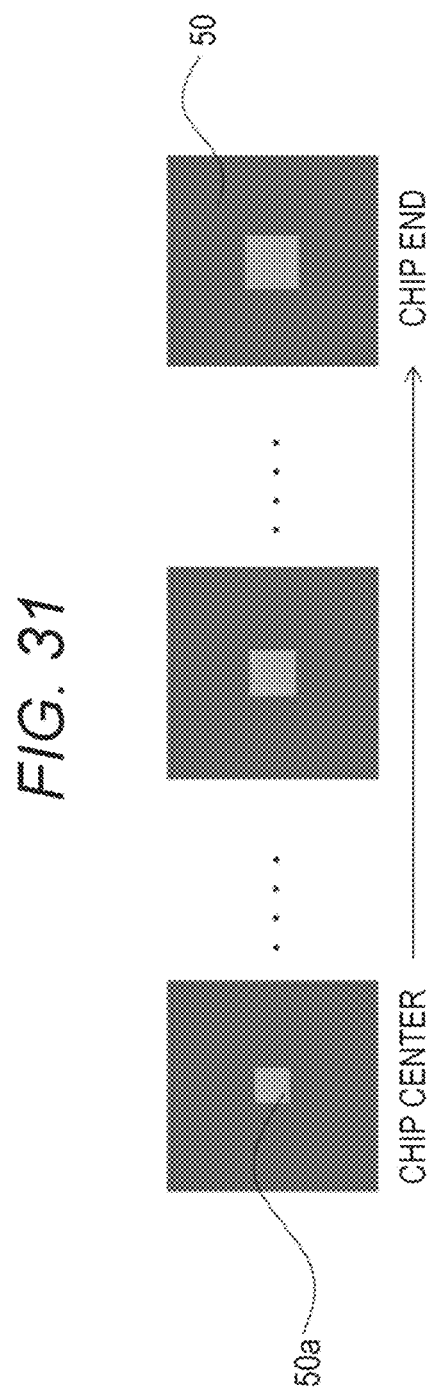
FIG. 31 is a diagram illustrating examples of the shape of pinholes arranged in a one-dimensional row of the two-dimensional array.

FIG. 31 is a diagram illustrating examples of the shape of pinholes arranged in a one-dimensional row of the two-dimensional array of pixels in the imaging unit 8. As illustrated in FIG. 31, the size of the pinhole shape is increased from the central part toward the end of the two-dimensional array of pixels, for example. In this manner, it is possible to change the size of the pinhole shape within the angle of view in each pixel in accordance with the assumed light intensity distribution on the two-dimensional array. For example, in a case where an optical lens is provided above a sensor, the sensitivity of each pixel on the two-dimensional array can be improved with respect to an increase in the spot radius depending on the angle of view caused by the inclination of a principal ray.

Figure 32:
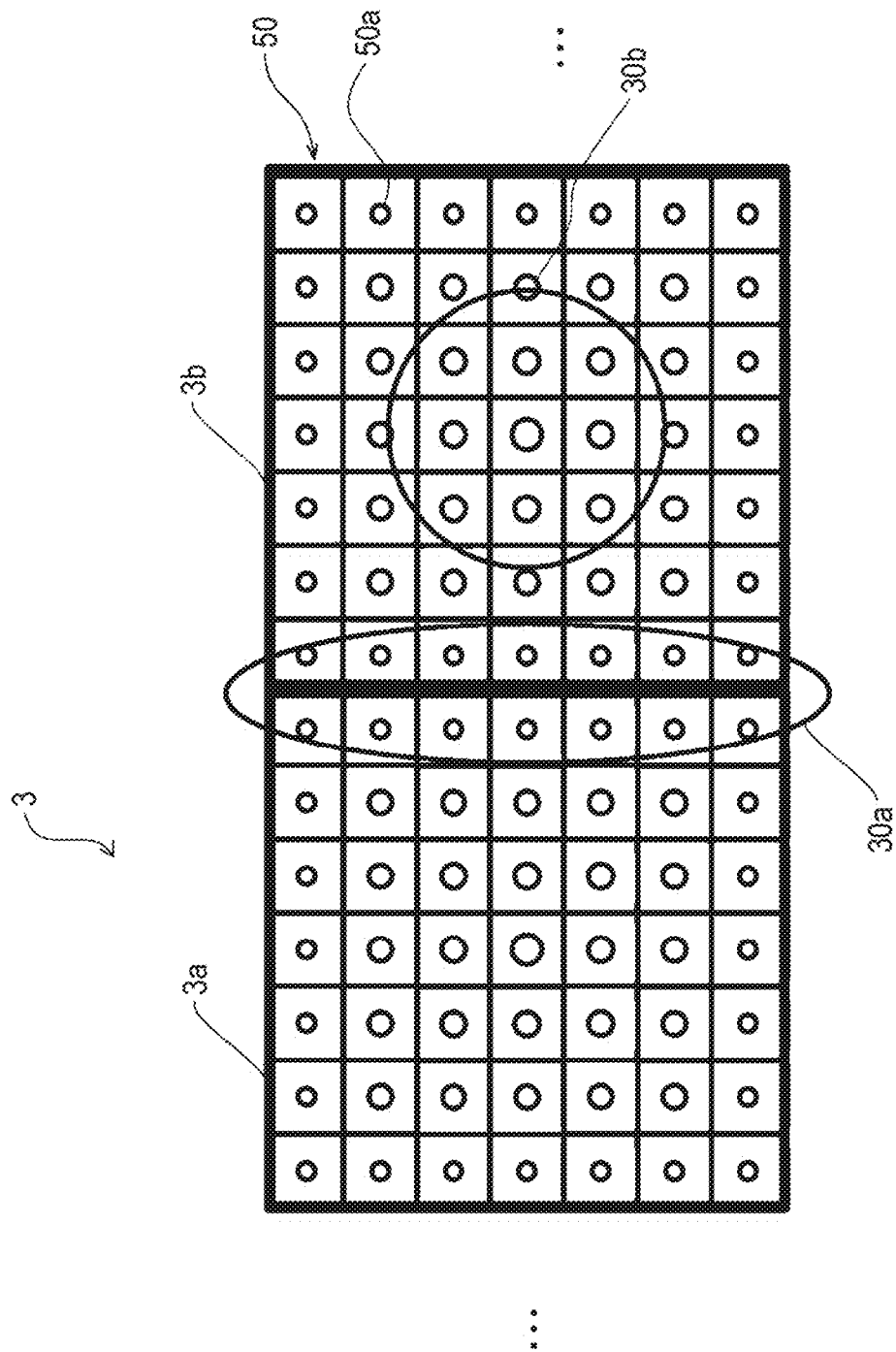
FIG. 32 is a diagram illustrating an arrangement example of pinhole shapes in a case where outputs of respective pixels are added.

FIG. 32 is a diagram illustrating an arrangement example of pinhole shapes in a case where the outputs of respective pixels are added. As illustrated in FIG. 32, each of addition pixels 3a and 3b has 7 (column)×7 (row) pixels 22 (FIGS. 3A and 3B) (49 pixels 22 in total). One side of the pixel 22 (FIGS. 3A and 3B) is 5 micrometers, for example. Each of the addition pixels 3a and 3b adds together the outputs of a total of 49 pixels 22 (FIGS. 3A and 3B). In this case, the size of the pinhole shape at an end 30a of each of the addition pixels 3a and 3b is set to be smaller than that at the central part. With this configuration, the angular resolution capability of the pixel at the end 30a is further improved, and the angular separation between the addition pixel 3a and the addition pixel 3b is further improved. On the other hand, the size of the pinhole shape at the central part 30b of each of the addition pixels 3a and 3b is set to be larger than that at the peripheral part as long as light other than light from the subject target in the addition region in which the pinhole shape belongs is not received. This further improves the sensitivity. Furthermore, since the pixel addition is performed, the crosstalk of each pixel does not become a problem. As described above, in a case where, for example, 7×7 pixels 22, each having a side of 5 micrometers, are added in order to compensate for the insufficient sensitivity of the pinhole structure, the pinholes at the outer periphery of each of the addition pixels 3a and 3b in a block are formed to have a small opening, and the pinholes at the central part of the block are formed to have a large opening. This makes it possible to simultaneously improve the sensitivity and the resolution.

Figure 33A:
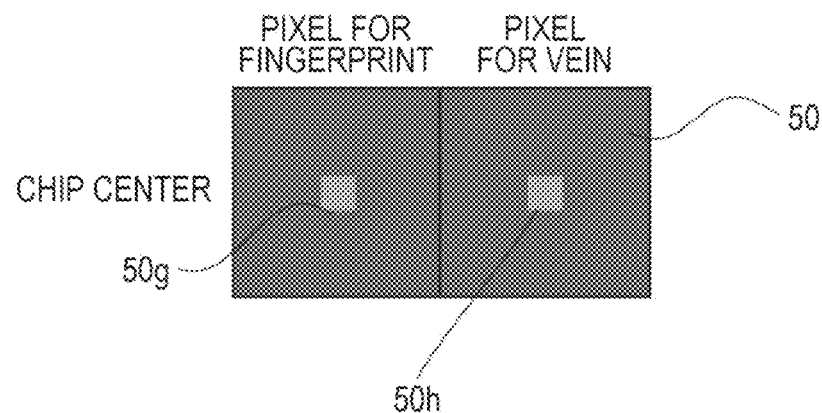
FIG. 33A is a diagram illustrating a pinhole shape in a central pixel.
Figure 33B:
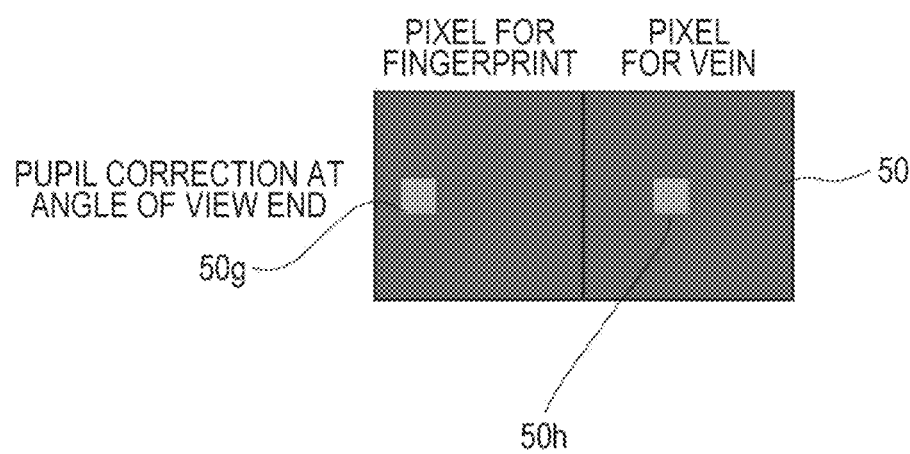
FIG. 33B is a diagram illustrating a pinhole shape in a peripheral pixel.

FIGS. 33A and 33B are diagrams illustrating arrangement examples of pinhole shapes in the imaging unit 8 capable of imaging both a fingerprint and a vein. FIG. 33A is a diagram illustrating the shape of a pinhole in a pixel for imaging fingerprints at the central part of the two-dimensional array of pixels in the imaging unit 8, and the shape of a pinhole in the adjacent pixel for imaging veins.

FIG. 33B is a diagram illustrating the shape of a pinhole in a pixel for imaging fingerprints at the peripheral part of the two-dimensional array of pixels in the imaging unit 8, and the shape of a pinhole in the adjacent pixel for imaging veins. As illustrated in FIG. 33A, normal incidence is assumed at the center of the pixel array, and thus, there is no difference in shape, and pinholes 50g and h are arranged at the central part. On the other hand, the pinholes 50g and h are shifted from the central part toward the end of the pixel array portion in accordance with the assumed size of the subject. In this case, the shifted positions are different between the pixel for fingerprints and the pixel for veins, because the elevation angle and the measurement wavelength are different between fingerprints and veins. That is, in the pixels adjacent to each other, the position of the pinhole 50g in the pixel for imaging fingerprints is further shifted from the central part than the position of the pinhole 50h in the pixel for imaging veins. Thus, it is possible to achieve an optimum size for the subject to be detected by each pixel.

Furthermore, the adjustment of pupil correction can be performed in various ways by, for example, a combination with the arrangement example of the diffraction lenses D2 to D8 described with reference to FIGS. 25A, 25B, 26A, 26B, and 27. As a result, the resolution and sensitivity of each pixel can be further improved individually.

Here, a case where the shape within the pinhole 50k of the first light shielding film portion 50 is formed using a plasmon filter will be described.

Figure 34:
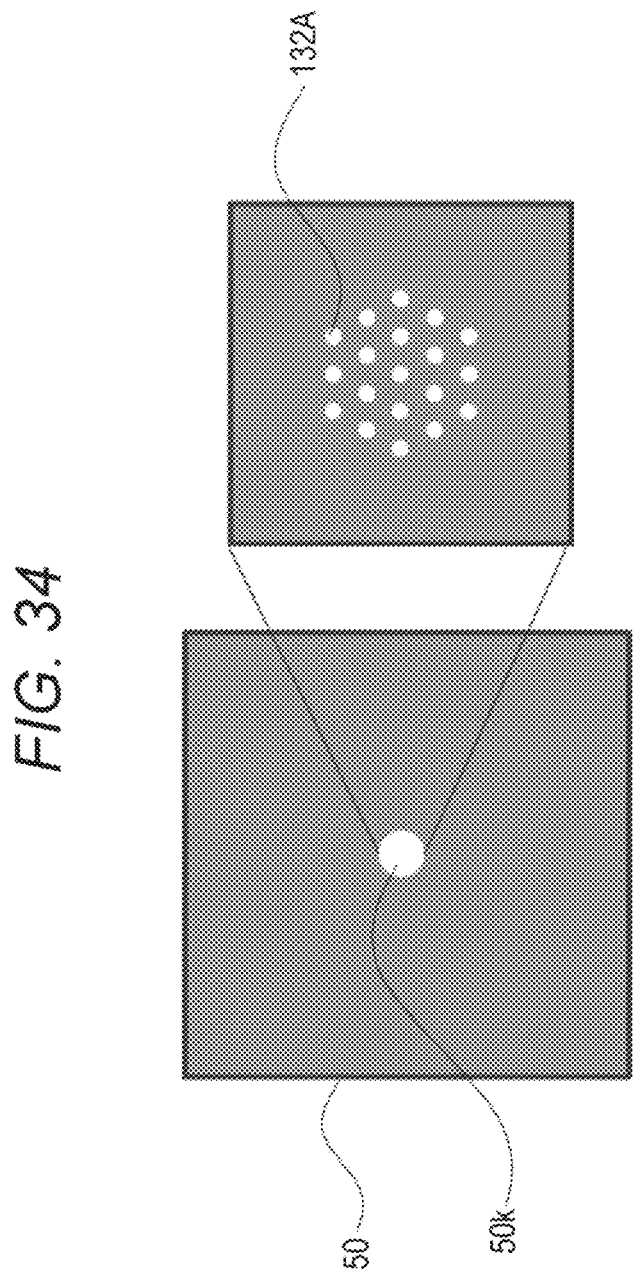
FIG. 34 is a diagram illustrating an example in which a shape inside a pinhole is formed using a plasmon filter.

FIG. 34 is a diagram illustrating an example in which the shape within the pinhole 50k of the first light shielding film portion 50 is formed using a plasmon filter. The right diagram is an enlarged view of the inside of the pinhole 50k. As illustrated in FIG. 34, the plasmon filter in the pinhole 50k includes a plurality of holes 132A.

As illustrated in FIG. 34, a narrow band filter by plasmon resonance on a metal surface is achieved by arranging fine hole holes 132A having a size equal to or less than the wavelength in the pinhole 50k. The plasmon resonance is theoretically generated when the conditions represented by Expressions (2) and (3) are satisfied where the surface plasma frequency is ωsp, the dielectric constant of a conductor thin film is εm, the dielectric constant of the interlayer film is εd, and the hole pitch is a0.

[Expression 2]

$$\text{Re}\left[\frac{\omega_{sp}}{c}\sqrt{\frac{\varepsilon_m\varepsilon_d}{\varepsilon_m+\varepsilon_d}}\right]=\left|\frac{2\pi}{\lambda}\sin\theta+iG_x+jG_y\right| \quad (2)$$

$$|G_x|=|G_y|=2\pi/a_0 \quad (3)$$

Figure 35:
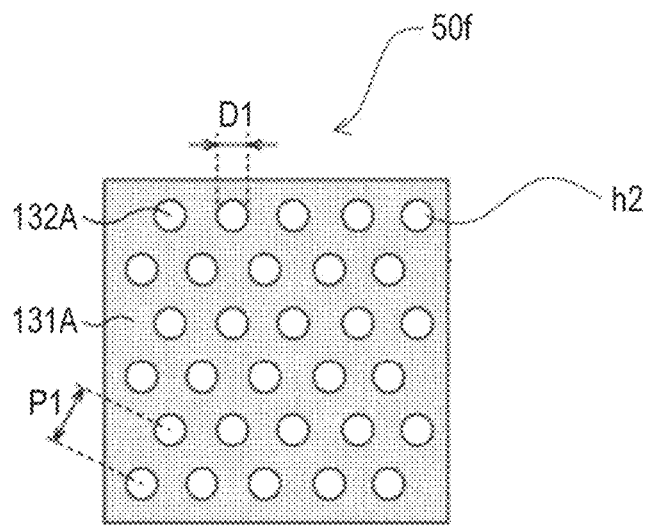
FIG. 35 is a diagram illustrating a configuration example of the plasmon filter in the pinhole.

FIG. 35 is a diagram illustrating a configuration example of the plasmon filter in the pinhole 50k. The plasmon filter is constituted by a plasmon resonator in which holes 132A are periodically arranged in a metal thin film (hereinafter, referred to as a conductor thin film) 131A in a honeycomb shape having a high filling rate, for example. Each hole 132A penetrates the conductor thin film 131A and acts as a waveguide. Commonly, a waveguide has a cutoff frequency and a cutoff wavelength determined by a shape such as a side length and a diameter, and has a property of not propagating light having a frequency equal to or lower than the cutoff frequency (wavelength equal to or higher than the cutoff wavelength). The cutoff wavelength of the hole 132A mainly depends on an opening diameter D1, and the cutoff wavelength becomes shorter as the opening diameter D1 is smaller. Note that the opening diameter D1 is set to a value smaller than the wavelength of light to be transmitted.

On the other hand, when light is incident on the conductor thin film 131A in which the holes 132A are periodically formed at a pitch equal to or less than the wavelength of light, a phenomenon occurs in which light having a wavelength longer than the cutoff wavelength of the holes 132A is transmitted. This phenomenon is referred to as an abnormal transmission phenomenon of plasmon. This phenomenon occurs when surface plasmon is excited at the boundary between the conductor thin film 131A and the interlayer film 102 on the conductor thin film.

Figure 36:
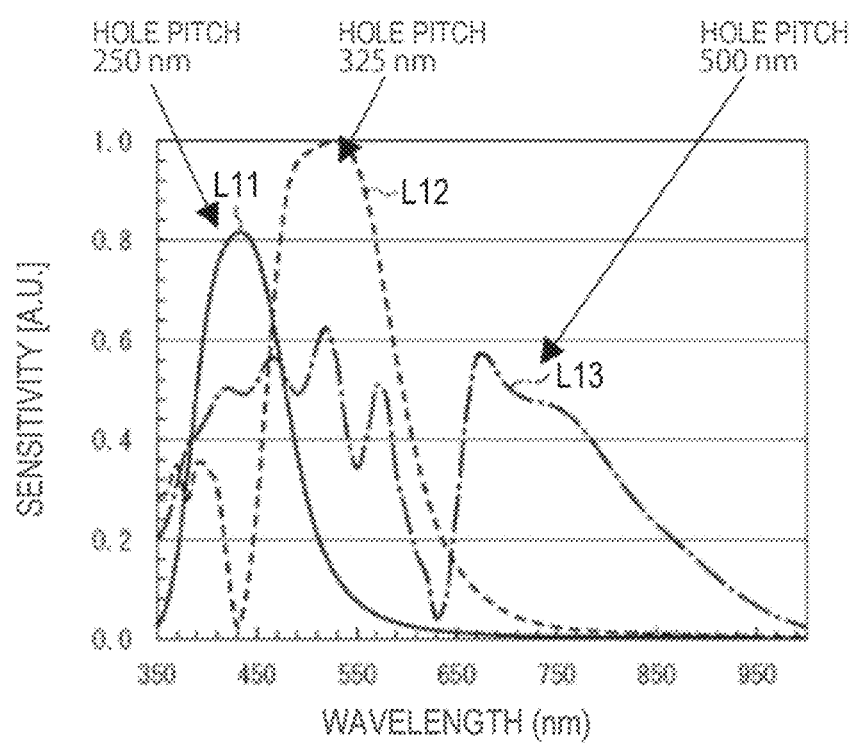
FIG. 36 is a graph illustrating an example of spectral characteristics of the plasmon filter.

FIG. 36 is a graph illustrating an example of spectral characteristics of the plasmon filter in the pinhole 50k in a case where the hole pitch P1 is changed using aluminum as the conductor thin film. The horizontal axis of the graph represents wavelength (nm), and the vertical axis represents sensitivity (arbitrary unit). A line L11 indicates spectral characteristics in a case where the hole pitch P1 is set to 250 nm, a line L12 indicates spectral characteristics when the hole pitch P1 is set to 325 nm, and a line L13 indicates spectral characteristics when the hole pitch P1 is set to 500 nm.

In a case where the hole pitch P1 is set to 250 nm, the plasmon filter mainly transmits light in a blue wavelength band. In a case where the hole pitch P1 is set to 325 nm, the plasmon filter mainly transmits light in a green wavelength band. In a case where the hole pitch P1 is set to 500 nm, the plasmon filter mainly transmits light in a red wavelength band. It is to be noted, however, that, in a case where the hole pitch P1 is set to 500 nm, the plasmon filter also transmits a large amount of light in a band having a wavelength lower than that of red due to a waveguide mode to be described later. By providing the plasmon filter in the pinhole 50f in this manner, wavelength separation is also possible. In addition, since the plasmon filter is provided in the region where light is collected, the area of the plasmon filter can be downsized. Due to the decrease in size, it is possible to obtain an effect of reducing a defect rate for defects occurring with a certain probability during the wafer process.

Figure 37:
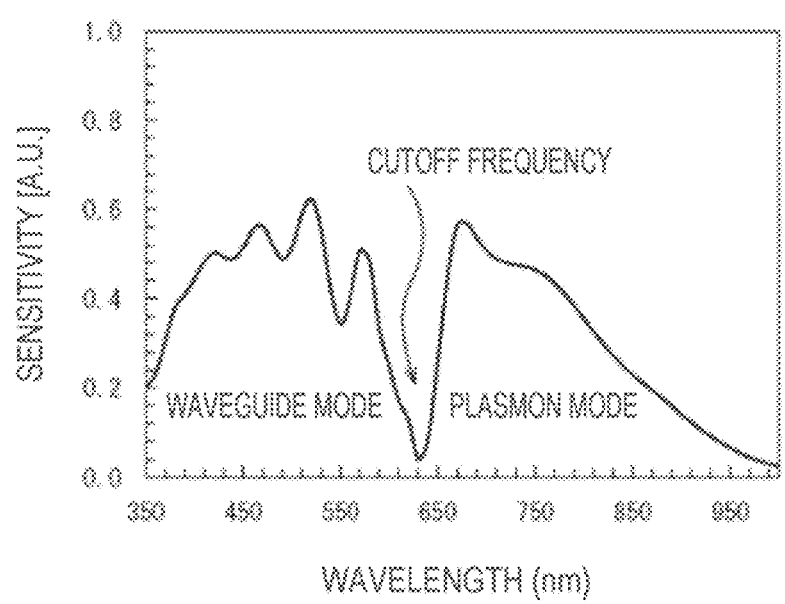
FIG. 37 is a diagram illustrating spectral characteristics of the plasmon filter in a case where a hole pitch is set to 500 nm.

FIG. 37 is a diagram illustrating spectral characteristics of the plasmon filter in a case where the hole pitch P1 is set to 500 nm, similar to the spectral characteristics indicated by the line L13 in FIG. 36. In this example, the wavelength component in the plasmon mode appears on the longer wavelength side with respect to the cutoff wavelength around 630 nm, and the wavelength component in the waveguide mode appears on the shorter wavelength side with respect to the cutoff wavelength. The cutoff wavelength mainly depends on the opening diameter D1 of the hole 132A, and the cutoff wavelength becomes shorter as the opening diameter D1 is smaller. Then, as the difference between the cutoff wavelength and the peak wavelength in the plasmon mode is increased, the wavelength resolution characteristics of the plasmon filter are improved.

In addition, as the plasma frequency ωp of the conductor thin film 131A increases, the surface plasma frequency ωsp of the conductor thin film 131A increases. In addition, the surface plasma frequency ωsp increases as the dielectric constant εd of the interlayer film 102 decreases. Then, as the surface plasma frequency ωsp increases, the resonance frequency of the plasmon can be set higher, and the transmission band (resonance wavelength of the plasmon) of the plasmon filter can be set to a shorter wavelength band.

Therefore, when metal having a smaller plasma frequency ωp is used for the conductor thin film 131A, the transmission band of the plasmon filter can be set to a shorter wavelength band. For example, aluminum, silver, gold, and the like are suitable. However, in a case where the transmission band is set to a long wavelength band such as infrared light, copper or the like can also be used.

In addition, when a dielectric having a smaller dielectric constant εd is used for the interlayer film 102, the transmission band of the plasmon filter can be set to a shorter wavelength band. For example, SiO2, Low-K, and the like are preferable.

As described above, the present embodiment makes it possible to vary the shape of the pinhole 50a of the first light shielding film portion 50 for each pixel. This makes it possible to improve the angular resolution capability and the sensitivity of each pixel. Furthermore, in a case where the shape within the pinhole 50k the first light shielding film portion 50 is formed using a plasmon filter, wavelength resolution can be generated in the pinhole 50k.

Third Embodiment

An electronic device 1 according to the third embodiment is different from the electronic device 1 according to the second embodiment in having a function of determining whether an object to be imaged is a human finger or an artificial object by processing a signal obtained by a configuration in which the shape of the pinhole 50k is formed using a plasmon filter. The differences from the second embodiment will be described below.

Figure 38:
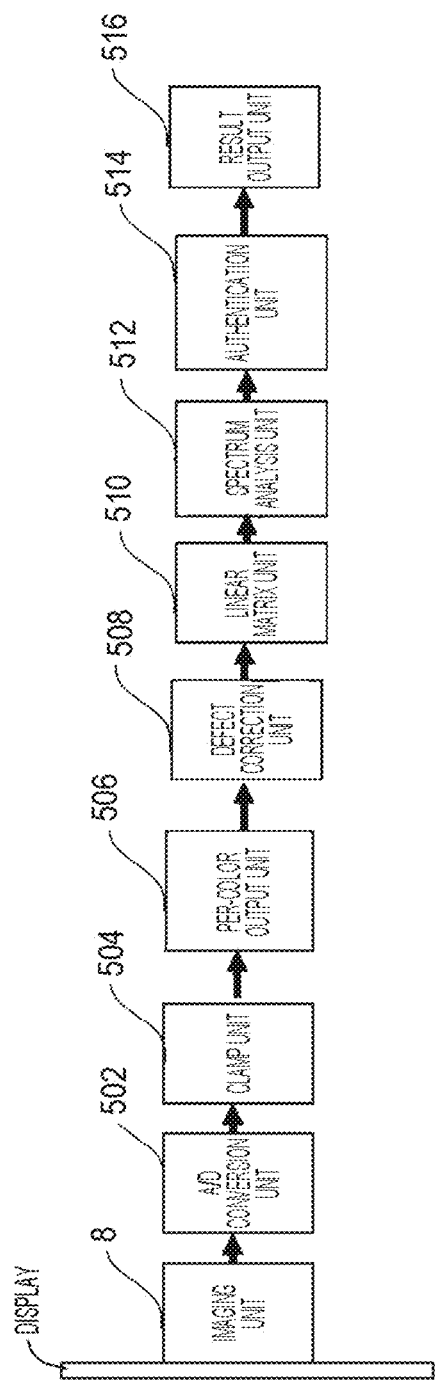
FIG. 38 is a block diagram schematically illustrating a part of an electronic device.

FIG. 38 is a block diagram schematically illustrating a part of the electronic device 1 according to the present embodiment. The electronic device 1 includes an imaging unit 8 (FIGS. 1A and 1B), an A/D conversion unit 502, a clamp unit 504, a per-color output unit 506, a defect correction unit 508, a linear matrix unit 510, a spectrum analysis unit 512, an authentication unit 514, and a result output unit 516. In the imaging unit 8 (FIGS. 1A and 1B), a part of the pixel is configured such that the shape of the pinhole 50k of the first light shielding film portion 50 is formed using a plasmon filter. As illustrated in FIG. 36, the plasmon filter has a hole pitch of, for example, 500 nm so as to have sensitivity having a peak around 760 nm.

The A/D conversion unit 502 (analog to digital converter) converts an analog signal output from the imaging unit 8 into a digital signal for each pixel.

The clamp unit 504 executes, for example, processing related to a ground level in the image. For example, the clamp unit 504 defines a black level, subtracts the defined black level from image data output from the A/D conversion unit 502, and outputs the image data. The clamp unit 504 may set the ground level for each photoelectric conversion element included in the pixel, and in this case, ground correction of a signal value may be performed for each photoelectric conversion element from which the signal value is acquired.

In a case where the imaging unit 8 acquires an analog signal for each color, the per-color output unit 506 outputs the image data output from the clamp unit 504 for each color, for example. In the imaging unit 8, for example, R (red), G (green), and B (blue) filters are provided in the pixel. The clamp unit 504 adjusts the ground level on the basis of these filters, and the per-color output unit 506 outputs the signal output from the clamp unit 504 for each color.

Since the analog signal acquired by the imaging unit 8 does not include color data, the per-color output unit 506 may, for example, store data of the hole pitch of the filter and the plasmon filter provided for each pixel in the imaging unit 8, and perform output for each color on the basis of this data. Although the imaging unit 8 includes the color filter, the configuration is not limited thereto, and for example, a color may be identified by an organic photoelectric conversion film.

The defect correction unit 508 corrects a defect in the image data. The defect of the image data occurs due to, for example, a pixel defect or information loss caused by a defect of a photoelectric conversion element provided in the pixel, or due to information omission caused by saturation of light in the optical system 9, or the like. The defect correction unit 508 may perform defect correction processing by performing interpolation processing on the basis of information of surrounding pixels or intensity of light received by surrounding photoelectric conversion elements in the pixel, for example.

Figure 39:
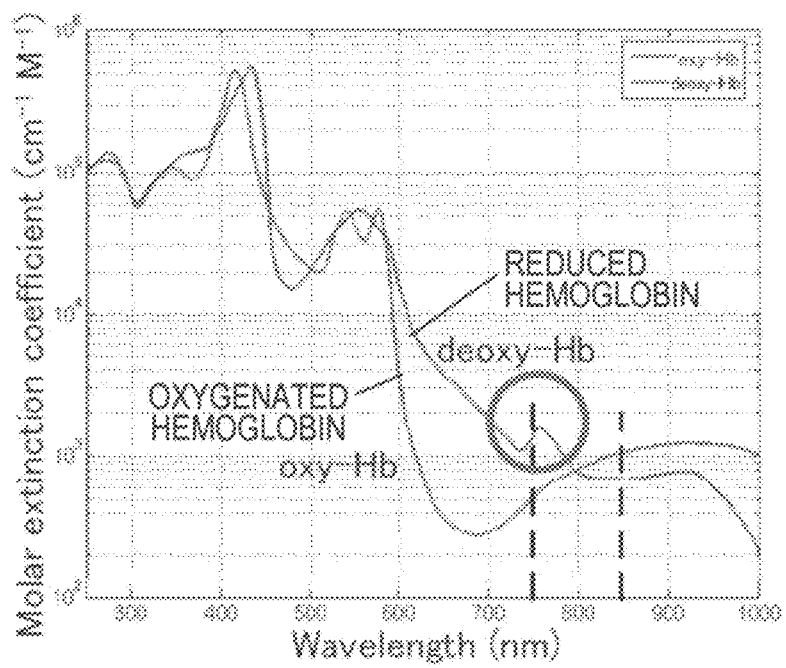
FIG. 39 is a diagram illustrating molar extinction coefficients of reduced hemoglobin and oxygenated hemoglobin.

FIG. 39 is a diagram illustrating molar extinction coefficients of reduced hemoglobin and oxygenated hemoglobin in an intravenous blood stream. The vertical axis represents a molar extinction coefficient, and the horizontal axis represents a wavelength. Veins contain a large amount of reduced hemoglobin that has lost oxygen. This reduced hemoglobin has a characteristic absorption spectrum in the vicinity of 760 nanometers as indicated in a circular frame.

Referring again to FIG. 38, the linear matrix unit 510 carries out correct color reproduction by performing matrix operation on color information such as RGB. The linear matrix unit 510 is also referred to as a color matrix unit. For example, the linear matrix unit 510 acquires desired spectroscopy by performing calculation relating to a plurality of wavelengths. In the present embodiment, the linear matrix unit 510 performs, for example, calculation so as to make an output suitable for detecting the skin color. The linear matrix unit 510 may include a calculation path of a different system from the skin color, and may, for example, perform calculation so as to make an output suitable for detection of yellow to red in order to acquire information regarding the vein. In particular, in the present embodiment, the linear matrix unit 510 may perform calculation so as to make an output suitable for the wavelength around 760 nanometers.

The spectrum analysis unit 512 determines, for example, whether or not there is a rise in skin color spectrum on the basis of the data output from the linear matrix unit 510, and in a case where there is a skin color, detects the wavelength of the skin color. Skin color varies from individual to individual, but generally has a rise in a wavelength region of 550 nm to 600 nm in many cases. For this reason, the spectrum analysis unit 512 detects whether or not a human finger is in contact with the cover glass 7, and in that case, detects the wavelength thereof, by detecting the rise of the signal in a range including 500 to 650 nm as described later, and outputs the result, for example. The determination range is not limited to the above range, and may be wider or narrower than the above range in an appropriate range.

In particular, in the present embodiment, whether or not there is a peak around 760 nanometers of reduced hemoglobin is analyzed.

The authentication unit 514 executes personal authentication on the basis of the data output from the spectrum analysis unit 512. The authentication unit 514 executes personal authentication on the basis of, for example, a wavelength at which the rise is detected by the spectrum analysis unit 512 and a fingerprint shape (feature point) based on data output from the defect correction unit 508 and the like. In particular, in the present embodiment, the object to be imaged is determined to be an artificial object in a case where there is no peak around 760 nanometers of the reduced hemoglobin. Further, the authentication unit 514 may analyze the rhythm of the peak around 760 nanometers of the reduced hemoglobin, and determines that the object to be imaged is an artificial object in a case where the rhythm is not observed. As described above, the authentication unit 514 can enhance the biometric authentication accuracy by capturing the signal of hemoglobin, that is, the rhythm of heart rate from the blood flow.

Personal information may be stored in the authentication unit 514 as a wavelength range and a fingerprint feature point, or may be stored in a storage unit (not illustrated), for example. In a case where an object comes into contact with the cover glass 7, the authentication unit 514 can determine that the object is a finger and can authenticate that the object is a stored individual.

In a case where the spectrum analysis unit 512 detects the rise of the wavelength related to the vein, the authentication unit 514 may further confirm that the object in contact with the cover glass 7 is a living body using this data. Furthermore, the authentication unit 514 may acquire the shape of the vein by an output from the defect correction unit 508 or the like, and use this information. As another example, the authentication unit 514 may execute authentication using vein information without using a fingerprint.

The result output unit 516 outputs the personal authentication result on the basis of the result output from the authentication unit 514. For example, suppose that the result matches the individual recorded by the authentication unit 514. In that case, the result output unit 516 outputs a signal indicating that the authentication is successful when the finger touching the cover glass 7 at that timing matches the recorded personal data, and in other cases, outputs a signal indicating that the authentication fails.

As described above, according to the present embodiment, a part of the pixels in the imaging unit 8 is constituted by a plasmon filter having a peak of sensitivity characteristics around 760 nanometers. It is possible to determine the presence or absence of a peak of the reduced hemoglobin around 760 nanometers with higher accuracy by performing vein authentication including the output of the pixel constituted by the plasmon filter that has sensitivity characteristics with a peak around 760 nanometers. As a result, in a case where there is no peak of the reduced hemoglobin around 760 nanometers, the authentication unit 514 can determine that the object to be imaged is an artificial object.

Modification of Third Embodiment

The electronic device according to the third embodiment determines whether an object to be imaged is a human finger or an artificial object by processing a signal obtained by a configuration in which the shape of the pinhole 50 is formed using a plasmon filter. An electronic device according to a modification of the third embodiment similarly processes outputs of pixels including a color filter 71 using an organic material including a pigment, a dye, or the like, for example, pixels provided with a color filter of red (R), green (G), blue (B), cyan (C), magenta (M), yellow (Y), green (G), or the like, to thereby determine whether an object to be imaged is a human finger or an artificial object. Alternatively, color filters of the same color and different film thicknesses may be provided, and a difference in a wavelength region with low transmittance may be extracted according to the Lambert-Beer law. Alternatively, the spectrum difference may be extracted by changing the content of the pigment or the dye in the color filers of the same color.

Fourth Embodiment

An electronic device according to the fourth embodiment is different from the electronic device 1 according to the third embodiment in further having a function of measuring an oxygen saturation concentration by processing a signal obtained by a configuration in which the shape of the pinhole 50 is achieved by a filter having sensitivity characteristics with peaks around 660 nanometers and around 940 nanometers, for example, a plasmon filter. The differences from the third embodiment will be described below.

In the imaging unit 8 (FIGS. 1A and 1B), a part of the pixel is configured such that the shape of the pinhole 50 of the first light shielding film portion 50 is formed using a plasmon filter. The plasmon filter includes a plasmon filter having sensitivity characteristics with a peak around 660 nanometers and a plasmon filter having sensitivity characteristics with a peak around 940 nanometers.

Figure 40:
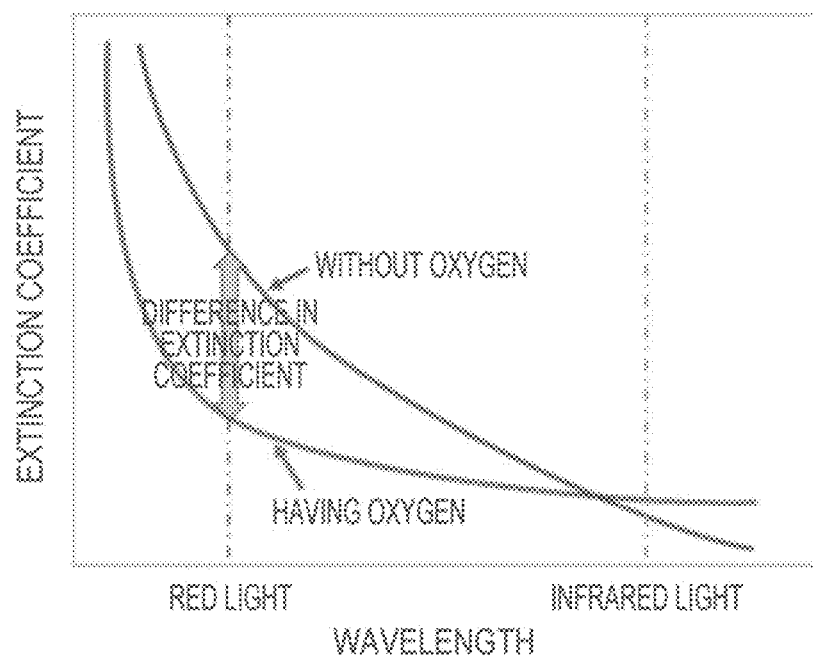
FIG. 40 is a diagram illustrating molar extinction coefficients of reduced hemoglobin and oxygenated hemoglobin in a range including a predetermined wavelength.

FIG. 40 is a diagram illustrating molar extinction coefficients of reduced hemoglobin and oxygenated hemoglobin in a range including a region from 660 nanometers to 940 nanometers. The vertical axis represents a molar extinction coefficient, and the horizontal axis represents a wavelength. An alternate long and short dash line indicated as red light corresponds to 660 nanometers, and an alternate long and short dash line indicated as infrared light corresponds to 940 nanometers. A line indicated by no oxygen represents reduced hemoglobin, and a line indicated by having oxygen represents oxygenated hemoglobin.

The spectrum analysis unit 512 according to the present embodiment calculates an absorption coefficient spectrum for each wavelength of oxygenated hemoglobin and reduced hemoglobin. The authentication unit 514 (saturated oxygen concentration measuring unit) calculates the oxygen saturation concentration by a signal ratio of the difference value in absorption coefficient spectra between the oxygenated hemoglobin and the reduced hemoglobin at 660 nanometers and the difference value in absorption coefficient spectra between the oxygenated hemoglobin and the reduced hemoglobin at 940 nanometers. More specifically, the authentication unit 514 stores in advance a tape indicating the relationship between the oxygen saturation concentration corresponding to the signal ratio of the spectrum difference value between the oxygenated hemoglobin and the reduced hemoglobin at 660 nanometers and the spectrum difference between the oxygenated hemoglobin and the reduced hemoglobin at 940 nanometers. As a result, the authentication unit 514 acquires the oxygen saturation concentration corresponding to the calculated signal ratio from the table. In addition, the authentication unit 514 determines that the object to be measured is an artificial object in a case where the calculated signal ratio does not fall within a predetermined range.

As described above, according to the present embodiment, a part of the pixels in the imaging unit 8 is constituted by a plasmon filter having sensitivity characteristics with peaks around 660 nanometers and around 940 nanometers. With this configuration, the authentication unit 514 can acquire, with higher accuracy, the oxygen saturation concentration by a signal ratio of the spectral difference value between the oxygenated hemoglobin and the reduced hemoglobin at 660 nanometers and the spectral difference value between the oxygenated hemoglobin and the reduced hemoglobin at 940 nanometers. In addition, the authentication unit 514 can determine that the object to be measured is an artificial object in a case where the calculated signal ratio does not fall within the predetermined range.

Modification of Fourth Embodiment

The electronic device 1 according to the fourth embodiment determines the oxygen saturation concentration by processing a signal obtained by the configuration in which the shape of the pinhole 50 is formed using a plasmon filter. An electronic device 1 according to a modification of the fourth embodiment similarly processes outputs of pixels including a color filter 71 using an organic material including a pigment, a dye, or the like, to thereby acquire the oxygen saturation concentration. Alternatively, color filters of the same color and different film thicknesses may be provided, and a difference in a wavelength region with low transmittance may be extracted according to the Lambert-Beer law.

Fifth Embodiment

An electronic device according to the fifth embodiment is different from the fourth embodiment in further having a function of measuring a skin color by processing a signal obtained by a configuration in which the shape of the pinhole 50 is formed using a plasmon filter having sensitivity characteristics with a peak around 550 to 600 nanometers. The differences from the electronic device 1 according to the third embodiment will be described below.

In the imaging unit 8 (FIGS. 1A and 1B), a part of the pixel is configured such that the shape of the pinhole 50 of the first light shielding film portion 50 is formed using a plasmon filter. The plasmon filter may include a plurality of filters having different spectra, and at least one of the plasmon filters is constituted by a plasmon filter having sensitivity characteristics with a peak around 550 to 600 nanometers.

Figure 41:
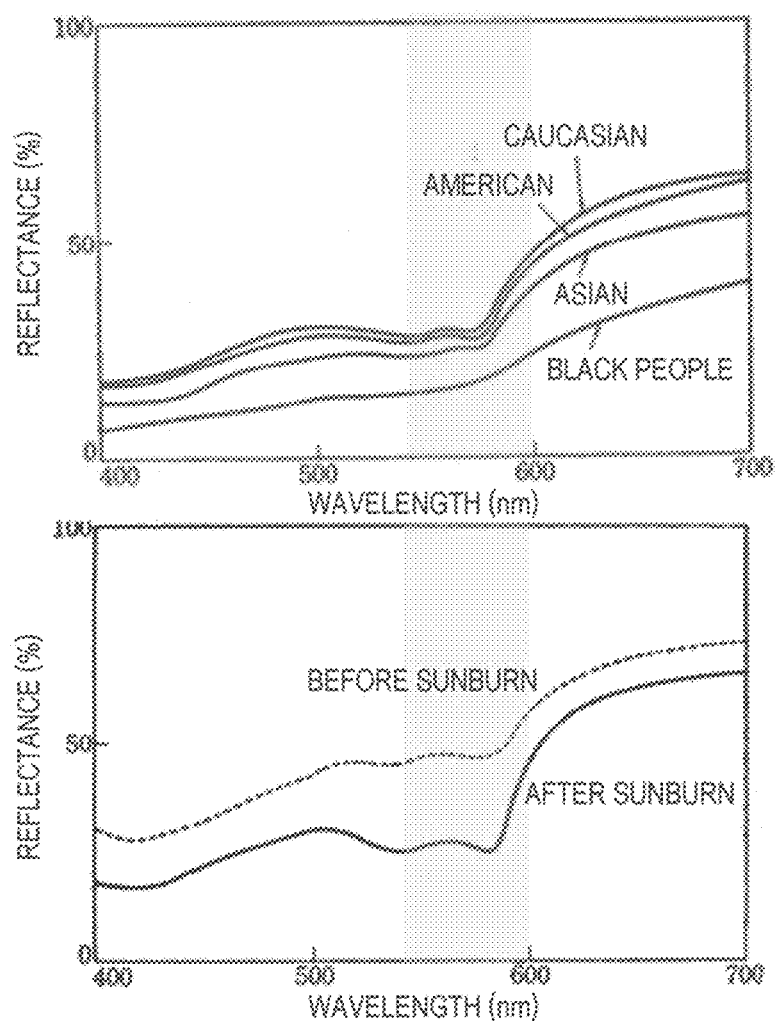
FIG. 41 is a diagram illustrating reflectance of a skin surface.

FIG. 41 is a diagram illustrating reflectance of a skin surface. The vertical axis represents reflectance, and the horizontal axis represents a wavelength. As illustrated in FIG. 41, there is a rise in the wavelength region of 500 to 600 nanometers. Skin color varies from individual to individual, but generally has a rise in a wavelength region of 550 to 600 nanometers as described above.

The spectrum analysis unit 512 according to the present embodiment detects whether or not a human finger is in contact with the cover glass 7, and in that case, detects the wavelength thereof, by detecting a rise of the signal in a range including 500 to 650 nm by signal processing of a plurality of outputs having different spectra, and outputs the result, for example.

The authentication unit 514 according to the present embodiment determines, on the basis of the data output from the spectrum analysis unit 512, that the object to be imaged is a person in a case where there is a rise in the wavelength region of 500 to 600 nanometers, and that the object to be imaged is an artificial object when there is no rise in the wavelength region.

Figure 42:
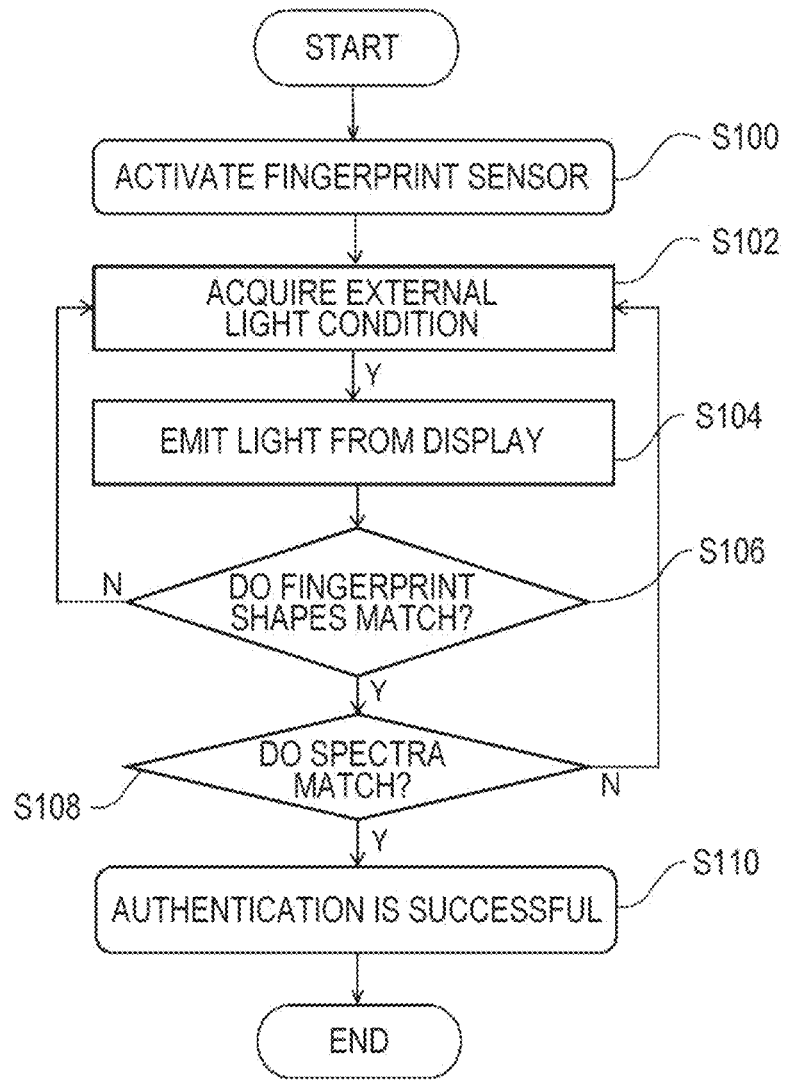
FIG. 42 is a flowchart illustrating a flow of processing performed by the electronic device.

FIG. 42 is a flowchart illustrating an example of a flow of processing performed by the electronic device 1 according to the present embodiment. As an example, a case where the electronic device 1 performs personal authentication using fingerprint will be described. The same applies to a case where recognition is executed for a vein or the like.

First, the electronic device 1 activates the imaging unit 8 as a fingerprint sensor (S100). Due to the start-up, the components described above may be energized to be in a standby state, for example. The electronic device 1 may explicitly activate the fingerprint sensor by a switch or the like. As another example, contact of an object on a reading surface (cover glass) 7 may be optically or mechanically acquired, and the fingerprint sensor may be activated using the acquisition as a trigger. As yet another example, the fingerprint sensor may be triggered by detecting the approach of a finger to the reading surface (cover glass) 7 by a distance shorter than a predetermined distance.

Next, the imaging unit 8 detects the intensity of light incident at that timing, and acquires the condition of external light on the basis of the result (S102). For example, the electronic device 1 acquires an image in a state where light from the inside is not incident. With this acquisition, the intensity of sunlight, the intensity of light transmitted through the finger from an indoor light source, or the intensity of stray light entering through the gap between the fingers is detected. On the basis of the intensity of light, the clamp unit 504 may execute ground processing in a later process.

Next, the light emitting unit provided in the electronic device 1 emits light to irradiate at least a part of the region where the finger and the cover glass 7 are in contact with each other (S104). White light may be emitted, or light having a specific wavelength, for example, light of R, G, B, or the like, may be emitted. For example, B (and G) light may be emitted in order to acquire the surface shape, because the light on the long wavelength side is transmitted through the finger. In addition, infrared light may also be emitted to observe the veins. R light may be emitted for spectral analysis. In this manner, light of an appropriate color may be emitted on the basis of the subsequent processes. These kinds of light do not need to be emitted at the same timing. For example, R light may be emitted first to acquire data for spectral analysis, and then B light and G light may be emitted to acquire, for example, data for shape analysis.

Next, the imaging unit 8 receives light emitted from the light emitting unit, reflected by the cover glass 7, and including information regarding fingerprints, and the like (S106). The light is received by the imaging unit 8 described above, and then, necessary processes are executed. For example, following the light reception, processing of acquiring the shape of the fingerprint and acquiring the spectrum of the reflected light or the transmitted light is executed through A/D conversion and background correction.

Next, the authentication unit 514 determines whether or not the fingerprint shapes match (S108). The fingerprint shape may be determined by a common method. For example, the authentication unit 514 extracts a predetermined number of feature points from the fingerprint, compares the extracted feature points, and determines whether or not the object is a stored individual.

When the fingerprint shapes do not match (S108: NO), the processes from S102 are repeated.

When the fingerprint shapes match (S108: YES), the authentication unit 514 subsequently determines whether or not the spectra match (S110). The authentication unit 514 determines whether or not the spectra match by comparing the result of the spectrum analyzed by the spectrum analysis unit 512 with the stored result of the individual. For example, the determination is performed on the basis of whether or not the acquired spectrum is present within an allowable range from the stored spectrum of the rising of the skin color. In this way, the personal authentication may be performed or whether or not the object is a living body may be determined, using not only the fingerprint shape but also the spectrum. In addition, the state of the vein may be acquired in order to determine whether or not the object is a living body. In this case, infrared light is emitted from the light emitting unit, and a spectrum indicating the state of the vein is acquired and analyzed. In the case of determining whether or not the object is a living body, whether or not the spectrum indicating the vein has been acquired may be determined without acquiring the shape of the vein. Alternatively, the shape of the vein may also be acquired, and the comparison may be performed regarding the state of the vein for performing personal authentication.

When the spectra do not match (S110: NO), the processes from S102 are repeated.

When the spectrum is located (S110: YES), the authentication unit 514 determines that the authentication is successful (S112), and outputs the authentication result from the result output unit 516. In this case, the result output unit 516 outputs information indicating that the authentication is successful, and permits access to another configuration of the electronic device 1, for example. Note that, in the above description, the result output unit 516 makes an output in a case where the authentication is successful, but the configuration is not limited thereto. Even in a case where the determination in S108 described above is NO and the determination in S110 described above is NO, the information indicating that the authentication has failed may be provided to the light emitting unit, the imaging unit 8, or the like using the result output unit 516, and the data may be acquired again.

Note that, in the above description, the above processing is repeated in a case where the authentication fails. On the other hand, in a case where, for example, the processing is repeated a predetermined number of times, an access to the electronic device 1 may be blocked without performing the authentication any more. In this case, the user may be prompted to use another access means, such as an input of a passcode using a numeric keypad, from an interface. Furthermore, in such a case, a possibility of a failure of the device in reading is considered, and thus the authentication process may be repeated while changing the light emission, the light reception, the state of the reading surface, the spectrum being used, and the like. For example, in a case where an analysis result indicating that the device is wet with water is obtained, some output may be provided to the user via the interface to promote the user to wipe the water and perform the authentication operation again.

As described above, according to the present embodiment, a part of the pixels in the imaging unit 8 is constituted by a plasmon filter having sensitivity characteristics with a peak around 550 to 600 nanometers. As a result, the spectrum analysis unit 512 can detect the rise of a signal in a range including 500 to 650 nanometers with higher accuracy, for example. In addition, the authentication unit 514 can determine that the object to be measured is an artificial object in a case where there is no rise of the signal within the range including 500 to 650 nanometers.

Modification of Fifth Embodiment

The electronic device 1 according to the fifth embodiment determines the rise of a signal within a wavelength range including 500 to 650 nanometers by processing a signal obtained by the configuration in which the shape of the pinhole 50 is formed using a plasmon filter. An electronic device 1 according to a modification of the fifth embodiment similarly processes outputs of pixels including a color filter 71 using an organic material including a pigment, a dye, or the like, for example, pixels provided with a color filter of red (R), green (G), blue (B), cyan (C), magenta (M), yellow (Y), green (G), or the like, to thereby determine a rise of a signal within a range including 500 to 650 nanometers. Alternatively, color filters of the same color and different film thicknesses may be provided, and a difference in a wavelength region with low transmittance may be extracted according to the Lambert-Beer law. Alternatively, the spectrum difference may be extracted by changing the content of the pigment or the dye in the color filers of the same color.

Sixth Embodiment

An electronic device according to the sixth embodiment is different from the fifth embodiment in that pupil correction can be performed by shifting the center position of the on-chip lens 72 and the center position of the inner lens 121 with respect to the pinhole 50a. The differences from the electronic device according to the fifth embodiment will be described below.

First, a configuration example of a pixel in which the center position of the on-chip lens 72 and the position of the pinhole 50a are shifted will be described with reference to FIGS. 43A and 43B.

Figure 43A:
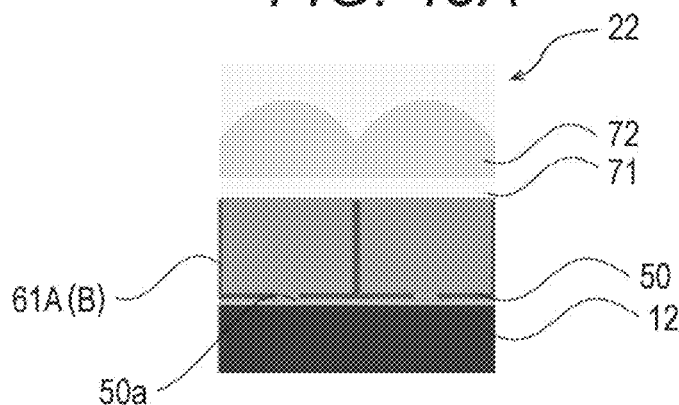
FIG. 43A is a cross-sectional view of a pixel in a central part of a pixel array.

FIG. 43A is a schematic diagram illustrating a cross section of a pixel at the central part of the pixel array of the imaging unit 8 (FIGS. 1A and 1B). This pixel is an example of a pixel in which the on-chip lens 72 is formed on the color filter 71 without using the inner lens 121. This pixel is located at the central part, and thus, the center position of the on-chip lens 72 and the position of the pinhole 50a coincide with each other. In this case, crosstalk between pixels is also suppressed by the light shielding walls 61A(B). Thus, the resolution can be improved, and color mixture can be suppressed.

Figure 43B:
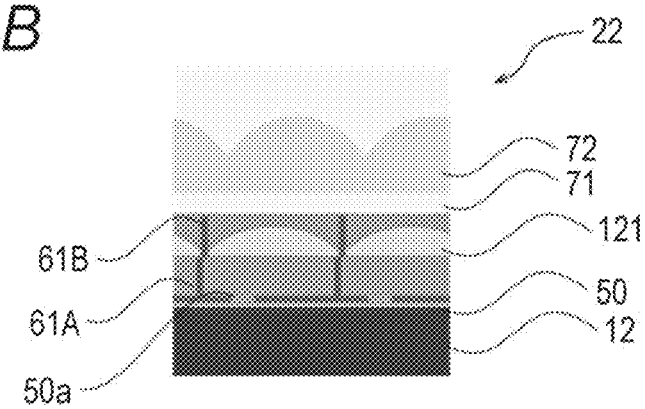
FIG. 43B is a diagram illustrating an example in which the pixels are arranged to be shifted toward the center side of the pixel array.

FIG. 43B is a diagram illustrating an example in which the on-chip lens 72, the color filter 71, and the inner lens 121 are arranged to be shifted toward the peripheral side of the pixel array. In the peripheral part (outer peripheral part) of the pixel array of the imaging unit 8 (FIGS. 1A and 16), pupil correction is possible by arranging the on-chip lens 72, the color filter 71, and the inner lens 121 to be shifted in correspondence with the assumed angle with respect to subjects with different image heights and height positions of the subjects. These components are designed such that the light intensity distribution is concentrated in the pinhole 50a of the first light shielding film portion 50, and the pinhole 50a is desirably disposed at the center of the photoelectric conversion element PD, but may be shifted.

Along with the shift of the color filter 71 and the on-chip lens 72, the positions of the first light shielding wall 61A and the second light shielding wall 61B also shift to the peripheral side toward the outer periphery of the pixel array. Thus, the light shielding walls 61A and B can suppress crosstalk between pixels, improve resolution, and suppress color mixture. As described above, shielding of a stray light component can be increased by providing the light shielding walls 61A and B in at least two or more stages. Note that the pixel structure illustrated in FIG. 43B is an example in which the light shielding wall 61 includes two stages of the first light shielding wall 61A and the second light shielding wall 61B. However, the pixel structure can include light shielding walls in any number of stages. The layer in which the light shielding wall 61 is formed may sometimes be referred to as a light shielding wall layer.

Figure 43C:
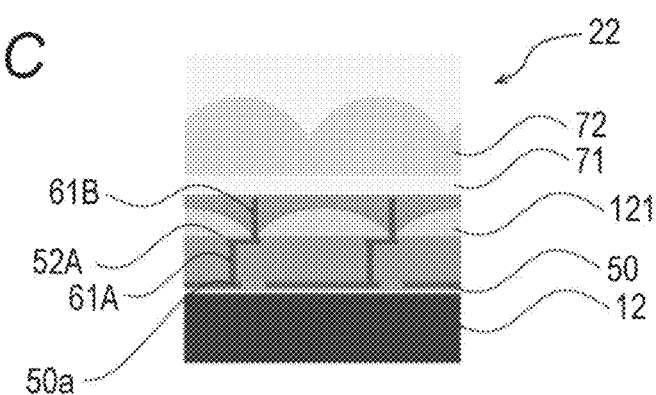
FIG. 43C is a diagram illustrating an example in which the pixels are arranged to be further shifted from the center side of the pixel array.

FIG. 43C is a diagram illustrating an example in which the on-chip lens 72, the color filter 71, and the inner lens 121 are arranged to be further shifted from the center side of the pixel array than the example in FIG. 43B. A second light shielding film portion 52A is provided in a gap generated between the first light shielding wall 61A and the second light shielding wall B. With this configuration, stray light leaking from between the first light shielding wall 61A and the second light shielding wall B can be suppressed. Thus, the resolution can be improved, and color mixture can be suppressed. In this case, crosstalk between pixels is also suppressed by the light shielding walls 61A and B. Thus, the resolution can be improved, and color mixture can be suppressed. In this manner, a degree of freedom of pupil correction can be improved while maintaining light shielding properties.

Next, a configuration example of a pixel in which the center position of the on-chip lens 72 and the position of the pinhole 50*a* are shifted will be described with reference to FIGS. 44A, 44B, and 44C.

Figure 44A:
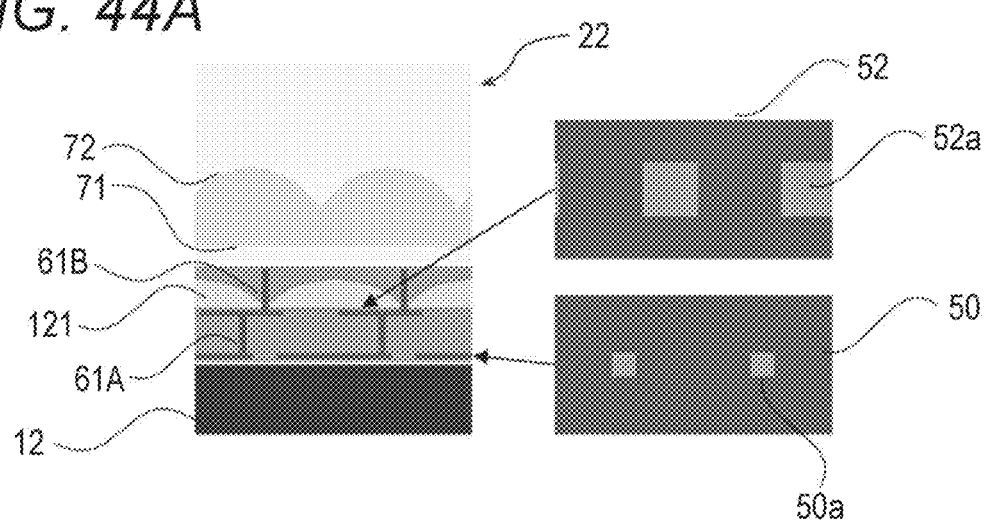
FIG. 44A is a diagram illustrating an example in which a second light shielding film portion is provided below an inner lens.

FIG. 44A is a diagram illustrating an example in which the second light shielding film portion 52 is provided below the inner lens 121. An opening 52*a* is provided in the second light shielding film portion 52, whereby the second light shielding film portion 52 also has a diaphragm effect. In this case, the opening 52*a* of the second light shielding film portion 52 and the pinhole 50*a* of the first light shielding film portion 50 are arranged corresponding to the assumed angle with respect to subjects with different image heights. In addition, the area of the opening 52*a* is larger than the area of the pinhole 50*a*. As described above, the second light shielding film portion 52 shields stray light from other pixels, and has a diaphragm effect for the subject pixel. This improves the resolution of the pixel.

Figure 44B:
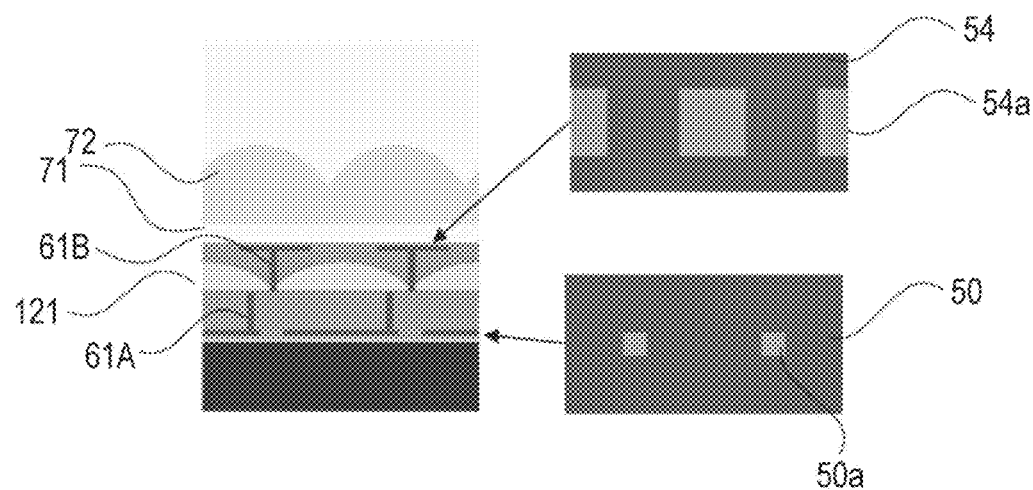
FIG. 44B is a diagram illustrating an example in which a third light shielding film portion is provided below a color filter.

FIG. 44B is a diagram illustrating an example in which a third light shielding film portion 54 is provided below the color filter 71. An opening 54*a* is provided in the third light shielding film portion 54, whereby the third light shielding film portion 54 also has a diaphragm effect. In this case, the opening 54*a* of the third light shielding film portion 54 and the pinhole 50*a* of the first light shielding film portion 50 are arranged corresponding to the assumed angle with respect to subjects with different image heights. In addition, the area of the opening 54*a* is larger than the area of the pinhole 50*a*.

The third light shielding film portion 54 can be constituted by a material having light shielding properties, for example, aluminum (Al), tungsten (W), Cu, or an alloy thereof. In addition, titanium (Ti) or titanium nitride (TiN) can also be used as underlaying metal. As described above, the third light shielding film portion 54 shields stray light from other pixels, and has a diaphragm effect for the subject pixel. This further improves the resolution of the pixel.

Figure 44C:
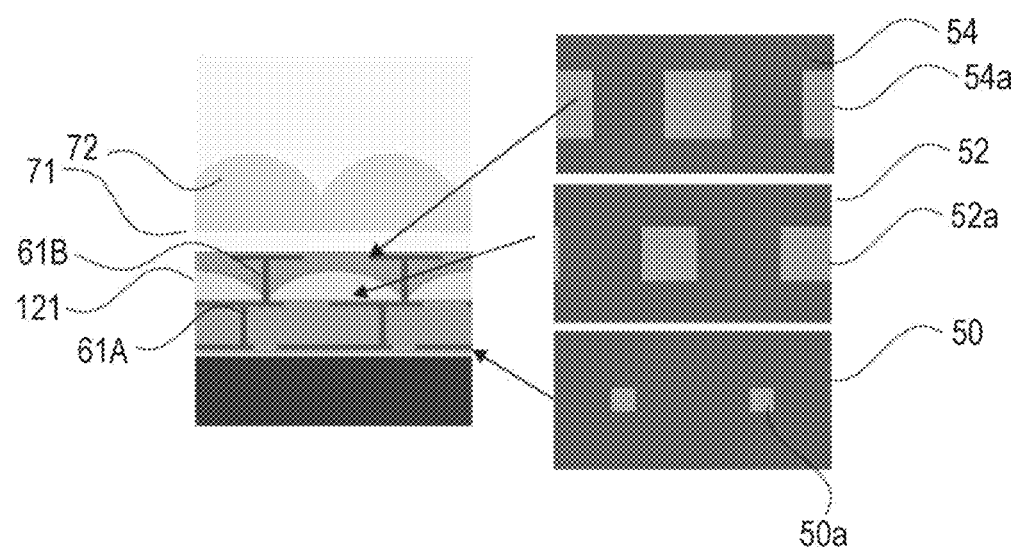
FIG. 44C is a diagram illustrating an example provided with the second light shielding film and the third light shielding film.

FIG. 44C is a diagram illustrating an example in which the second light shielding film portion 52 is provided below the inner lens 121 and the third light shielding film portion 54 is provided below the color filter 71. In this case, the opening 54*a* of the third light shielding film portion 54, the opening 52*a* of the second light shielding film portion 52, and the pinhole 50*a* of the first light shielding film portion 50 are arranged corresponding to subjects with different image heights. The third light shielding film portion 54 and the second light shielding film portion 52 shield stray light from other pixels, and has a diaphragm effect for the subject pixel. As described above, stray light can be shielded by a three-stage diaphragm, whereby the resolution of the pixel can be further improved.

Figure 45:
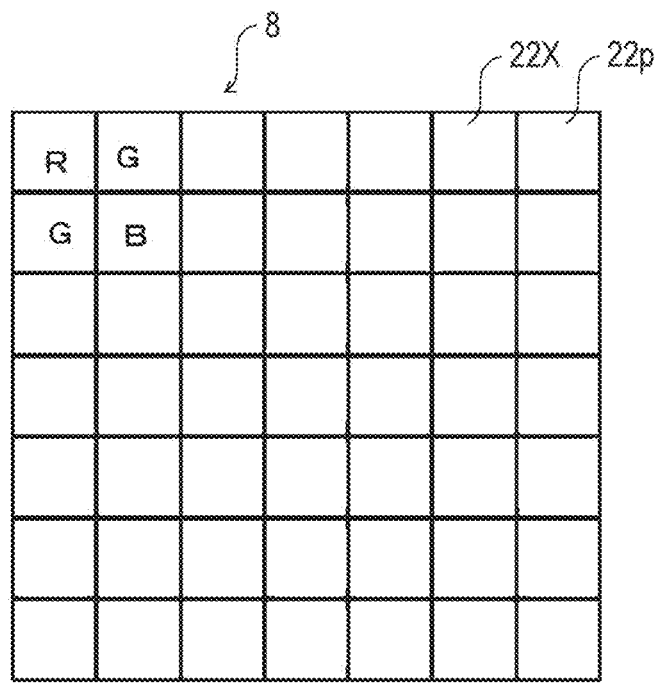
FIG. 45 is a diagram illustrating an arrangement example of color filters.

Next, an arrangement example of the color filters 71 in the pixel array of the imaging unit 8 (FIGS. 1A and 1B) will be described. FIG. 45 is a diagram illustrating an arrangement example of the color filters 71 of red (R), green (G), and blue (B). As illustrated in FIG. 45, color filters 71 of red (R), green (G), and blue (B) are arranged in four adjacent pixels in, for example, the Bayer arrangement. Although only four pixels are denoted by reference signs in the drawing, color filters 71 of red (R), green (G), and blue (B) are similarly arranged in other pixels. Note that, although the present embodiment has described an example in which the Bayer arrangement is used, the configuration is not limited thereto. Furthermore, pixels using a plasmon filter may be mixed in the arrangement of the red (R), green (G), and blue (B) color filters 71.

Figure 46:
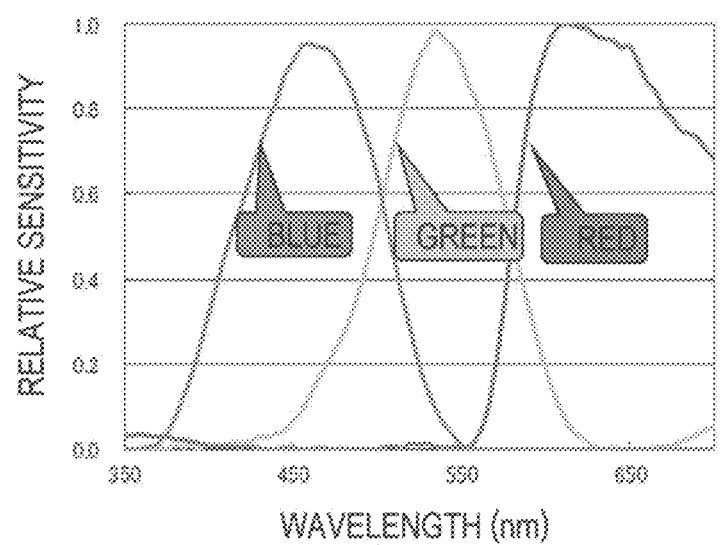
FIG. 46 is a diagram illustrating wavelength characteristics of the color filters.

FIG. 46 is a diagram illustrating wavelength characteristics of the color filters 71 of red (R), green (G), and blue (B). The horizontal axis represents wavelength, and the vertical axis represents relative sensitivity. As illustrated in FIG. 46, the red (R), green (G), and blue (B) filters mainly transmit light in the red, green, and blue wavelength bands, respectively.

Figure 47:
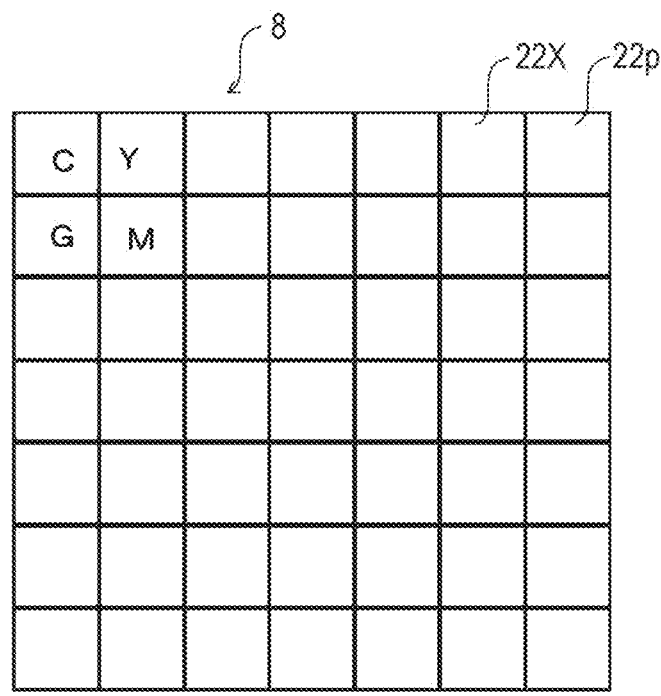
FIG. 47 is a diagram illustrating an arrangement example of complementary color filters.

Next, an arrangement example of the complementary color filters 71 in the pixel array of the imaging unit 8 (FIGS. 1A and 1B) will be described. FIG. 47 is a diagram illustrating an arrangement example of the color filters 71 of cyan (C), magenta (M), yellow (Y), and green (G). As illustrated in FIGS. 44A, 44B, and 44C, color filters 71 of cyan (C), magenta (M), yellow (Y), and green (G) are arranged in four adjacent pixels. Although only four pixels are denoted by reference signs in the drawing, color filters 71 of cyan (C), magenta (M), yellow (Y), and green (G) are similarly arranged in other pixels. Note that the arrangement example is not limited thereto. Furthermore, pixels using a plasmon filter may be mixed in the arrangement of the color filters 71 of an (C), magenta (M), yellow (Y), and green (G).

Figure 48:
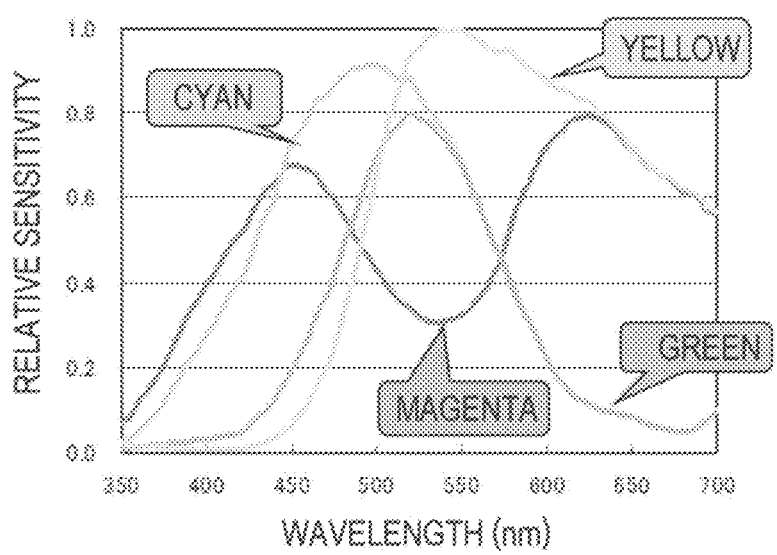
FIG. 48 is a diagram illustrating wavelength characteristics of the complementary color filters.

FIG. 48 is a diagram illustrating wavelength characteristics of the color filters 71 of cyan (C), magenta (M), yellow (Y), and green (G). The horizontal axis represents wavelength, and the vertical axis represents relative sensitivity. As illustrated in FIG. 45, the cyan (C), magenta (M), yellow (Y), and green (G) filters mainly transmit light in wavelength bands of complementary colors of red, green, and blue, respectively.

As described above, according to the present embodiment, pupil correction is enabled by shifting the center position of the on-chip lens 72 and the position of the pinhole 50*a*. Furthermore, due to the configuration in which at least one of the second light shielding film portion 52 or the third light shielding film portion 54 is provided, stray light can be shielded by the multi-stage diaphragm, and the resolution of the pixel can be further improved.

Seventh Embodiment

An electronic device 1 according to the seventh embodiment is different from the electronic device according to the sixth embodiment in that an antireflection portion (moth-eye) 63 and a reflection film 65 are provided in the pixel 22 of the imaging unit 8 (FIGS. 1A and 1B). The differences from the electronic device 1 according to the sixth embodiment will be described below.

Figure 49:
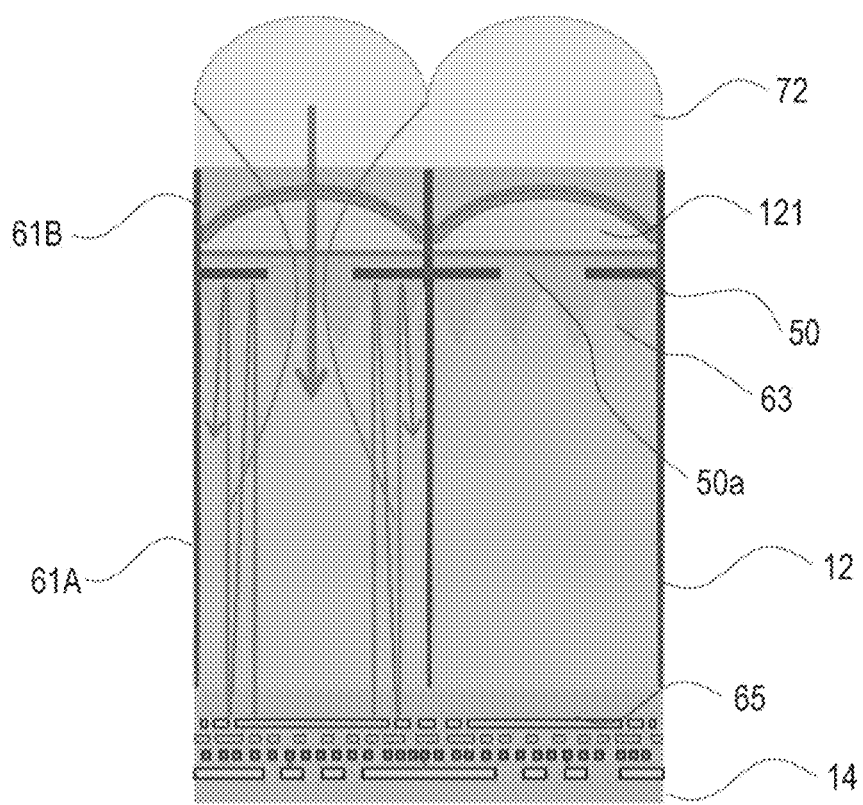
FIG. 49 is a cross-sectional view of a pixel provided with an antireflection portion and a reflection film.

FIG. 49 is a schematic diagram illustrating a cross section of a pixel provided with the antireflection portion (moth-eye) 63 and the reflection film 65. As illustrated in FIG. 49, a surface (plate surface) of the semiconductor substrate 12 on the light entrance side has an antireflection structure including fine protrusions, a so-called moth-eye structure. At the interface of the semiconductor substrate 12, the refractive index difference is relatively larger than that at the interface of another layered structure, and a loss of light generated by reflection of light is great. In view of this, the pixel according to the present embodiment has an antireflection structure including a group of fine protrusions on the surface of the semiconductor substrate 12 on the light entrance side. The antireflection portion 63 has not only an effect of preventing reflection but also an effect of increasing the effective optical path length by diffraction. As described above, the antireflection portion (moth-eye) 63 is formed which is a structure including protrusions and recesses arranged at a predetermined pitch on the surface on the photoelectric conversion element side.

Furthermore, the reflection film 65 may be formed in the interlayer insulating film 14 on the surface of the semiconductor substrate 12 opposite to the light entrance side. The reflection film 65 is, for example, a metal film, a multilayer film including a high refractive index layer and a low refractive index layer, or the like. The reflection film 65 reflects light that has passed through the semiconductor substrate 12.

The first light shielding wall 61A suppresses crosstalk, which is increased in an oblique direction due to diffraction by the moth-eye structure, between pixels in the substrate. The second light shielding wall 61B suppresses crosstalk between pixels generated above the pinhole, and also suppresses flare.

As described above, according to the present embodiment, light entering the pinhole 50a is reciprocated in the photoelectric conversion element PD by the antireflection portion (moth-eye) 63 and the reflection film 65, whereby the sensitivity of the pixel can be improved.

Eighth Embodiment

An electronic device 1 according to the present embodiment is different from the electronic device according to the seventh embodiment in that a phase detection pixel is included in the pixels of the imaging unit 8 (FIGS. 1A and 1B). The differences from the electronic device 1 according to the seventh embodiment will be described below.

An example in which the phase detection pixel is included in the pixels of the imaging unit 8 (FIGS. 1A and 1B) will be described. The fingerprint is imaged in a contact manner in which the finger is placed on the cover glass 7 (FIGS. 1A and 1B), and thus, the focal length can be kept constant. Therefore, focusing is achieved without using the phase detection pixel. The present embodiment describes a case where a pixel having the pinhole 50 is used for closeup imaging in a non-contact manner or a case where an optical lens is provided will be described. For example, a case where the pixel is used for macrophotography (image capture of insects), iris identification, reading of micro barcode, or the like will be described.

Figure 50:
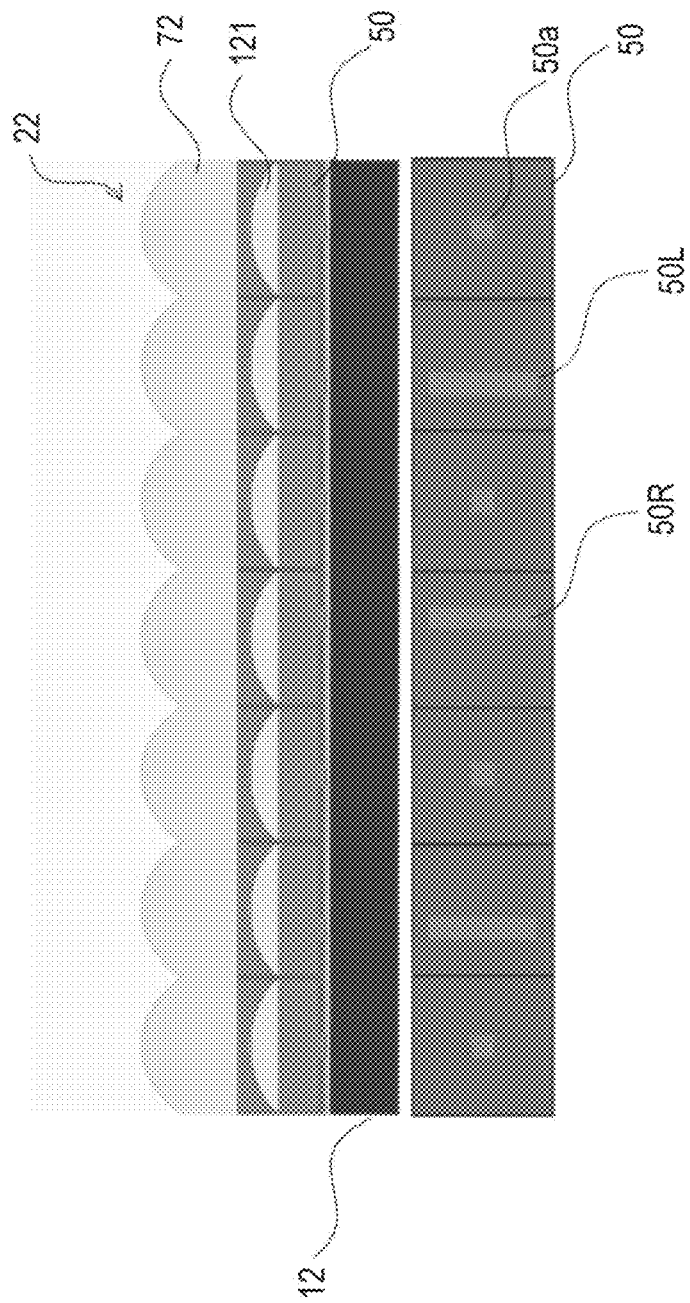
FIG. 50 is a cross-sectional view obtained by cutting out a part of the pixel array.

FIG. 50 is a schematic cross-sectional view obtained by cutting out a part of the pixel array in the imaging unit 8. The upper diagram illustrates a cross section of the pixel, and the lower diagram is a plan view of the first light shielding film portion 50. As illustrated in FIG. 50, each pixel is provided with a pinhole 50a, a right opening 50R, or a left opening 50L. In a case where the vertical edge of the subject is captured, the sensitivity of the phase detection pixel can be improved by forming a vertically long slit opening, and resolution can be improved by forming a laterally long and thin slit opening.

As illustrated in FIG. 50, there are two types which are a left opening 50L formed by opening the left side with respect to the light receiving surface of the photoelectric conversion element PD (FIGS. 4A, 4B, and 4C) and a right opening 50R formed by opening the right side, and these two types are paired and arranged at a predetermined position of the pixel array. An image shift occurs between a pixel signal from the left opening 50L and a pixel signal from the right opening 50R due to a difference in the formation position of the openings. A phase shift amount can be calculated from the shift of the image to calculate a defocus amount.

Figure 51:
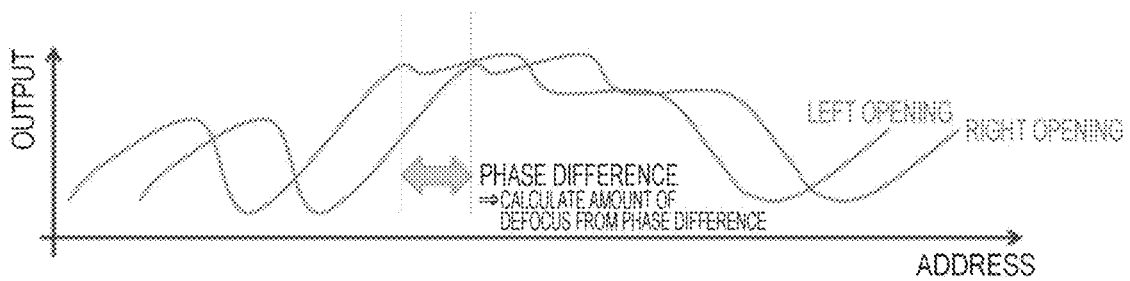
FIG. 51 is a diagram illustrating outputs of pixels having right openings and outputs of pixels having left openings.

FIG. 51 is a diagram illustrating outputs of pixels having the right openings 50R and outputs of pixels having the left openings 50L for one column of the imaging unit 8. The vertical axis represents an output, and the horizontal axis represents the position (address) of the pixel. As illustrated in FIG. 51, an image shift occurs between pixel signals from the left openings 50L and pixel signals from the right openings 50R due to a difference in the formation position of the openings. A phase shift amount can be calculated from the shift of the image to calculate a defocus amount.

As described above, in the electronic device 1 according to the present embodiment, the phase detection pixel is included in the pixels of the imaging unit 8 (FIGS. 1A and 1B). Thus, in a case where an optical lens is combined, the focus adjustment can be performed using information regarding the phase difference, and in a case where an optical lens is not used, the resolution can be recovered by signal processing correction described later.

Ninth Embodiment

An electronic device 1 according to the ninth embodiment is different from the electronic device 1 according to the eighth embodiment in further including a process of restoring the resolution of an image by image processing using a point spread function corresponding to the pinhole 50a. The differences from the electronic device 1 according to the eighth embodiment will be described below.

Figure 52:
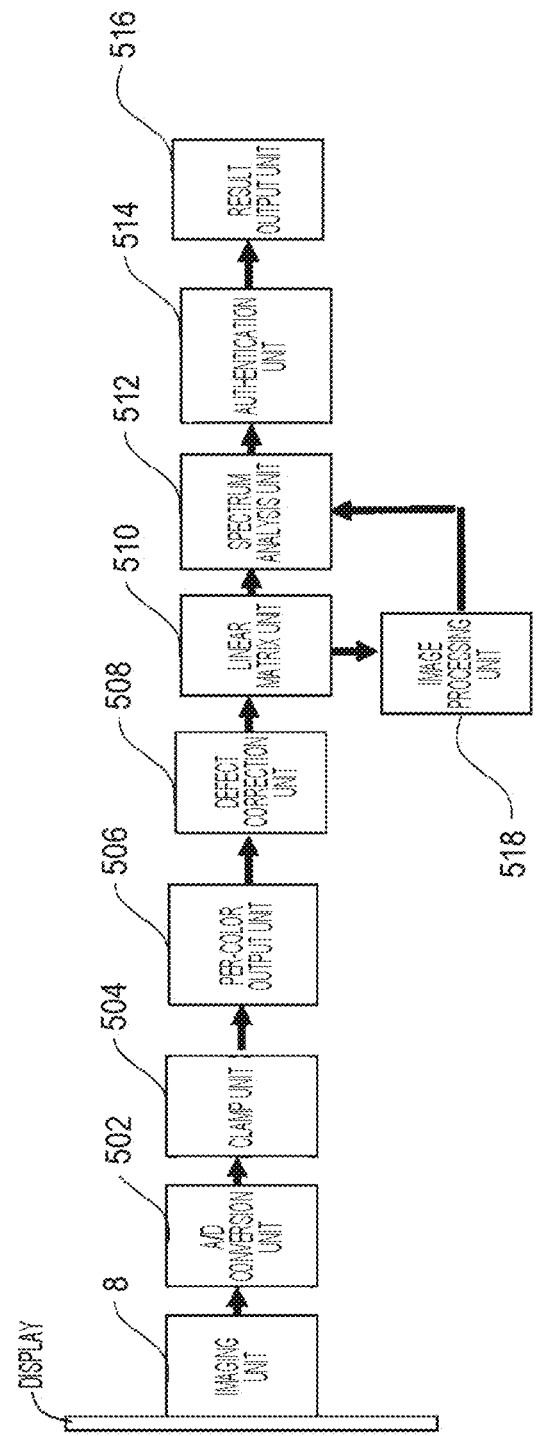
FIG. 52 is a block diagram schematically illustrating a part of the electronic device 1 according to a ninth embodiment.

FIG. 52 is a block diagram schematically illustrating a part of the electronic device 1 according to the present embodiment. The electronic device 1 further includes an image processing unit 518.

Figure 53:
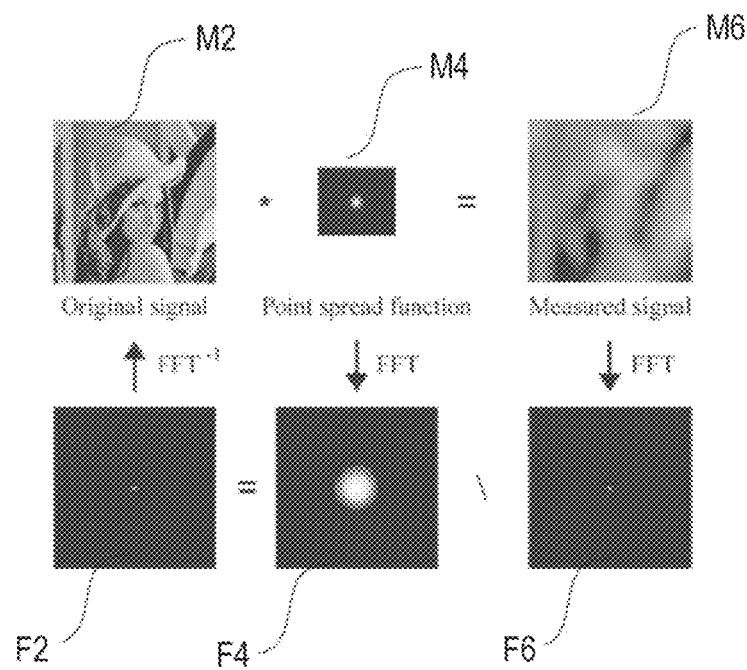
FIG. 53 is a diagram for describing an example of processing performed by an image processing unit.

FIG. 53 is a diagram for describing an example of processing performed by the image processing unit 518. M2 is an original image, M4 is a point spread function corresponding to, for example, the pinhole 50a in FIG. 50, and M6 is a captured image captured by the imaging 8 via the pinhole 50a. M2 is an original image, M4 is a point spread function corresponding to the pinhole 50a, and M4 is a captured image captured by the imaging 8 via the pinhole 50a. The point spread function corresponding to the pinhole 50a can be calculated by calculating a light receiving angle distribution of the sensor or by simulation, and converting the calculated result into a beam blur in consideration of the distance to the subject.

F4 is a Fourier transformed image of the point spread function M4, and F6 is a Fourier transformed image of the captured image M6.

The image processing unit 518 performs, for example, recalculation using the Fourier transformed image F6 and the Fourier transformed image F4 to generate a Fourier transformed image F2. Then, the image processing unit 518 inversely transforms the Fourier transformed image F2 to generate an original image.

As described above, in the electronic device 1 according to the present embodiment, the image processing unit 518 generates the Fourier transformed image F2 of the original image M2 using the Fourier transformed image F4 of the point spread funk of the pinhole 50a and the Fourier transformed image F6 of the captured image M2. Then, the original image is generated by inversely transforming the Fourier transformed image F2. The original image M2 having higher resolution can be generated from the captured image M6 using the point spread function corresponding to the pinhole 50a.

Tenth Embodiment

An electronic device 1 according to the tenth embodiment is different from the electronic device 1 according to the ninth embodiment in that the imaging unit 8 further has a function of driving a global shutter. The differences from the electronic device 1 according to the ninth embodiment will be described below.

Figure 54:
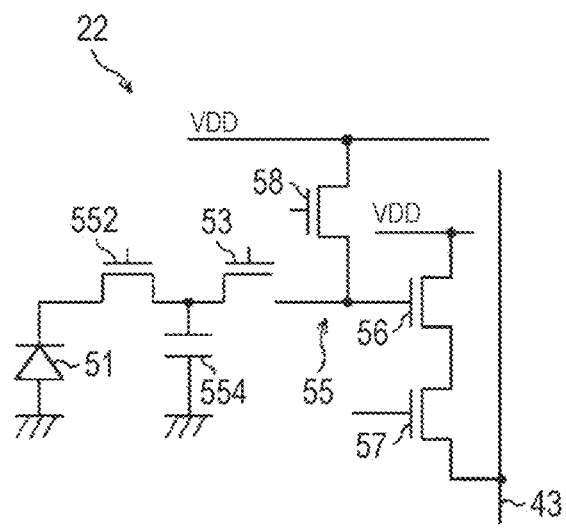
FIG. 54 is a circuit diagram illustrating a configuration example of a pixel.

FIG. 54 is a circuit diagram illustrating a configuration example of the pixel 22. As illustrated in FIG. 54, the pixel 22 includes a photoelectric conversion unit 51, a first transfer transistor 552, a second transfer transistor 53, a charge holding unit 554, an FD 55, an amplification transistor 56, a selection transistor 57, and a reset transistor 58. The photoelectric conversion unit 51 receives light that is emitted to the pixel 22, and generates and accumulates charges corresponding to an amount of the light. The first transfer transistor 552 is driven in accordance with a transfer signal supplied from a vertical drive unit (not illustrated), and when the first transfer transistor 552 is turned on, the charge accumulated in the photoelectric conversion unit 51 is transferred to the charge holding unit 554.

The second transfer transistor 53 is driven in accordance with the transfer signal, and when the second transfer transistor 53 is turned on, the charge accumulated in the charge holding unit 554 is transferred to the FD 55. The charge holding unit 554 accumulates the charge transferred from the photoelectric conversion unit 51 via the first transfer transistor 552. The FD 55 is a floating diffusion region having a predetermined capacitance formed at a connection point between the second transfer transistor 53 and a gate electrode of the amplification transistor 56, and accumulates the charge transferred from the charge holding unit 554 via the second transfer transistor 53.

The amplification transistor 56 is connected to a power supply VDD (not illustrated), and outputs a pixel signal at a level corresponding to the charge accumulated in the FD 55. The selection transistor 57 is driven in accordance with a selection signal supplied from the vertical drive unit 33, and when the selection transistor 57 is turned on, the pixel signal output from the amplification transistor 56 can be read to a vertical signal line 43 via the selection transistor 57.

The reset transistor 58 is driven in accordance with a reset signal supplied from the vertical drive unit 33, and when the reset transistor 58 is turned on, the charge accumulated in the FD 55 is discharged to the power supply VDD via the reset transistor 58, and the FD 55 is reset.

The imaging unit 8 including the pixel 22 configured as described above employs a global shutter system, whereby the charges can be simultaneously transferred from the photoelectric conversion unit 51 to the charge holding unit 554 for all the pixels 22, and the exposure timings of all the pixels 22 can be set to be the same. As a result, it is possible to avoid occurrence of distortion and blurring in the image. By suppressing distortion and blurring, the accuracy of authentication of fingerprints can be enhanced.

Figure 55:
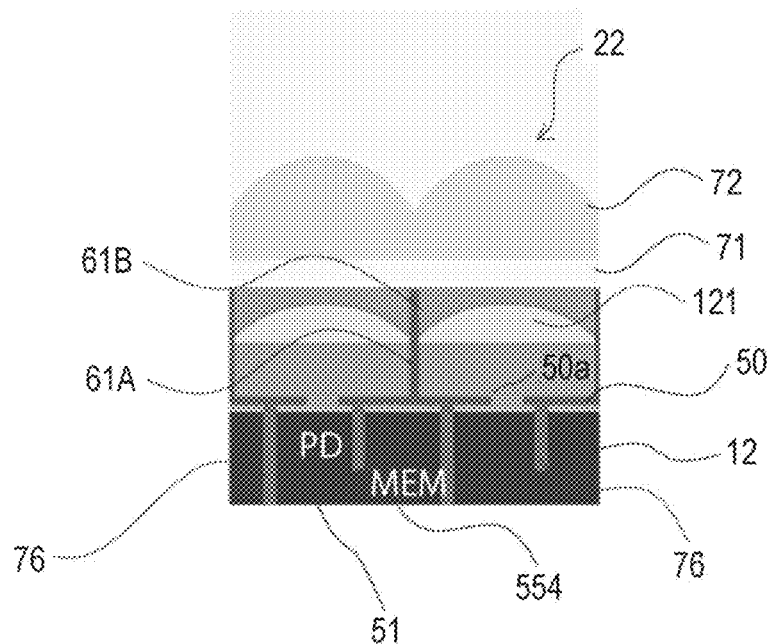
FIG. 55 is a schematic cross-sectional view of a pixel that can be driven by a global shutter system.

FIG. 55 is a schematic cross-sectional view of the pixel 22 that can be driven by the global shutter system.

As illustrated in FIG. 55, an embedded portion 76 is formed in the pixel 22. The light shielding portion (embedded portion) 76 is formed to a predetermined depth so as to extend in a direction substantially orthogonal to the first shielding film 50. The embedded portion 76 includes a material such as tungsten (W), aluminum (Al), or copper (Cu). As described above, the region where the charge holding unit (MEM) 54, the FD 55, and the like are formed is surrounded by the first shielding film 50 and the embedded portion 76 and is shielded from light.

As described above, according to the present embodiment, the pixel 22 includes the photoelectric conversion unit 51 that receives incident light through the pinhole 50a and the charge holding unit 554 that is surrounded by the first shielding film 50 and the embedded portion 76 and that is shielded from light. With this configuration, charges can be transferred from the photoelectric conversion unit 51 that receives incident light via the pinhole 50a to the charge holding unit 554, and the exposure timings of all the pixels 22 that perform imaging via the pinholes 50a can be set to be the same.

Eleventh Embodiment

An electronic device 1 according to the eleventh embodiment is different from the electronic device 1 according to the tenth embodiment in that a polarizing element is included in the pixels constituting the imaging unit 8.

FIG. 56A illustrates a state in which the fingerprint is brought into contact with the cover glass of the display surface. An air layer is formed in the recessed portion of the fingerprint, and total reflection is likely to occur due to a difference in refractive index between the cover glass and the fingerprint. Thus, a contrast corresponding to the unevenness of the fingerprint is formed. In the specular reflection, polarized light in which an electric field vector vibrates in a direction perpendicular to the incident surface is likely to be specifically reflected.

On the other hand, as illustrated in FIG. 56B, we have succeeded in developing a solid-state imaging element equipped with a wire grid type polarizer. The transmission axis of the polarized light can be controlled by changing the orientation of the wire grid, and a diffusion component and a specular reflection component can be separated and analyzed by sampling several different polarization orientations and performing trigonometric function fitting.

In the present embodiment, assuming that light emitted by an OLED is totally reflected, uniform pupil correction is applied to all the pixels so as to detect a specific angle. Ideally, the specific angle is desirably around 57 degrees that is the Brewster's angle. However, since a total reflection mode occurs in the light collecting structure and the light collecting efficiency is deteriorated, the specific angle may be 30 degrees or more at which the difference between the S polarization and the P polarization starts to occur. Here, uniform pupil correction is applied for the sake of simplicity, but pupil correction according to the image height may be added in a direction toward the peripheral part of the chip in order to simultaneously achieve the shrink in chip size described above.

Figure 57A:
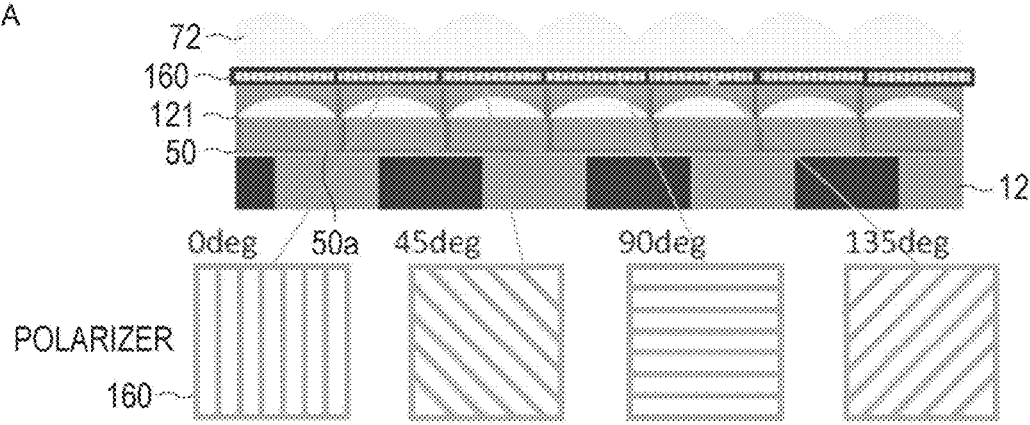
FIGS. 57A and 57B are cross-sectional views of the polarization pixel.
Figure 57B:
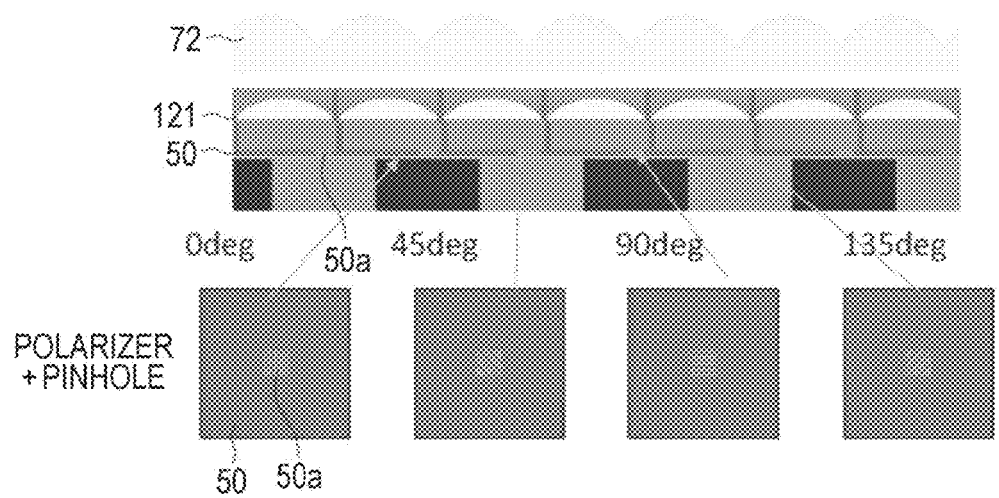

FIGS. 57A and 57B are cross-sectional views of a pixel 22 including a polarizer 160 provided in the pixel constituting the imaging unit 8. As illustrated in FIGS. 57A and 57B, the polarizer can be formed independently of the pinhole, but can be integrated by forming a wire grid type polarizer in the pinhole opening.

The polarizer 160 can improve the contrast by arranging a plurality of different polarization orientations for the specular reflection generated at the valley and the diffused light generated at the ridge and performing component separation by the above-described trigonometric fitting. In addition, all the transmission axes of the polarizers 160 can be aligned with S-polarized light to allow the specular reflection component to be easily detected.

Figure 58:
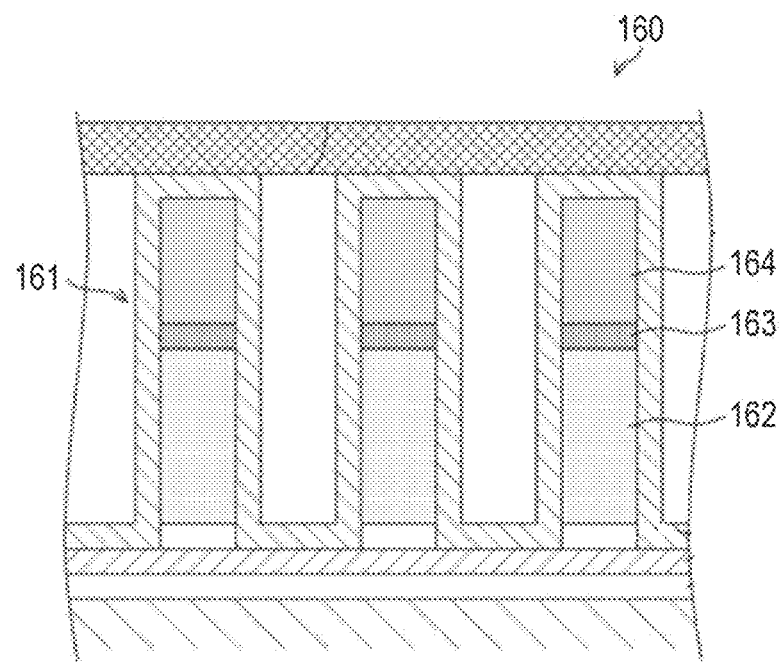
FIG. 58 is a diagram illustrating a configuration example of a polarizing unit.

FIG. 58 is a diagram illustrating a configuration example of the polarizing unit 160. As illustrated in FIG. 58, in the polarizing unit 160, a plurality of strip-shaped conductors 161 is arranged at an equal pitch. The strip-shaped conductor 161 includes a plurality of layers. More specifically, the strip-shaped conductor 161 includes a light reflecting layer 162, an insulating layer 163, and a light absorbing layer 164.

The light reflecting layer 162 reflects incident light. The strip-shaped conductor 161 is configured using the light reflecting layer 162. As a result, light in a direction perpendicular to the arrangement direction of the strip-shaped conductors 161, that is, in a vibration direction parallel to the longitudinal direction of the strip-shaped conductors 161 can be reflected. The light reflecting layer 162 includes, for example, Al. The light absorbing layer 164 absorbs light. That is, the light absorbing layer 164 absorbs the light reflected by the light reflecting layer 162. Providing the light absorbing layer 164 can decrease reflected light from the polarizing unit 160. As a result, noise such as flare caused by reflected light can be reduced. The light absorbing layer 164 includes a material having an extinction coefficient of not 0, that is, metal or a semiconductor having an absorption function. The light absorbing layer 164 includes, for example, a metal material such as Ag, Au, Cu, Mo, Cr, Ti, Ni, W, Fe, Si, Ge, Te, and Sn, or an alloy containing these metal materials.

The light absorbing layer 164 is formed as a relatively thin film of, for example, 50 nanometers. This suppresses a reduction in transmittance when incident light is transmitted through the polarizing unit 160. The insulating layer 163 is disposed between the light reflecting layer 162 and the light absorbing layer 164, and protects the previously formed light reflecting layer 162. More specifically, the insulating layer 163 is formed to have a film pressure at which the phase of light transmitted through the light absorbing layer 164 and reflected by the light reflecting layer 162 and the phase of light reflected by the light absorbing layer 164 are different from each other by 180 degrees. As a result, the light reflected by the light absorbing layer 164 and the light reflecting layer 162 cancel each other out, so that the reflection of the incident light from the polarizing unit 160 is reduced. The insulating layer 163 includes, for example, $SiO_2$ formed by ALD.

Next, a processing example using the output of a polarization pixel 100 will be described. In this example, the polarizer and the pinhole do not necessarily need to be combined in the same pixel, and processing can be performed by a pixel including only the polarizer. The A/D conversion unit 502 illustrated in FIG. 52 outputs polarization information data obtained by digitizing the output values of a plurality of polarization pixels 100 and digital pixel data obtained by digitizing the output values of a plurality of pixels 22 which are non-polarization pixels.

Next, the image processing unit 518 determines whether or not flare or diffraction has occurred on the basis of the polarization information data. When, for example, the polarization information data exceeds a predetermined threshold value, the image processing unit 518 determines that flare or diffraction has occurred. When determining that flare or diffraction has occurred, the image processing unit 518 extracts a correction amount of the flare component or the diffracted light component on the basis of the polarization information data. Then, the image processing unit 518 subtracts the correction amount from the digital pixel data to generate digital pixel data from which the flare component and the diffracted light component have been removed.

As described above, the present embodiment has described the electronic device that improves contrast by mounting the polarizer 180 on the normal pixel 22 constituting the imaging unit 8. Furthermore, the flare component and the diffraction component can be removed by adding a pixel having a pinhole that is mounted with a polarizer or a pixel having only a polarizer.

Twelfth Embodiment

An electronic device 1 according to the twelfth embodiment is different from the electronic devices 1 according to the first to eleventh embodiments in having a function of changing a region of a display unit 4 that emits light according to the position of a finger placed on the cover glass 7 (FIGS. 1A and 1B). The differences from the electronic devices 1 according to the first to eleventh embodiments will be described below.

Figure 59:
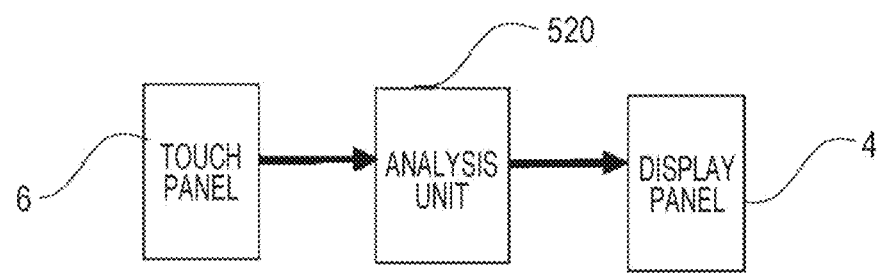
FIG. 59 is a block diagram schematically illustrating a part of an electronic device according to a twelfth embodiment.

FIG. 59 is a block diagram schematically illustrating a part of the electronic device 1 according to the twelfth embodiment. The electronic device 1 further includes an analysis unit 520.

FIGS. 60A, 60B, and 60C are diagrams illustrating an example of processing performed by the analysis unit 520. The electronic device 1 illustrated in FIGS. 60A, 60B, and 60C emit light from a display panel 4 of a display unit 2 provided inside the electronic device to a reading surface, and receives returned light by an imaging element 8. A region 590 in (a) of FIG. 60A is an example of a fingerprint reading region.

The analysis unit 520 analyzes the region where the finger is placed on the basis of a signal including position information output from a touch panel 5. Then, the analysis unit 520 controls the display panel 4 so as to narrow a light emission area only to a region around the region where the finger is placed, for example. A region 590a in FIG. 60B indicates a light emitting region 590a with a reduced light emission area. As illustrated in FIG. 60C, the recognition rate during the measurement of the shape of a fingerprint is improved by receiving a total reflection component due to a difference in refractive index between the cover glass 7 and the air layer.

Therefore, the analysis unit 520 controls the light emission area of the display panel 4 so as to receive the total reflection component from the finger. In addition, when, for example, failing in the first authentication, the analysis unit 520 may correct the light emission area on the basis of information regarding the contour of the finger in the first authentication.

In addition, the analysis unit 520 may guide and display the contact region of the finger on the reading surface on the display panel 4 so as to satisfy, for example, the condition that the light obtained by totally reflecting light from the light source by the reading surface can be received by the imaging element. Furthermore, the analysis unit 520 may acquire information regarding the spectrum unique to human skin by decomposing, by the imaging element, the wavelength of light that is diffused and propagated into the finger from, for example, a region where the ridge of the fingerprint and the reading surface 12 are in contact with each other and that is returned to the electronic device side again. Alternatively, the analysis unit 520 may use the fact that light in the red region to the near-infrared region is more likely to be absorbed in a region in which a vein or an artery exists than in a region in which no blood exists to thereby acquire spectral information regarding the vein or the artery (and shape).

As described above, in the electronic device 1 according to the present embodiment, the analysis unit 520 analyzes the position of the finger to change the light emitting region 590a of the display panel 4. As a result, the total reflection component from the fingerprint region can be received more, and the fingerprint recognition rate is further improved.

Thirteenth Embodiment

An electronic device 1 according to the thirteenth embodiment is different from the electronic devices 1 according to the first to twelfth embodiments in further having a light source 600 different from the display unit 2. The differences from the electronic devices 1 according to the first to twelfth embodiments will be described below.

FIGS. 61A, 61B, 61C, and 61D are diagrams illustrating an arrangement example of the light source 600. The electronic device 1 illustrated in FIG. 61A includes the light source 600 different from the display unit 2 in a housing of the electronic device. Light is emitted from the light source 600 toward the reading surface 590, and the returned light is received by the imaging element 8. The imaging element 8 may be disposed under a display (not illustrated) of a smartphone, or the like, or may be arranged in a region not under the display, for example, a region of a lens portion of a front camera or a speaker portion. Alternatively, the electronic device 1 may include the light source 600 and the imaging element 8 without having a display.

The electronic device 1 according to the present embodiment may acquire information regarding fingerprints, or may acquire information regarding the spectrum unique to human skin by decomposing, by the imaging element, the wavelength of light that is diffused and propagated into the finger and that is returned to the electronic device side again. Alternatively, information regarding the vein may be acquired by light in a near-infrared region. Light emission is enabled according to the wavelength specification of the light source 600 specialized for authentication.

In the electronic device 1 illustrated in FIG. 61B, the light source 600 is disposed such that light is incident in parallel with the cover glass 7. Then, the imaging element 8 receives light reflected or scattered around the reading surface. With this configuration, the fingerprint can be read by the light transmitted through the finger.

In the electronic device 1 illustrated in FIG. 61C, the light source 600 is disposed so as to generally totally reflect light with the cover glass 7 as a light guide plate. A part of the light from the light source 600 enters the subject and diffuses, and the light emitted from the reading surface is received by the imaging element 600. These embodiments use scattered light in the finger, and thus, are resistant to sweat and drying. Therefore, the fingerprint recognition rate is improved even in an environment where sweat and drying occur.

In the electronic device 1 illustrated in FIG. 61D, the light source 600 is disposed to face the reading surface across a subject such as a finger, and the imaging element 8 receives light that has passed through or scattered from the subject and passed through the reading surface. The light source 600 may be provided so as to be detachable from the electronic device 1, for example. Alternatively, a system may be used in which a mobile terminal such as a smartphone provided with the imaging element 8 according to the present embodiment is brought close to the fixed light source 600 and then light is emitted. The operation commands between the light source 600 and the mobile terminal may be synchronized by wireless communication such as infrared rays. The light source 600 may include a mold processed into a shape in which a subject such as a finger is easily fixed, and may further include a jig capable of fixing the mobile terminal at a predetermined position. Alternatively, a subject such as a finger may be brought close to the light source 600 while being in direct contact with the mobile terminal, and when it is detected that, for example, the subject approaches a predetermined position, the light source 600 may emit light, and the imaging element may synchronously receive light by wireless communication. The detecting means may be a physical contact button, a detection sensor for a mobile terminal or a subject, or a signal from a mobile terminal.

As described above, in the electronic device 1 according to the present embodiment, the light source 600 different from the display unit 2 is disposed. As a result, it is possible to perform image capture at a position and a wavelength according to an imaging environment of a subject such as a finger, and the fingerprint recognition rate is further improved.

It is to be noted that the present technology may also have the following configurations.

(1) An electronic device including a plurality of pixels, in which each of at least two pixels of the plurality of pixels includes:
a first lens that collects incident light;
a first light shielding film portion having a first hole through which a part of the incident light that has been collected passes; and
a photoelectric conversion unit configured to photoelectrically convert the incident light having passed through the first hole, and
a shape of the first hole with respect to the first light shielding film portion is different between a first pixel among the at least two pixels and a second pixel different from the first pixel among the at least two pixels.

(2) The electronic device according to (1), in which the first pixel further includes a second lens that collects the incident light having been collected by the first lens into the first hole.

(3) The electronic device according to (1) or (2), in which the first lens is a reflow lens.

(4) The electronic device according to (3), in which a reflow stopper is provided at a boundary between the two first lenses corresponding to two adjacent pixels.

(5) The electronic device according to (4), in which the reflow stopper contains a light shielding material.

(6) The electronic device according to any one of (1) to (5), further including a first optical system that collects incident light on the plurality of pixels, in which the first lens collects the incident light having been collected through the first optical system, and the first lens is disposed at a position corresponding to a direction of the incident light incident from a predetermined position through the first optical system.

(7) The electronic device according to any one of (1) to (6), in which at least one element in a second optical system including the first lens that collects the incident light into the first hole is a diffraction lens.

(8) The electronic device according to any one of (1) to (7), in which shapes of the first holes included in the first pixel and the second pixel are different corresponding to a shape of a light distribution of a second optical system including the first lens that collects the incident light into the first hole from a predetermined position.

(9) The electronic device according to any one of (1) to (8), in which the first pixel and the second pixel are different from each other in a position of the first hole with respect to the first light shielding film portion.

(10) The electronic device according to any one of (1) to (9), in which the first pixel and the second pixel are different from each other in an opening area of the first hole.

(11) The electronic device according to any one of (1) to (10), in which the first hole includes a plasmon filter that has a plurality of holes smaller than the opening.

(12) The electronic device according to any one of (1) to (11), further including a light shielding wall in a plurality of stages arranged between two adjacent pixels among the plurality of pixels.

(13) The electronic device according to (3) or (12), in which an uppermost portion of the light shielding wall is provided as the reflow stopper.

(14) The electronic device according to (12), in which the light shielding wall in a plurality of stages is arranged according to a direction of the incident light collected from a predetermined position through a second optical system including the first lens.

(15) The electronic device according to any one of (1) to (14), in which the first pixel further includes a second light shielding film portion including, on a light entrance side with respect to the first light shielding film portion, a second hole through which a part of the incident light having been collected passes, the second hole being larger than the first hole.

(16) The electronic device according to (11) and (15), in which, in the first pixel, the second light shielding portion and a metal film of the light shielding wall include a same material and are continuously provided.

(17) The electronic device according to any one of (1) to (16), in which the first pixel further includes an antireflection portion having an uneven structure on a surface of the first light shielding film portion on a side of the photoelectric conversion element.

(18) The electronic device according to any one of (1) to (17), in which the first pixel further includes a photoelectric conversion element separation portion that does not propagate information regarding an intensity of acquired light to the photoelectric conversion unit adjacent to the first pixel.

(19) The electronic device according to any one of (1) to (18), in which, in the pixels, the first pixel further includes a reflection film portion on a bottom part on a side opposite to a light entrance side of the photoelectric conversion element unit.

(20) The electronic device according to any one of (1) to (19), in which at least two of the plurality of pixels are phase detection pixels which are paired.

(21) The electronic device according to any one of (1) to (20), further including an image processing unit that performs processing for restoring resolution of an image by image processing using a point spread function corresponding to the first hole.

(22) The electronic device according to any one of (1) to (21), in which at least one of the plurality of pixels is a polarization pixel having a polarizing element, and the electronic device corrects an image signal photoelectrically converted by at least one of the plurality of pixels on the basis of polarization information obtained by polarization by a plurality of the polarizing elements and photoelectric conversion by the photoelectric conversion unit.

(23) The electronic device according to any one of (1) to (22), in which each of the plurality of pixels further includes a charge holding unit that is shielded from light, and the electronic device enables transfer of a charge from the photoelectric conversion element to the charge holding unit, and sets exposure timings of the plurality of pixels to be the same.

(24) The electronic device according to any one of (1) to (23), in which at least two pixels of the plurality of pixels output image signals on the basis of incident light incident via optical members having wavelengths with different transmission characteristics, and the electronic device further includes an authentication unit determining that an object to be imaged is an artificial object in a case where there is no peak around 760 nanometers on the basis of the image signals output from the at least three pixels.

(25) The electronic device according to any one of (1) to (24), in which at least two pixels of the plurality of pixels output image signals on the basis of incident light incident via optical members having wavelengths with different transmission characteristics, and the electronic device determines that an object to be imaged is an artificial object in a case where there is no rise in a wavelength region from 500 to 600 nanometers on the basis of the image signals output from the at least three pixels.

(26) The electronic device according to any one of (1) to (21), in which at least two pixels of the plurality of pixels output image signals on the basis of incident light incident via optical members having wavelengths with different transmission characteristics, and the electronic device calculates an absorption coefficient spectrum of oxygenated hemoglobin and an absorption coefficient spectrum of reduced hemoglobin on the basis of the image signals output from the at least two pixels, and determines that an object to be imaged is an artificial object in a case where a ratio of a difference value between the absorption coefficient spectrum of the oxygenated hemoglobin and the absorption coefficient spectrum of the reduced hemoglobin at predetermined two wavelengths is outside a predetermined range.

(27) The electronic device according to any one of (1) to (26), in which the first pixel and the second pixel are different from each other in a size of the first hole with respect to the first light shielding film portion, and a region of the photoelectric conversion element of the first pixel or the second pixel having the first hole with a larger size is set to be greater than a region of the photoelectric conversion element of the first pixel or the second pixel having the first hole with a smaller size.

(28) The electronic device according to any one of (1) to (27), in which outputs of the plurality of pixels are addable, and the first hole corresponding to a pixel on a peripheral part of a region where the plurality of pixels is arrayed is smaller in size than the first hole corresponding to a pixel at a central part of the region.

(29) The electronic device according to any one of (1) to (29), further including a display unit, in which the incident light is incident on the photoelectric conversion unit via the display unit.

The modes of the present disclosure are not limited to the above-described individual embodiments, and include various modifications that could be conceived of by those skilled in the art. In addition, the effects of the present disclosure are not limited to the effects described above. That is, various additions, modifications, and partial deletions are possible without departing from the conceptual idea and spirit of the present disclosure derived from the matters defined in the claims and equivalents thereof.

REFERENCE SIGNS LIST

1 Electronic device
1a Display screen
2 Display unit
4 Display panel
5 Touch panel
6 Circularly polarizing plate
7 Cover glass
8 Imaging unit
8a Photoelectric conversion unit
9 Optical system
12 Semiconductor substrate
13 Interlayer insulating film
14 Flattened layer
15 Light shielding layer
16 Base insulating layer
17 Insulating layer
22 Pixel
22x Pixel
22p Pixel
50a to k Pinhole
50 First light shielding film portion
51 Photoelectric conversion unit
52 Second light shielding film portion
52A Second light shielding film portion
54 Third light shielding film portion
61 Light shielding wall
61A First light shielding wall
61B Second light shielding wall
61C Third light shielding wall
63 Antireflection portion (moth-eye)
72 On-chip lens
100 Polarization pixel
102 Charge holding unit
121 Inner lens
301 Phase pixel
302 Phase pixel
514 Authentication unit
518 Image processing unit
552 Transfer transistor
554 Charge holding unit
D2 to D8 Diffraction lens
PD, PD1, PD2 Photoelectric conversion unit

The invention claimed is:

1. An electronic device, comprising:
a plurality of pixels, wherein
each pixel of the plurality of pixels includes:
a first optical system that includes:
a lens configured to collect incident light; and
a diffraction lens configured to collect the incident light collected by the lens;
a first light shielding film portion having a first hole through which a part of the incident light collected by the diffraction lens passes; and
a photoelectric conversion element configured to photoelectrically convert the incident light passed through the first hole, and
a shape of the first hole in the first light shielding film portion of a first pixel of the plurality of pixels is different from a shape of the first hole in the first light shielding film portion of a second pixel of the plurality of pixels.

2. The electronic device according to claim 1, wherein the lens is a reflow lens.

3. The electronic device according to claim 2, further comprising a reflow stopper at a boundary between the lens of the first pixel and the lens of the second pixel.

4. The electronic device according to claim 3, wherein the reflow stopper includes a light shielding material.

5. The electronic device according to claim 1, further comprising a second optical system configured to collect the incident light on the plurality of pixels, wherein
the lens is further configured to collect the incident light collected the second optical system, and
the lens is at a position corresponding to a direction of the incident light incident from a specific position through the second optical system.

6. The electronic device according to claim 1, wherein the shape of the first hole in the first pixel and the shape of the first hole in the second pixel correspond to a shape of a light distribution of the first optical system.

7. The electronic device according to claim 1, wherein a position of the first hole with respect to the first light shielding film portion in the first pixel is different from a position of the first hole with respect to the first light shielding film portion in the second pixel.

8. The electronic device according to claim 1, wherein an opening area of the first hole in the first pixel is different from an opening area of the first hole in the second pixel.

9. The electronic device according to claim 1, wherein the first hole includes a plasmon filter that has a plurality of holes.

10. The electronic device according to claim 1, further comprising a light shielding wall in a plurality of stages, wherein
the light shielding wall is between the first pixel and the second pixel.

11. The electronic device according to claim 10, wherein an uppermost portion of the light shielding wall is a reflow stopper.

12. The electronic device according to claim 11, wherein an arrangement of the light shielding wall in the plurality of stages is based on a direction of the incident light collected from a specific position through the first optical system.

13. The electronic device according to claim 12, wherein
the first pixel further includes a second light shielding film portion,
the second light shielding film portion includes, on a light entrance side of the first light shielding film portion, a second hole through which the part of the incident light collected by the diffraction lens passes, and
the second hole is larger than the first hole.

14. The electronic device according to claim 13, wherein
the light shielding wall includes a metal film,
in the first pixel, the second light shielding film portion and the metal film of the light shielding wall include a same material, and
the second light shielding film portion is continuous with the light shielding wall.

15. The electronic device according to claim 1, wherein
the first pixel further includes an antireflection portion having an uneven structure,
the antireflection portion is on a surface of the first light shielding film portion, and
the antireflection portion is on a side of the photoelectric conversion element.

16. The electronic device according to claim 1, wherein the first pixel further includes a photoelectric conversion element separation portion that does not propagate information regarding an intensity of acquired light to the photoelectric conversion element of the second pixel.

17. The electronic device according to claim 1, wherein
the first pixel further includes a reflection film portion on a bottom part of the first pixel, and
the bottom part of the first pixel is on a side opposite to a light entrance side of the photoelectric conversion element.

18. The electronic device according to claim 1, wherein the first pixel and the second pixel are phase detection pixels.

19. The electronic device according to claim 1, further comprising an image processing unit configured to restore a resolution of an image by image processing,
wherein the image processing is based on a point spread function corresponding to the first hole.

20. The electronic device according to claim 1, wherein
the plurality of pixels includes a plurality of polarization pixels,
the plurality of polarization pixels includes a plurality of polarizing elements configured to output polarization information,
the electronic device further includes an image processing unit configured to correct, based on the polarization information, an image signal photoelectrically converted by at least one pixel of the plurality of pixels, and
the at least one pixel is different from the plurality of polarization pixels.

21. The electronic device according to claim 1, wherein
each pixel of the plurality of pixels further includes a charge holding unit that is shielded from the incident light, and
the electronic device is configured to:
transfer a charge from the photoelectric conversion element to the charge holding unit, and
set exposure timings of the plurality of pixels to be the same.

22. The electronic device according to claim 1, further comprising:
a plurality of optical members having different wavelength transmission characteristics,
wherein at least two pixels of the plurality of pixels are configured to output image signals based on the incident light incident via the plurality of optical members;
an authentication unit configured to determine, based on the output of the image signals, that an object to be imaged is an artificial object in a case where there is no peak around 760 nanometers.

23. The electronic device according to claim 1, further comprising:
a plurality of optical members having different wavelength transmission characteristics,
wherein at least two pixels of the plurality of pixels are configured to output image signals based on the incident light incident via the plurality of optical members; and
an authentication unit configured to determine, based on the output of the image signals, that an object to be imaged is an artificial object in a case where there is no rise in a wavelength region from 500 nanometers to 600 nanometers.

24. The electronic device according to claim 1, further comprising:
a plurality of optical members having different wavelength transmission characteristics, wherein
at least two pixels of the plurality of pixels are configured to output image signals based on the incident light incident via the plurality of optical members;
a spectrum analysis unit configured to calculate, based on the output of the image signals, an absorption coefficient spectrum of oxygenated hemoglobin and an absorption coefficient spectrum of reduced hemoglobin; and
an authentication unit configured to determine that an object to be imaged is an artificial object in a case where a ratio of a difference value between the absorption coefficient spectrum of the oxygenated hemoglobin and the absorption coefficient spectrum of the reduced hemoglobin at two specific wavelengths is outside a specific range.

25. The electronic device according to claim 1, wherein
a size of the first hole in the first pixel is larger than a size of the first hole in the second pixel, and
a region of the photoelectric conversion element of the first pixel is larger than a region of the photoelectric conversion element of the second pixel.

26. The electronic device according to claim 1, wherein
outputs of the plurality of pixels are addable,
the plurality of pixels is in a region of the electronic device,
the first pixel is in a peripheral part of the region,
the second pixel is in a central part of the region, and
a size of the first hole in the first pixel is smaller than a size of the first hole in the second pixel.

27. The electronic device according to claim 1, further comprising a display unit,
wherein the incident light is incident on the photoelectric conversion element via the display unit.

28. An electronic device, comprising:
a plurality of pixels, wherein
each pixel of the plurality of pixels includes:
a lens configured to collect incident light;

a light shielding film portion having a hole through which a part of the incident light collected by the lens passes; and a photoelectric conversion element configured to photoelectrically convert the incident light passed through the hole, a first pixel of the plurality of pixels includes an antireflection portion having an uneven structure, the antireflection portion is on a surface of the light shielding film portion, the antireflection portion is on a side of the photoelectric conversion element, and a shape of the hole in the light shielding film portion of the first pixel is different from a shape of the hole in the light shielding film portion of a second pixel of the plurality of pixels.

* * * * *